US007327072B2

(12) United States Patent
Fujimura et al.

(10) Patent No.: US 7,327,072 B2
(45) Date of Patent: Feb. 5, 2008

(54) ULTRASONIC WAVE OSCILLATOR

(75) Inventors: Takanao Fujimura, Sagamihara (JP); Yukihiko Sawada, Yoshikawa (JP); Akiko Mizunuma, Tokyo (JP); Katsuhiro Wakabayashi, Tokyo (JP); Hideo Adachi, Iruma (JP); Takeharu Nakazato, Tokyo (JP); Sunao Sato, Tokyo (JP)

(73) Assignees: Olympus Corporation (JP); Olympus Medical Systems Corp. (JP)

( * ) Notice: Subject to any disclaimer, the term of this patent is extended or adjusted under 35 U.S.C. 154(b) by 0 days.

(21) Appl. No.: 11/624,907

(22) Filed: Jan. 19, 2007

(65) Prior Publication Data

US 2007/0216257 A1 Sep. 20, 2007

Related U.S. Application Data

(63) Continuation of application No. PCT/JP2005/013417, filed on Jul. 21, 2005.

(30) Foreign Application Priority Data

Jul. 22, 2004 (JP) ............................ 2004-213811
May 18, 2005 (JP) ............................ 2005-146077

(51) Int. Cl.
*H01L 41/08* (2006.01)

(52) U.S. Cl. ...................................... 310/334; 310/335

(58) Field of Classification Search ........ 310/334–336, 310/324, 351–353

See application file for complete search history.

(56) References Cited

U.S. PATENT DOCUMENTS 3,331,970 A * 7/1967 Dundon et al. ............ 310/324
4,415,826 A 11/1983 Kreutzev et al. ........... 310/354
4,424,465 A * 1/1984 Ohigashi et al. ............ 310/335
4,496,871 A * 1/1985 Sumita et al. .............. 310/324
5,945,770 A * 8/1999 Hanafy ....................... 310/322
6,396,199 B1 * 5/2002 Douglas et al. ............ 310/335

FOREIGN PATENT DOCUMENTS

| | | |
|---|---|---|
| JP | 62-84223 | 5/1962 |
| JP | 55-44605 | 3/1980 |
| JP | 58-19100 | 2/1983 |
| JP | 62-84223 | 5/1987 |
| JP | 01-236900 | 9/1989 |
| JP | 1-158988 | 11/1989 |
| JP | 3-46809 | 2/1991 |
| JP | 03-270500 | 12/1991 |
| JP | 05-013542 | 1/1993 |
| JP | 08-088036 | 4/1996 |
| JP | 09-018995 | 1/1997 |
| JP | 10-285694 | 10/1998 |
| JP | 11-231876 | 8/1999 |
| JP | 2000-012997 | 1/2000 |
| JP | 2002-033637 | 1/2002 |
| JP | 2004-260239 | 9/2004 |

* cited by examiner

*Primary Examiner*—Mark Budd
(74) *Attorney, Agent, or Firm*—Ostrolenk, Faber, Gerb & Soffen, LLP

(57) ABSTRACT

An ultrasonic wave oscillator is configured in a manner that an acoustic matching member is formed on the ultrasonic wave emission side of an electromechanical transducer element, a backing material is fixed with adhesive on the other side thereof, and the electromechanical transducer element is fixed by connection members pressing it respectively from opposite directions.

31 Claims, 75 Drawing Sheets

ULTRASONIC WAVE OSCILLATOR

CROSS REFERENCE TO RELATED APPLICATIONS

This application claims benefit of Japanese Application No. 2004-213811 filed Jul. 22, 2004 and this application claims benefit of Japanese Application No. 2005-146077 filed May 18, 2005, the contents of which are incorporated by this reference.

This application is a continuation of PCT application No. PCT/JP05/13,417, which was filed on Jul. 21, 2005.

BACKGROUND OF THE INVENTION

1. Field of the Invention

The present invention relates to an ultrasonic wave oscillator and a production method therefor.

2. Description of the Related Art

FIG. 38 is a diagram showing a conventional ultrasonic wave oscillator (e.g., refer to a patent document 1 (i.e., Laid-Open Japanese Patent Application Publication No. 05-13542, pp 2-3, and FIGS. 1 and 2)).

An ultrasonic wave oscillator 160 shown in FIG. 38 is configured in such a manner that a silver electrode 163 is placed on either side of the top and bottom faces 162 of an electromechanical transducer element 161; a conductive member is over-coated on the outside of the silver electrode 163 on which a reinforcement part 164 is placed; the reinforcement part 164 and a lead unit 165 are connected together by a soldering 166; and the electromechanical transducer element 161 and lead unit 165 are electrically connected together.

As described above, the ultrasonic wave oscillator 160 shown in FIG. 38 is configured so that the electromechanical transducer element 161 and lead unit 165 are connected together by the soldering 166 and therefore a reliability relating to the electrical connection between the electromechanical transducer element 161 and lead unit 165 is high.

FIG. 39 is a diagram showing another conventional ultrasonic wave oscillator (e.g., refer to a patent document 2 (i.e., Laid-Open Japanese Patent Application Publication No. 11-231876, pp 2-3, and FIGS. 1 through 6)). Note that the same component sign is attached to the same configuration shown in FIG. 38.

An ultrasonic wave oscillator 167 shown in FIG. 39 is configured in such a manner that one side of the top and bottom faces 162 of the electromechanical transducer element 161 is pressed by a connection member 168 which is integrally formed with a lead unit 165; and the electromechanical transducer element 161 and lead unit 165 are electrically connected together.

As such, the ultrasonic wave oscillator 167 shown in FIG. 39 is configured in a manner that the electromechanical transducer element 161 is pressed by the connection member 168 to keep the electromechanical transducer element 161 always in contact with the connection member 168, and therefore a reliability relating to the electrical connection between the electromechanical transducer element 161 and lead unit 165 is high.

However, the ultrasonic wave oscillator 160 shown in FIG. 38 uses a soldering 166 for electrically connecting between the electromechanical transducer element 161 and lead unit 165, and therefore a heat of the soldering 166 is conducted to the electromechanical transducer element 161 when it is connected to the lead unit 165, bringing about the problem of causing a thermal damage to the electromechanical transducer element 161.

There is another problem of variations in a form and size of the ultrasonic wave oscillator 160 because a feature of the connection part between the electromechanical transducer element 161 and lead unit 165 cannot be correctly determined by a connection by the soldering 166.

Another problem is that a soldering work of the soldering 166 tends to produce a variation in a quality of a jointing depending on a degree of skill of a soldering temperature control technician, resulting in a propensity of a variation in a quality of the ultrasonic wave oscillator 160.

Another problem is that a certain large soldering area to some extent is required for suppressing a variation of a soldering area size, thereby increasing an overall size of the ultrasonic wave oscillator 160.

The associated problem is that if the ultrasonic wave oscillator 160 becomes large, it cannot be produced in a low cost.

Meanwhile, there is another connection method without using a soldering 166, that is, a use of a conductive adhesive. This method, however, is faced with a similar problem, as the connection method using the soldering 166, of causing a thermal damage on the electromechanical transducer element 161 because a quantity of the conductive adhesive is difficult to control and the conductive adhesive itself produces heat at the time of hardening.

Another problem facing the ultrasonic wave oscillator 167 shown in FIG. 39 is that it is configured to electrically connect the electromechanical transducer element 161 to the lead unit 165 by having a connection member 168 and a housing 169 sandwich the electromechanical transducer element 161, thus complicating in terms of its structure.

Another problem facing the ultrasonic wave oscillator 167 shown in FIG. 39 is that a variation of an overall size thereof is large due to the individual size variations of two components, i.e., the connection member 168 and housing 169, which exist independently and vary in size individually.

Meanwhile, in the case of absorbing a variation of an overall ultrasonic wave oscillator 167, shown in FIG. 39, by taking advantage of the fact of the connection member 168 deforming, the connection member 168 needs to be large to some extent, making it difficult to make the ultrasonic wave oscillator 167 compact eventually.

As in the case of the ultrasonic wave oscillator 160 shown in FIG. 38, another problem is that if the ultrasonic wave oscillator 167 is large, it cannot be produced in a low cost.

Accordingly, the purpose of the present invention is to provide an ultrasonic wave oscillator and a production method being low cost and allowing a miniaturization thereof, improving a reliability concerning an electrical connection and suppressing a thermal damage to an electromechanical transducer element when connecting a lead part thereto.

Patent document 1: Laid-Open Japanese Patent Application Publication No. 05-13542 (pp 2-3, and FIGS. 1 and 2)

Patent document 2: Laid-Open Japanese Patent Application Publication No. 11-231876 (pp 2-3, and FIGS. 1 through 6)

SUMMARY OF THE INVENTION

In order to solve the above described problems, the present invention adopts the following comprisals.

That is, according to the present invention, an ultrasonic wave oscillator comprises an electromechanical transducer element, an acoustic matching member, a backing material, and connection members electrically connected to the electromechanical transducer element, wherein the electromechanical transducer element is electrically connected to the connection members by the connection members contacting with the electromechanical transducer element with a pressure respectively from two opposite directions.

The connection member comprised by the ultrasonic wave oscillator may also be configured to comprise a pressure application part for contacting, with a pressure, with one surface of the electromechanical transducer element, an electrical connection part for contacting, with a pressure, with an electrode layer formed on the other surface of the electromechanical transducer element, and a lead part which is connected to a ground wire or a signal wire, wherein the pressure application part, electrical connection part and lead part are integrally formed.

The connection member comprised by the ultrasonic wave oscillator may also be configured to comprise a pressure application part for contacting, with a pressure, with an electrode layer formed on one surface of the electromechanical transducer element by way of an insulation member, and an electrical connection part for contacting, with a pressure, with an electrode layer formed on the other surface of the electromechanical transducer element.

The electromechanical transducer element comprised by the ultrasonic wave oscillator may also be configured to comprise a cutout part formed by a part of an electrode layer, which is formed on one surface of the electromechanical transducer element, being cutout, and the connection member comprises a pressure application part for contacting, with a pressure, with the cutout part formed on one surface of the electromechanical transducer element, and an electrical connection part for contacting, with a pressure, with an electrode layer formed on the other surface of the electromechanical transducer element, wherein the pressure application part is formed based on a form of the cutout part.

The connection member comprised by the ultrasonic wave oscillator may also be configured to be made by a blanking process of a metallic thin plate in an approximate rectangle, with a width of the connection member in a direction perpendicular to the longitudinal direction thereof being equal to or greater than five times of a thickness of the metallic thin plate.

The ultrasonic wave oscillator may also be configured in a manner that a plurality of the connection members which is electrically connected to respective electrodes of the electromechanical transducer elements is produced by a blanking process of a metallic thin plate in the same form of an approximate rectangle; an electrical connection part, which contacts, with a pressure, with an electrode layer formed on one surface of the electromechanical transducer element, is formed at an end of the processed approximately rectangular metallic thin plate; a pressure application unit, which contacts, with a pressure, with the other surface of the electromechanical transducer element, is formed with a protrusion in a direction opposite to the electrical connection part on the inside of a hole featured close to the electrical connection part; and each of the electrodes is electrically connected to the electrical connection part by changing a bending direction of the pressure application part.

The ultrasonic wave oscillator may also be configured in a manner that a surface of the connection member contacting, with a pressure, with the electromechanical transducer element is featured with an asperity part or protrusion part.

The connection member comprised by the ultrasonic wave oscillator may also be configured to comprise a pressure application part for contacting, with a pressure, with one surface of the electromechanical transducer element, and an electrical connection part for contacting, with a pressure, with an electrode layer featured on the other surface of the electromechanical transducer element, wherein an area size of the electrical connection part is larger than that of the pressure application part.

The connection member comprised by the ultrasonic wave oscillator may also be configured to comprise a pressure application part for contacting, with a pressure, with one surface of the electromechanical transducer element, and an electrical connection part for contacting, with a pressure, with an electrode layer featured on the other surface of the electromechanical transducer element, wherein one or both of the pressure application part and electrical connection part are respectively equipped with one or more through grooves.

The connection member comprised by the ultrasonic wave oscillator may also be configured to comprise a pressure application part for contacting, with a pressure, with one surface of the electromechanical transducer element, and an electrical connection part for contacting, with a pressure, with an electrode layer featured on the other surface of the electromechanical transducer element, wherein the pressure application part or electrical connection part is equipped with a hole with the inside of the hole being applied with a soldering or conductive adhesive, and the electromechanical transducer element is connected to the connection member.

The ultrasonic wave oscillator may also be configured in a manner that a gap between the electromechanical transducer element and connection member is covered with a protection member.

The ultrasonic wave oscillator may also be configured in a manner that a metallic housing, being electrically connected to a ground wire, for fixing at least the electromechanical transducer element on the inside of the housing, wherein the connection member is electrically connected to the housing.

The electromechanical transducer element comprised by the ultrasonic wave oscillator may also be configured in a manner that the electromechanical transducer element is a composite piezoelectric element constituted by an electrode layer being placed on both surface of a plate member which is formed by each of a plurality of columnar ceramic piezoelectric bodies being enshrouded by a resin, wherein a total thickness of the resin and electrode layer is larger than a total thickness of the columnar ceramic piezoelectric body and electrode layer, and the electromechanical transducer element is connected to the connection member by the resin which is deformed with a pressure by the connection member.

The ultrasonic wave oscillator may also be configured in a manner that the connection member is formed by a shape memory alloy.

The electromechanical transducer element may also be connected to the connection member by elastically deforming the connection member of the ultrasonic wave oscillator.

Meanwhile, a production method for the ultrasonic wave oscillator according to the present invention, comprises: forming, by applying a blanking process to a metallic thin plate, the connection member, a placement member for placing the electromechanical transducer element, and a connection part for connecting the metallic thin plate to the connection member and connecting the metallic thin plate to the placement member, on the metallic thin plate; placing the electromechanical transducer element on the placement member; connecting the electromechanical transducer element to the connection member by bending a part thereof; and cutting off the connection part.

Also, according to the present invention, an ultrasonic wave oscillator comprises: an electromechanical transducer element for emitting an ultrasonic wave by transducing an electric signal to a mechanical motion; an acoustic matching member being equipped on an ultrasonic wave emission side of the electromechanical transducer element; a backing material being equipped on a surface opposite to an ultrasonic wave emission side of the electromechanical transducer element; connection members being electrically connected to the electromechanical transducer element by elastically deforming them; and an insulation member being equipped on a surface of the connection member other than a part thereof, to which the electromechanical transducer element is electrically connected, of the surface of the connection member.

The insulation member may also be equipped between a side surface of the electromechanical transducer element and connection member.

Also, a predetermined space may be provided between a side surface of the electromechanical transducer element and connection member.

The connection member may also be a flexible substrate.

The connection member may also be coated with, or applied by a vapor deposition of, an organic material.

Also, an ultrasonic wave oscillator according to the present invention comprises: an electromechanical transducer element for emitting an ultrasonic wave by transducing an electric signal to a mechanical motion; an acoustic matching member being equipped on an ultrasonic wave emission side of the electromechanical transducer element; a backing material being equipped on a surface opposite to an ultrasonic wave emission side of the electromechanical transducer element; connection members being electrically connected to the electromechanical transducer element by elastically deforming them; and an insulation member for covering the connection member after being electrically connected to the electromechanical transducer element.

Also, an ultrasonic wave oscillator according to the present invention comprises: an electromechanical transducer element for emitting an ultrasonic wave by transducing an electric signal to a mechanical motion; an acoustic matching member being equipped on an ultrasonic wave emission side of the electromechanical transducer element; a backing material being equipped on a surface opposite to an ultrasonic wave emission side of the electromechanical transducer element; two connection members being electrically connected to the electromechanical transducer element by elastically deforming them; a housing member being formed so as to expose at least the ultrasonic wave emission side of the acoustic matching member; and a conductive member being electrically connected to an edge part of the connection member on one side which extends to the outside of the housing member.

Also, an ultrasonic wave oscillator according to the present invention comprises: an electromechanical transducer element for emitting an ultrasonic wave by transducing an electric signal to a mechanical motion; an acoustic matching member being equipped on an ultrasonic wave emission side of the electromechanical transducer element; a backing material being equipped on a surface opposite to an ultrasonic wave emission side of the electromechanical transducer element; two connection members being electrically connected to the electromechanical transducer element by elastically deforming them; a housing member being formed so as to expose at least the ultrasonic wave emission side of the acoustic matching member; and a conductive connector equipped on an edge part of the connection member on one side which extends to the outside of the housing member.

And, an ultrasonic wave oscillator according to the present invention comprises: an electromechanical transducer element for emitting an ultrasonic wave by transducing an electric signal to a mechanical motion; an acoustic matching member being equipped on an ultrasonic wave emission side of the electromechanical transducer element; a backing material being equipped on a surface opposite to an ultrasonic wave emission side of the electromechanical transducer element; connection members being electrically connected to the electromechanical transducer element by elastically deforming them, wherein a plurality of the electromechanical transducer elements is layered, with the layered electromechanical transducer elements being electrically connected to the connection member.

Meanwhile, according to the present invention, a production method for an ultrasonic wave oscillator comprising an electromechanical transducer element for emitting an ultrasonic wave by transducing an electric signal to a mechanical motion; an acoustic matching member being equipped on an ultrasonic wave emission side of the electromechanical transducer element; a backing material being equipped on a surface opposite to an ultrasonic wave emission side of the electromechanical transducer element; connection members being electrically connected to the electromechanical transducer element by elastically deforming them, wherein the production method comprises: a form making process for making a form of the connection member in a metallic thin plate, a insulation member investment process for investing a predetermined position of a metallic thin plate, in which the form of the connection member is made, with an insulation member, a bending process for bending the metallic thin plate, on which the insulation member is invested, in a predetermined form, and a cutout process for cutting a formed part of the connection member off the metallic thin plate which is bent in the predetermined form.

Furthermore, the scope of the present invention encompasses an ultrasonic wave endoscope apparatus equipped with the above described ultrasonic wave oscillator and also an ultrasonic wave endoscope apparatus equipped with an ultrasonic wave oscillator produced by the above described production method therefor.

DESCRIPTION OF THE PREFERRED EMBODIMENTS

The following is a description of the preferred embodiment of the present invention by referring to the accompanying drawings.

First Embodiment

Figure 1:
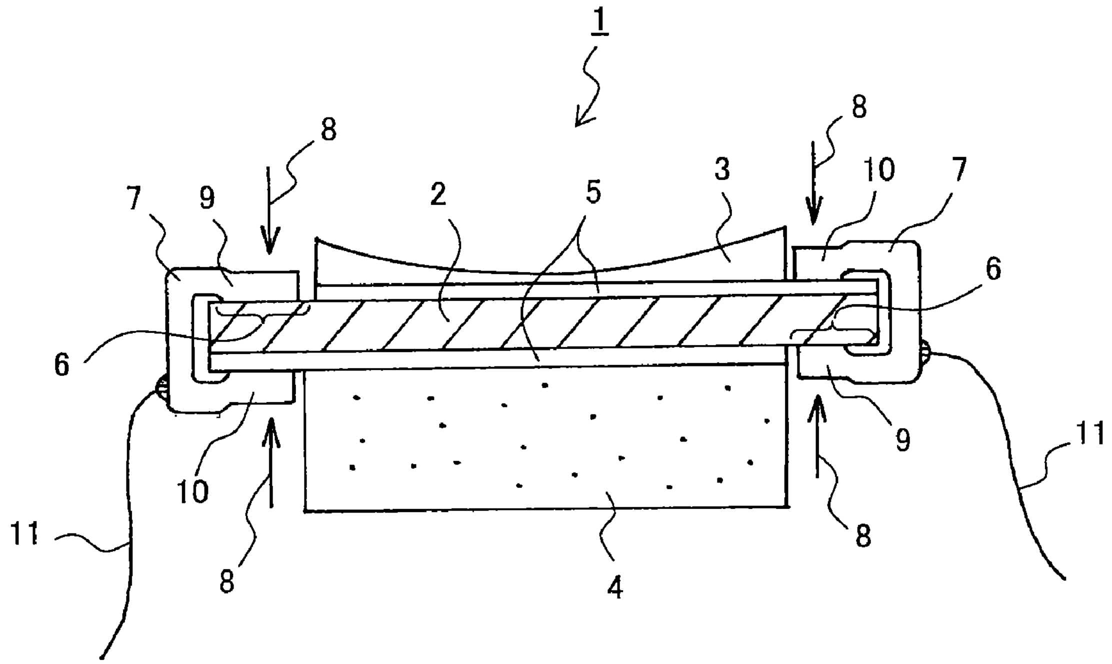
FIG. 1 is a diagram for describing an ultrasonic wave oscillator according to the preferred embodiment of the present invention.

FIG. 1 is a diagram for describing an ultrasonic wave oscillator according to the first embodiment of the present invention.

As shown in FIG. 1, the ultrasonic wave oscillator 1 comprises an electromechanical transducer element 2 (e.g., a piezoelectric element) which is featured with an acoustic matching member 3 on an ultrasonic wave emission side of the electromechanical transducer element 2 for matching the ultrasonic wave, and a backing material 4 for attenuating the ultrasonic wave on the other side thereof.

It also comprises electrode layers 5 on the top and bottom surfaces of the electromechanical transducer element 2.

It also comprises a cutout part 6 formed, on the top and bottom surfaces of the electromechanical transducer element 2, as a result of a part of the electrode layer 5 being cut out.

Each of connection members 7, being shaped as a squared "C" (that is, a square with one side being open), applies pressure to the electromechanical transducer element 2 from the opposite directions 8 (i.e., the opposite two directions), thereby fixing the electromechanical transducer element 2. In this event, a pressure application part 9 of the connection member 7 contacts with the cutout part 6 with a pressure ("pressure-contact" hereinafter) so that an electrical connection part 10 opposite to the pressure application part 9 pressure-contacts with the electrode layer 5.

Each of the connection members 7 is also fixed onto a lead wire 11 by way of electrical and mechanical fastening means including soldering, conductive adhesive, a screw, et cetera. Incidentally, an assumption here is that the lead wire 11 is connected to a driver (not shown herein).

The next is a description on an operation of the ultrasonic wave oscillator 1.

As an ultrasonic wave signal is excited by a driver (not shown herein) and applied to the electromechanical transducer element 2 from the connection members 7 by way of the lead wires 11, the ultrasonic wave signal is transduced into an ultrasonic wave and transmitted from the acoustic matching member 3. Meanwhile, when the electromechanical transducer element 2 externally receives an ultrasonic wave, it is transduced into an ultrasonic wave signal and transmitted to the driver (not shown herein) by way of the connection members 7 and lead wires 11.

As such, since the connection member 7 sandwiches the electromechanical transducer element 2 from the opposite directions 8, the electrical connection part 10 constantly pressure-contacts with the electrode layers 5, thereby stabilizing an electrical connection state continuously between the electromechanical transducer element 2 and connection member 7.

This configuration improves a reliability relating to an electrical connection between the electromechanical transducer element 2 and connection member 7, which in turn improves a reliability relating to an electrical connection between the electromechanical transducer element 2 and lead wire 11.

Meanwhile, the connection member 7 is connected to the lead wire 11 by a soldering, et cetera, and therefore a thermal damage induced to the electromechanical transducer element 2 can be suppressed.

And the connection member 7 is connected to the electromechanical transducer element 2 without using a soldering, et cetera, eliminating a necessity of furnishing the electromechanical transducer element 2 with a soldering area, et cetera, thereby enabling a miniaturization of the ultrasonic wave oscillator 1 as that much, thus reducing a production cost thereof.

Second Embodiment

Figure 2A:
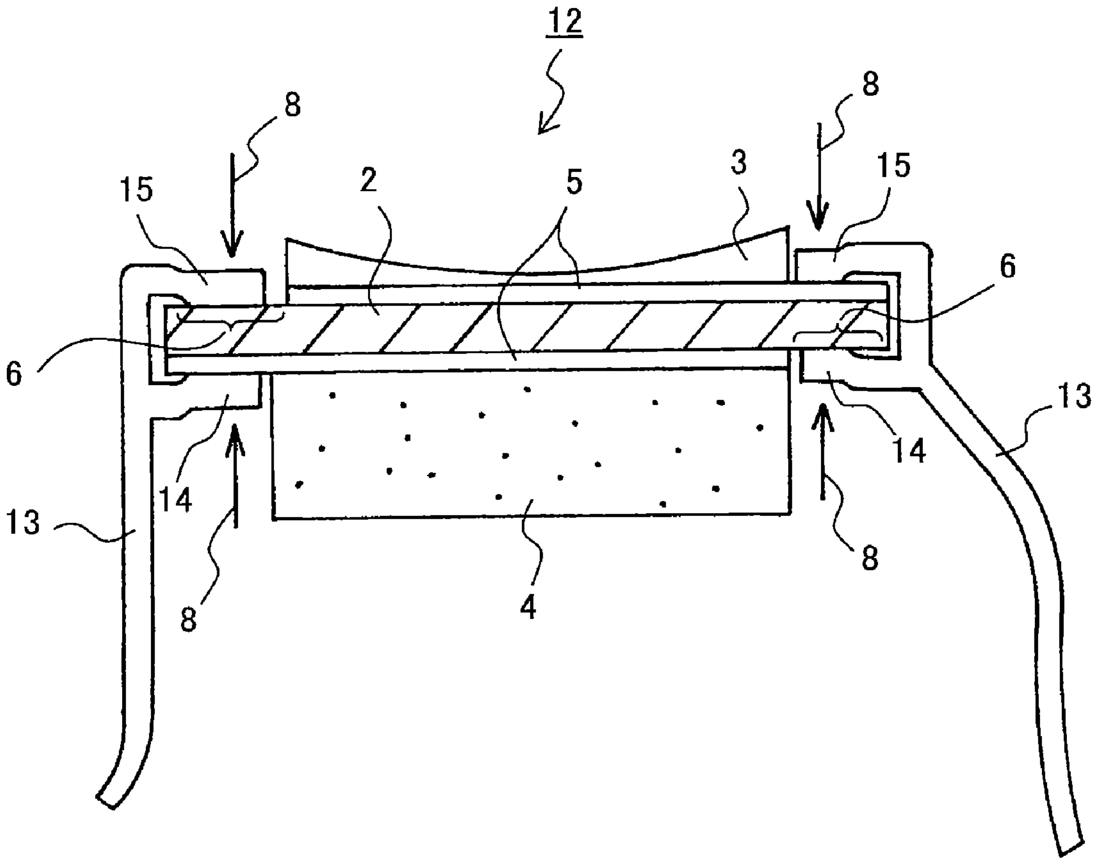
FIG. 2A is a diagram showing an entirety of an ultrasonic wave oscillator according to another embodiment.
Figure 2B:
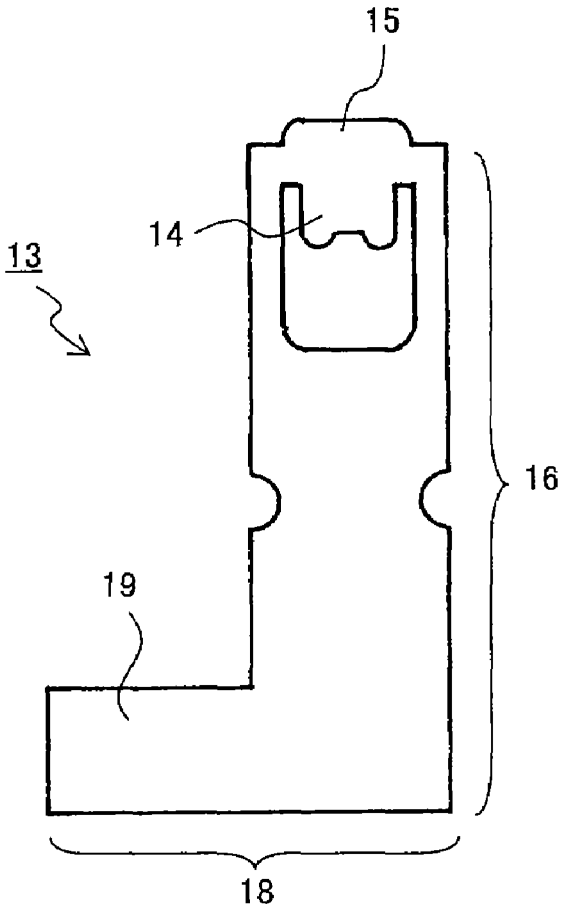
FIG. 2B is a diagram showing a body of a connection member to be connected to the ultrasonic wave oscillator shown in FIG. 2A.
Figure 2C:
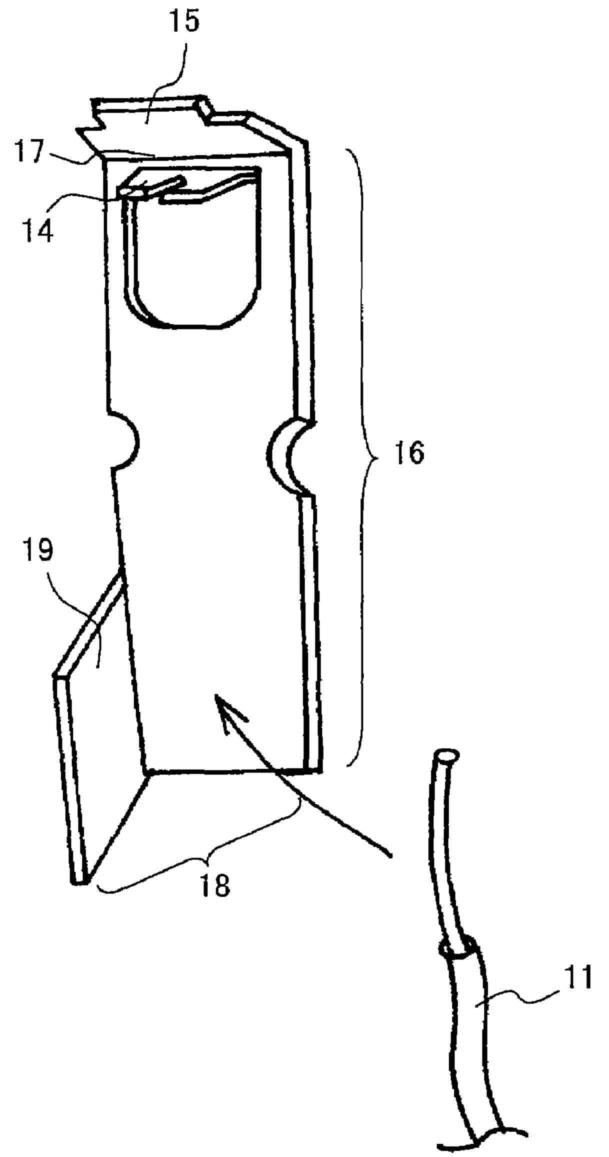
FIG. 2C is a diagram showing a state of the connection member shown in FIG. 2B having been applied by a bending process.
Figure 2D:
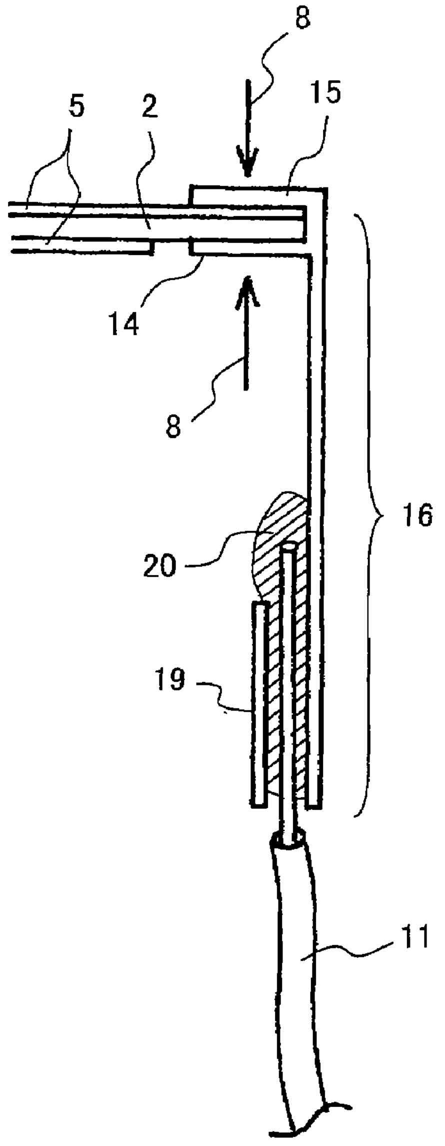
FIG. 2D is a diagram showing a state of the connection member shown in FIG. 2C having been connected to an electromechanical transducer element.

FIGS. 2A through 2D are diagrams for describing an ultrasonic wave oscillator according to the second embodiment of the present invention. Note that the same component sign is attached to the same comprisal as that shown in FIG. 1. FIG. 2A is a diagram showing an entirety of an ultrasonic wave oscillator according to another embodiment; FIG. 2B is a diagram showing a body of a connection member to be connected to the ultrasonic wave oscillator shown in FIG. 2A; FIG. 2C is a diagram showing a state of the connection member shown in FIG. 2B having been applied by a bending process; and FIG. 2D is a diagram showing a state of the connection member shown in FIG. 2C having been connected to an electromechanical transducer element.

Referring to the ultrasonic wave oscillator 12 shown in FIG. 2A, each connection member 13 is formed by applying a blanking process to a metallic thin plate, comprises a pressure application part 14 which pressure-contacts with a cutout part 6 on one surface of the electromechanical transducer element 2, an electrical connection part 15 which pressure-contacts with the electrode layer 5 of the other surface of the electromechanical transducer element 2, and a lead part 16 (refer to FIGS. 2B through 2D for lead part 16) connected to the ground ("GND" hereinafter) wire, signal wire, et cetera, with the pressure application part 14, electrical connection part 15 and lead part 16 being integrally formed. Incidentally, the connection member 13 connected to the left side of the electromechanical transducer element 2 is so configured that the pressure application part 14 pressure-contacts with the electrode layer 5 and the electrical connection part 15 pressure-contacts with the cutout part 6.

Meanwhile, the connection member 13 is bent in the form as shown in FIG. 2C in advance of being connected to the electromechanical transducer element 2. Then, the electromechanical transducer element 2 is inserted into an insertion part 17 between the pressure application part 14 and electrical connection part 15, a pressure is applied to the aforementioned two components from the opposite directions 8, the cutout part 6 is pressure-contacted by the pressure application part 14 and the electrode layer 5 is pressure-contacted by the electrical connection part 15, thereby fixing the electromechanical transducer element 2 by the connection member 13, as shown in FIGS. 2C and 2D.

And the lead wire 11 is fixed to the lead part 16 by bending a projection 19 equipped at the end of an end part 18 of the lead part 16 so as to have the end part 18 sandwich the lead wire 11, followed by fixing the lead part 16 and the end part of the lead wire 11 with a soldering 20 as shown in FIGS. 2B through 2D. This configuration connects the lead part 16 to the lead wire 11 electrically and mechanically, and so is the connection member 13 to the lead wire 11.

As such, it is possible to perform a connection of the connection member 13 to the lead wire 11 with the soldering 20 at a position on the connection member 13 which is distanced, by the long-side length of the lead part 16, from the position where the connection member 13 is connected to the electromechanical transducer element 2, and therefore a heat of the soldering 20 at the time of the connection is hardly transmitted to the electromechanical transducer element 2, thereby making it possible to cause little thermal damage thereto.

That is, the lead wire 11 is connected to the electromechanical transducer element 2 by way of the lead part 16, it is therefore possible to prevent a thermal influence, which is received by the lead part 16 at the time of connecting the lead wire 11 to the lead part 16, from being materially given to the electromechanical transducer element 2.

This in turn improves a quality of the ultrasonic wave oscillator 12.

Also, the equipment of the end part 18 with the projection 19 enables an improvement of the reliability relating a mechanical connection of the lead wire 11 to the connection member 13.

The equipment of the end part 18 with the projection 19 also makes it possible to ease a work, and accordingly improve workability, of connecting the lead wire 11 to the connection member 13.

The configuration is such that a lead wire 11 is not connected in the neighborhood of a place where the connection member 13 is connected to the electromechanical transducer element 2, and therefore an indeterminate area such as a soldering area is removed from the connection member 13 or electromechanical transducer element 2, and it accordingly becomes easier to determine a feature of the ultrasonic wave oscillator 12 close to that only at the time of designing it.

An equipment of an extraneous area is no longer required of the electromechanical transducer element 2 or connection members 13, thereby enabling a miniaturization the ultrasonic wave oscillator.

Since the connection member 13 is configured to be integrally formed with the lead part 16, eliminating a necessity of connecting the lead part 16 to the electromechanical transducer element 2 with a soldering, et cetera, it is accordingly possible to suppress a thermal damage imposing thereto.

Third Embodiment

Figure 3:
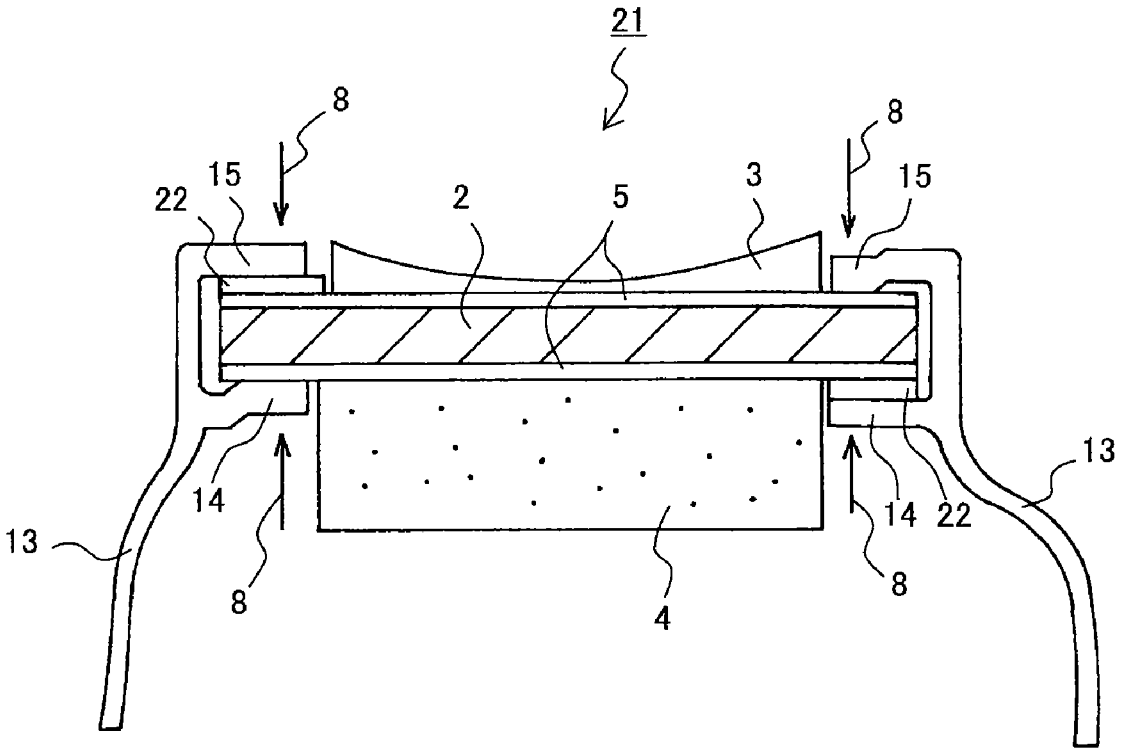
FIG. 3 is a diagram for describing an ultrasonic wave oscillator according to another embodiment.

FIG. 3 is a diagram for describing an ultrasonic wave oscillator according to the third embodiment of the present invention. Note that the same component sign is attached to the same comprisal as one shown in FIG. 1 or FIGS. 2A through 2D.

As shown in FIG. 3, an ultrasonic wave oscillator 21 is configured to include electrode layers 5 without a cutout part 6 placed on the top and bottom surfaces of an electromechanical transducer element 2. And a pressure application part 14 of a connection member 13 which is connected to the right side of the electromechanical transducer element 2 shown in FIG. 3 presses the electrode layer 5 to the opposite direction 8 by way of an insulation member 22, and an electrical connection part 15 pressure-contacts with the electrode layer 5 in the opposite direction 8. Comparably, a connection member 13 connected to the left side of the electromechanical transducer element 2 shown in FIG. 3 is configured to have the pressure application part 14 pressure-contact with the electrode layer 5 and the electrical connection part 15 presses with the electrode layer 5 by way of an insulation member 22. Note that the insulation member 22 may be constituted by an organic insulation material, e.g., polyimide, Teflon®, silicone elastomer, et cetera.

As described above, the pressure application part 14 or electrical connection part 15 presses the electrode layer 5 of the electromechanical transducer element 2 by way of the insulation member 22, and therefore the connection members 13 can be electrically connected to the electromechanical transducer element 2 independent of a form of the electrode layer 5.

This configuration makes it possible to form the electrode layer 5 by a wide electrode without considering a form thereof and greatly simplify a structure of the electromechanical transducer element 2.

Meanwhile, if an insulation member 22 is constituted by an organic insulation material, the insulation member 22 deforms freely between the electromechanical transducer element 2 and the pressure application part 14 or electrical connection part 15, and therefore an occurrence of a local stress to the electromechanical transducer element 2 caused by the pressure application part 14 or electrical connection part 15 can be prevented.

Therefore, a pressure of the pressure application part 14 or electrical connection part 15 onto the electromechanical transducer element 2 becomes uniform, thereby improving a reliability relating to an electrical and mechanical connection between the electromechanical transducer element 2 and connection members 13 and stabilizing a quality of the ultrasonic wave oscillator 21.

Fourth Embodiment

Figure 4A:
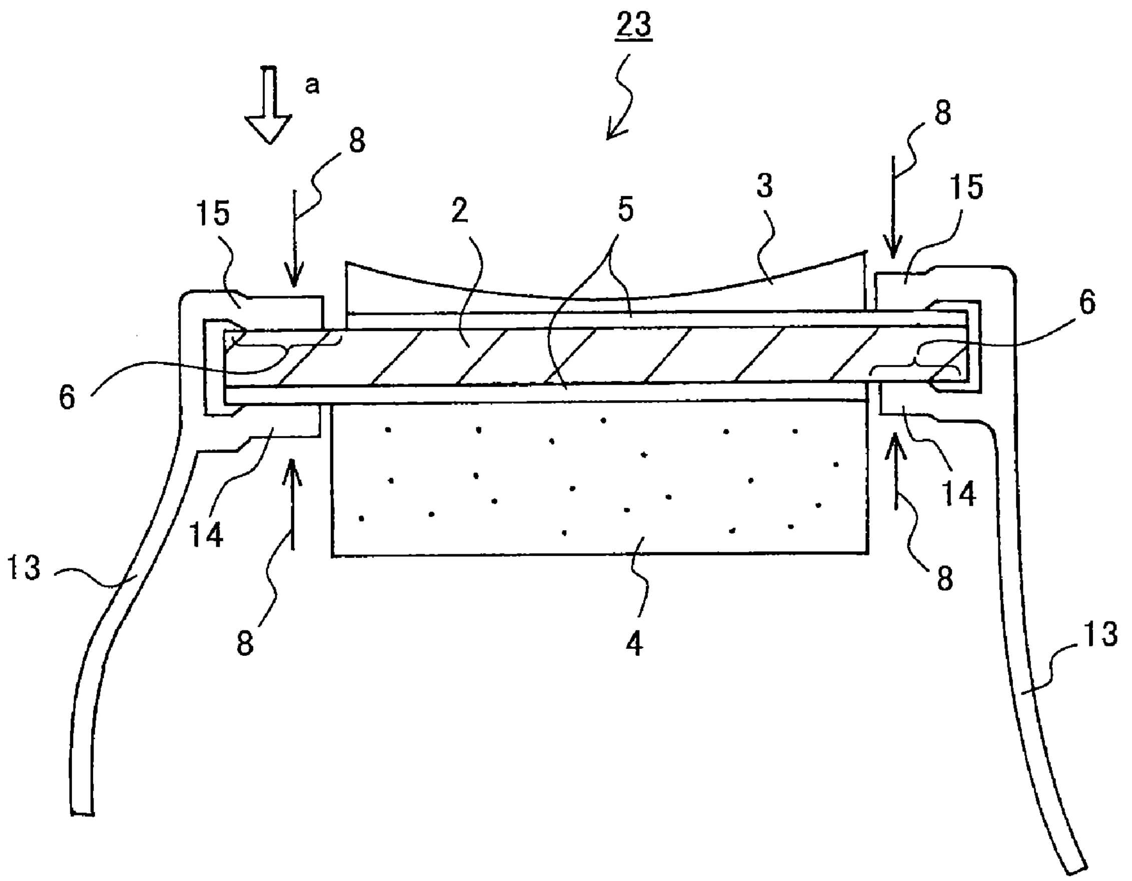
FIG. 4A is a diagram showing an entirety of an ultrasonic wave oscillator according to another embodiment.
Figure 4B:
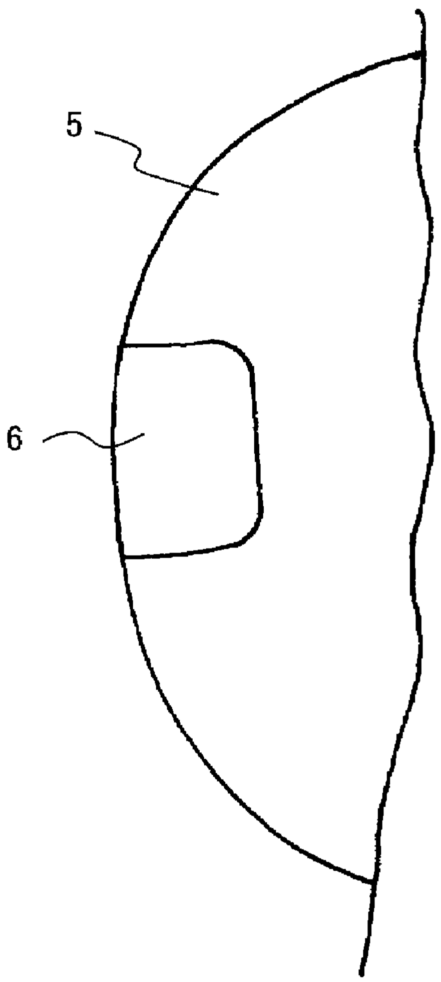
FIG. 4B is a diagram of a view from the direction of the arrow "a" shown in FIG. 4A before the connection member is connected to the electromechanical transducer element.
Figure 4C:
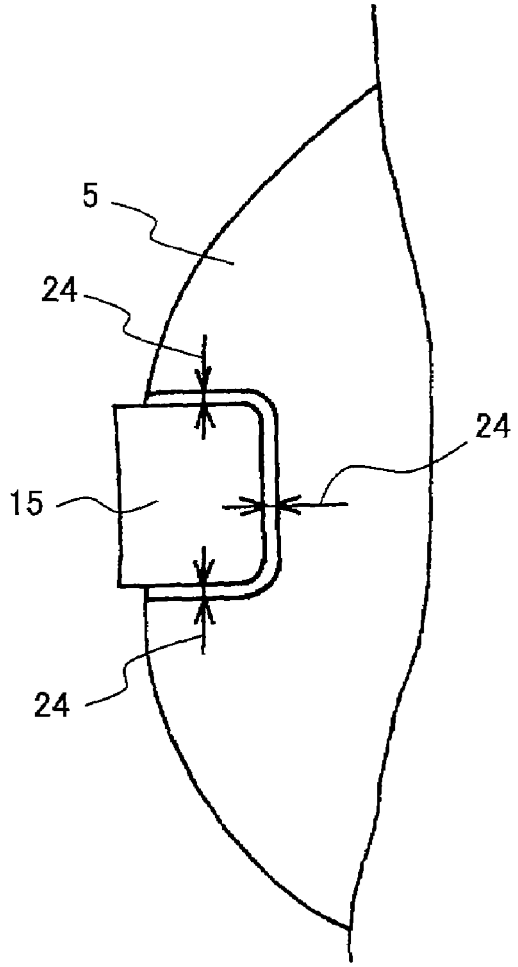
FIG. 4C is a diagram of a view from the direction of the arrow "a" shown in FIG. 4A.

FIGS. 4A through 4C are diagrams for describing an ultrasonic wave oscillator according to the fourth embodiment of the present invention. Note that the same component sign is attached to the same comprisal as one shown in FIG. 1 or FIGS. 2A through 2D.

FIG. 4A is a diagram showing an entirety of an ultrasonic wave oscillator according to another embodiment; FIG. 4B is a diagram of a view from the direction of the arrow "a" shown in FIG. 4A before the connection member is connected to the electromechanical transducer element; and FIG. 4C is a diagram of a view from the direction of the arrow "a" shown in FIG. 4A.

An ultrasonic wave oscillator 23 shown in FIG. 4A is configured to cut out a part of electrode layers 5 placed on the top and bottom surface of an electromechanical transducer element 2 and feature a cutout part 6 as shown in FIG. 4B. And an electrical connection part 15 is formed so that there is a gap 24 between the electrode layers 5 and electrical connection part 15 as shown in FIG. 4C when a connection member 13 is connected to the electromechanical transducer element 2. Then, when the connection member 13 is connected to the electromechanical transducer element 2, the connection member 13 is adjusted for its position so as to secure the gap 24 between the electrode layer 5 and electrical connection part 15.

This configuration provides insulation between the electrode layer 5 and electrical connection part 15 by means of the gap 24.

This also makes it possible to predetermine a form of the cutout part 6 at the time of the design, and accordingly a sound wave emission area size accurately.

In the case of making a plurality of the electromechanical transducer elements 2, it is also possible to equip cutout parts 6 respectively of the same area sizes, thus enabling an improvement of a quality of the ultrasonic wave oscillator 23.

Meanwhile, there is no need to secure a large connection area between the electromechanical transducer element 2 and connection members 13 in prediction of a molten solder, et cetera, flowing out as in the case of connecting the connection members 13 to the electromechanical transducer element 2 by using a soldering, et cetera, and the ultrasonic wave oscillator 23 can be accordingly miniaturized.

Note that the pressure application part 14 may be formed so that there is a gap 24 between the pressure application part 14 and electrode layer 5 also for the connection member 13 connected to the right side of the electromechanical transducer element 2 shown in FIG. 4A.

Fifth Embodiment

Figure 5A:
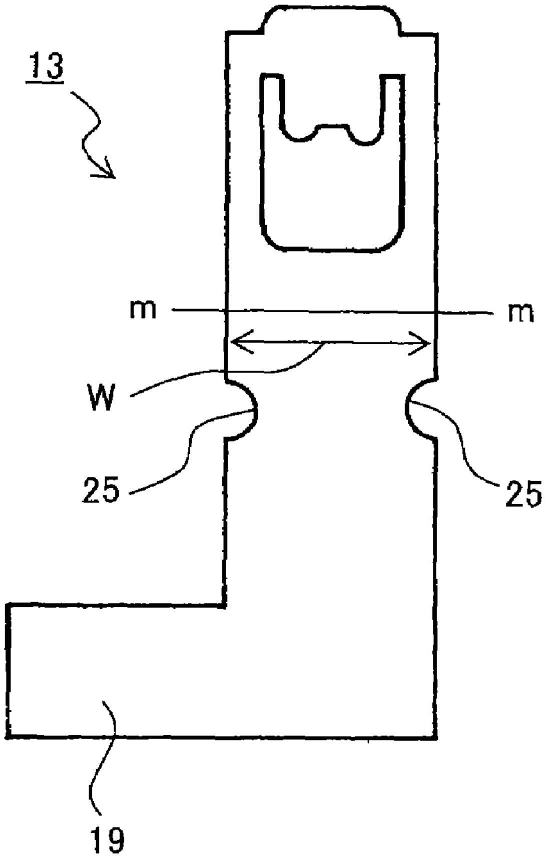
FIG. 5A is a diagram showing a body of a connection member.
Figure 5B:
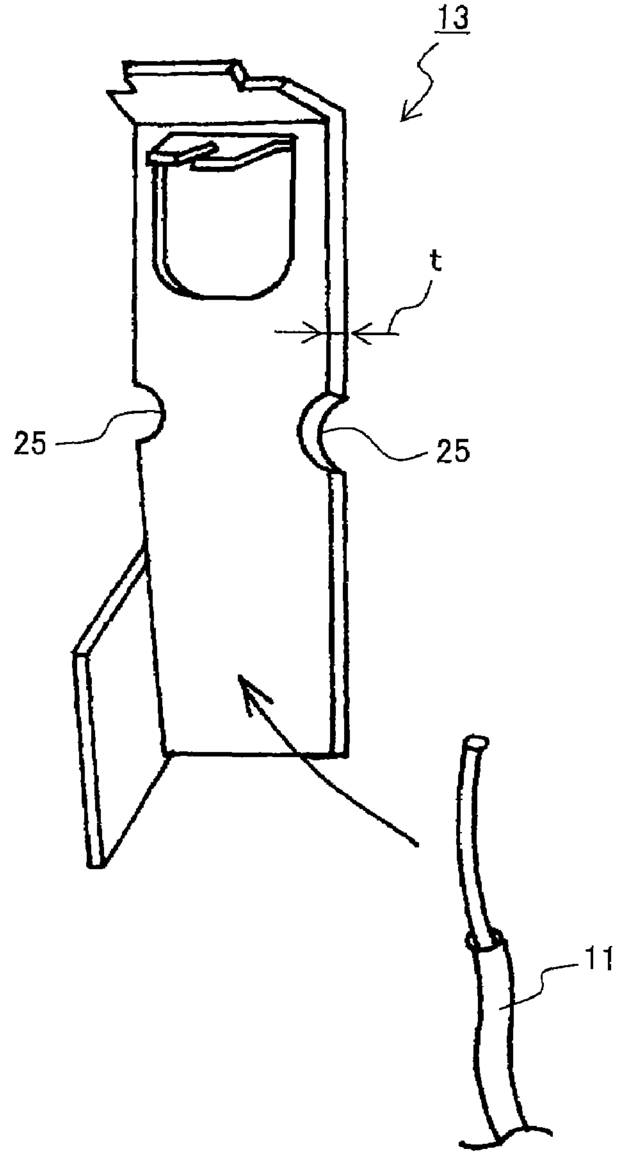
FIG. 5B is a diagram showing a state of a connection member having been bent before it is connected to an electromechanical transducer element.
Figure 5C:
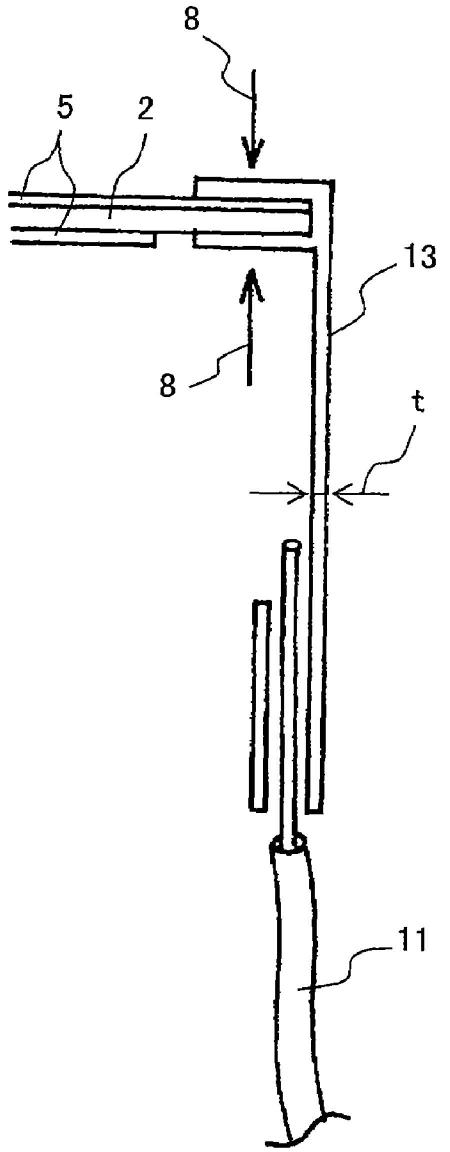
FIG. 5C is a diagram showing a state of a connection member having been connected to an electromechanical transducer element.
Figure 5D:
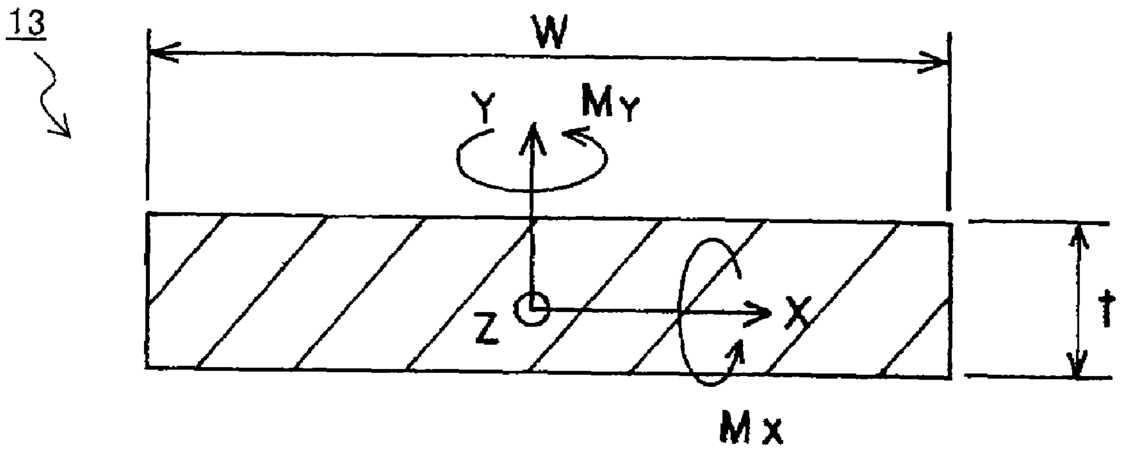
FIG. 5D shows the m-m cross-sectional diagram of the connection member shown in FIG. 5A.
Figure 5E:
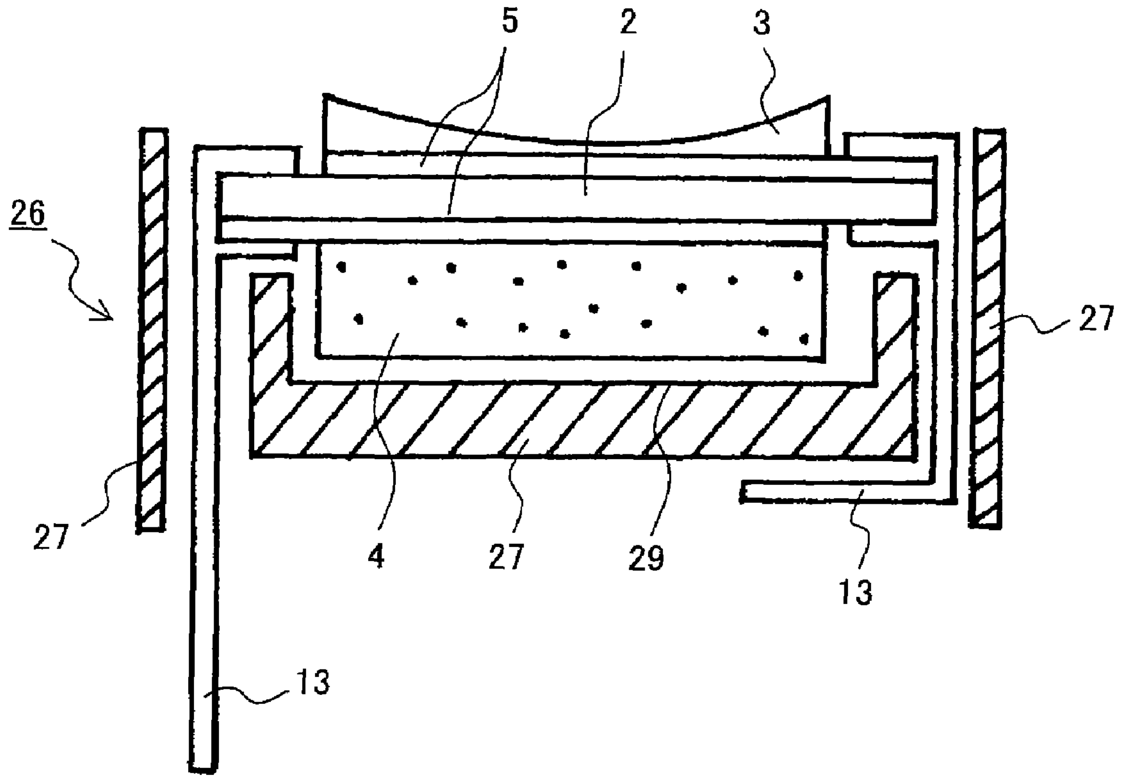
FIG. 5E is a diagram showing an entirety of an ultrasonic wave oscillator according to another embodiment.
Figure 5F:
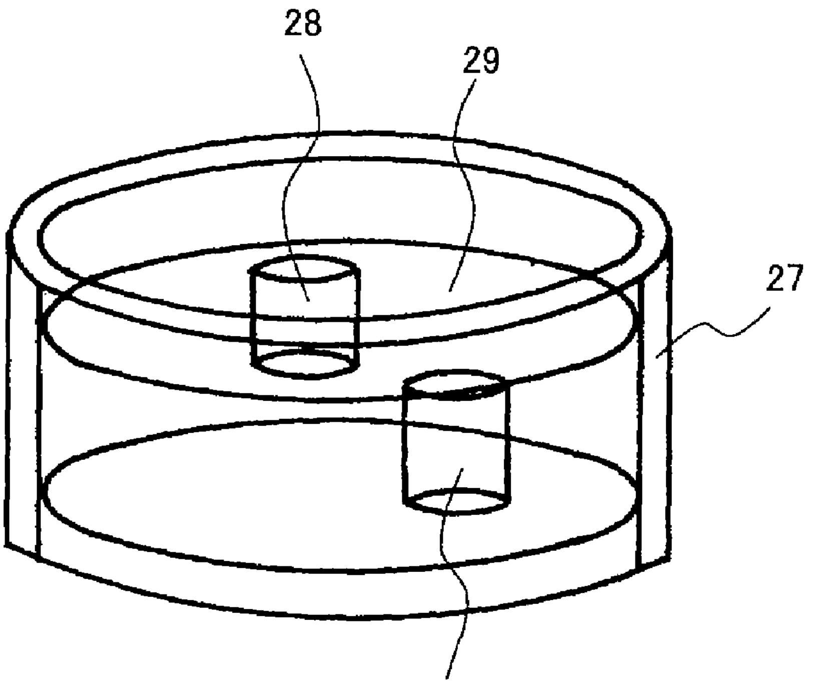
FIG. 5F shows a diagonal view diagram of a housing body.

FIGS. 5A through 5E are diagrams for describing an ultrasonic wave oscillator according to the fifth embodiment of the present invention. Note that the same component sign is attached to the same comprisal as one shown in FIG. 1 or FIGS. 2A through 2D. FIG. 5A is a diagram showing a body of a connection member; FIG. 5B is a diagram showing a state of a connection member having been bent before it is connected to an electromechanical transducer element; FIG. 5C is a diagram showing a state of a connection member having been connected to an electromechanical transducer element; FIG. 5D shows the m-m cross-sectional diagram of the connection member shown in FIG. 5A; FIG. 5E is a diagram showing an entirety of an ultrasonic wave oscillator according to another embodiment; and FIG. 5F shows a diagonal view diagram of a housing body.

The connection member 13 shown by FIGS. 5A through 5D is formed by applying a blanking process to a metallic thin plate, with a width W of the connection member 13 being featured at no less than five ("5") where defining a thickness t thereof as one ("1"). Note that when forming the connection member 13 by applying a blanking process to a metallic thin plate, it may be formed to not comprise a projection part 19, that is, the connection member 13 may be formed by applying a blanking-process to make an approximate rectangle.

And the edge of the connection member 13 is featured with constriction parts 25 at mutually opposite positions as shown in FIGS. 5A and 5B.

This enables the connection member 13 to be susceptible to bending at the constriction part 25.

The next is a description on an ultrasonic wave oscillator 26 shown in FIG. 5E.

First, connection members 13 are connected to the electromechanical transducer element 2, and an acoustic matching member 3 and a backing material 4 are mounted to respective electrode layers 5, followed by inserting lead parts 16 (refer to FIGS. 2B through 2D for lead parts 16) of the respective connection members 13 into respective holes 28 of a housing 27 shown in FIG. 5F, and placing a backing material 4 on a base part 29 of the housing 27. Note that the base part 29 may be applied an adhesive in advance. The housing 27 may be made of a plastic material.

Next is to bend the connection member 13 which is out of the hole 28 at the constriction parts 25 and house the electromechanical transducer element 2 in the housing 27.

In the case of inserting the lead part 16 of the connection member 13 in the hole 28 as described above, the fact of a freedom of bending the lead part 16 is such that it is easy to bend against a moment Mx around the x-axis as shown in FIG. 5D and that it is hard to bend against the moment My around the y-axis is necessary for positioning the lead part 16 and bending it thereafter.

Also configured is that the width W is sufficiently larger than the thickness t, e.g., the width W is five or more for the thickness t of one, as described above, thereby obtaining a relative freedom of bending at the lead part 16 to be My>>Mx.

As such, it is possible to make the freedom of bending lead part 16 as My>>Mx, and therefore a variation in positioning the lead part 16 does not occur, the insertion of the lead part 16 to the hole 28 becomes easy, and the placement of the electromechanical transducer element 2 on the housing 27 is simplified.

Also, making it as My>>Mx enables an improvement of the assembly accuracy and quality, and a reduction of the production cost.

Sixth Embodiment

Figure 6A:
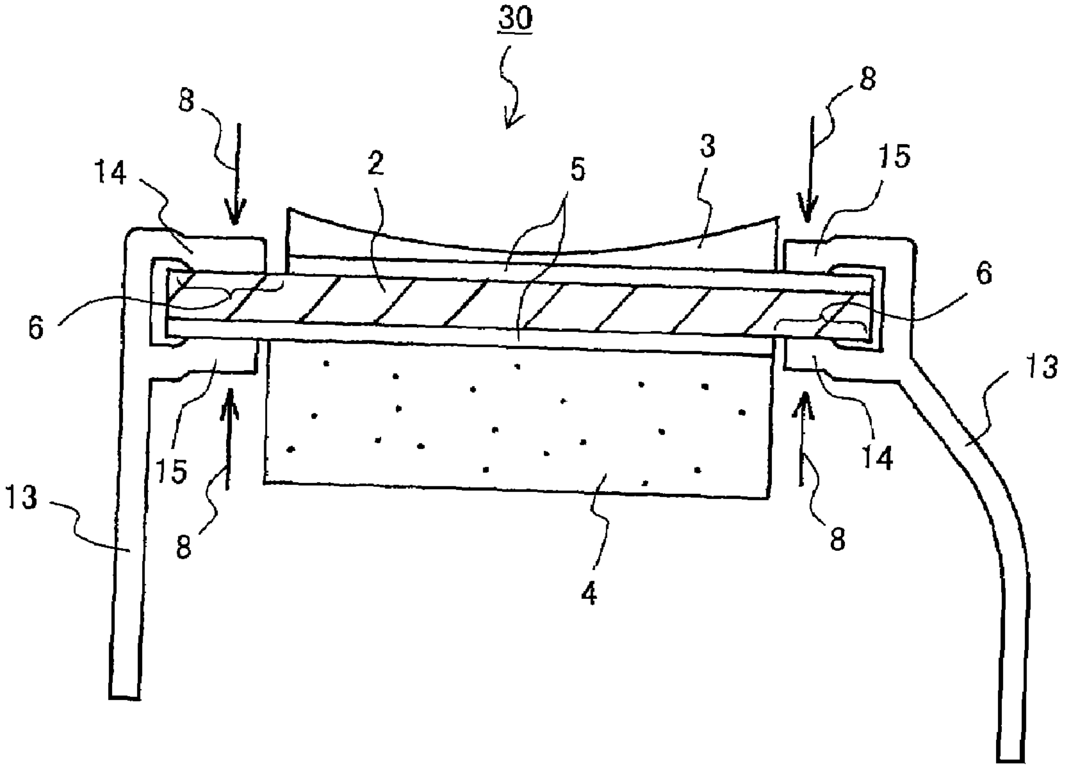
FIG. 6A is a diagram showing an entirety of an ultrasonic wave oscillator according to another embodiment.
Figure 6B:
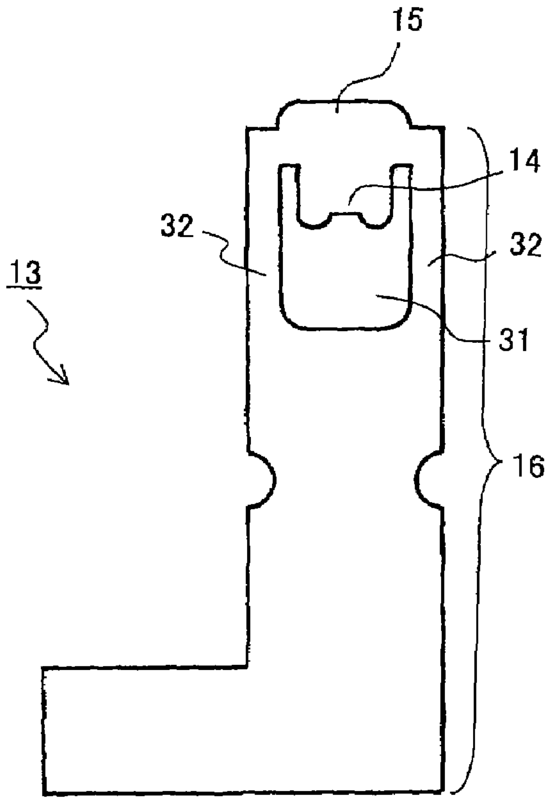
FIG. 6B is a diagram showing a body of a connection member.
Figure 6C:
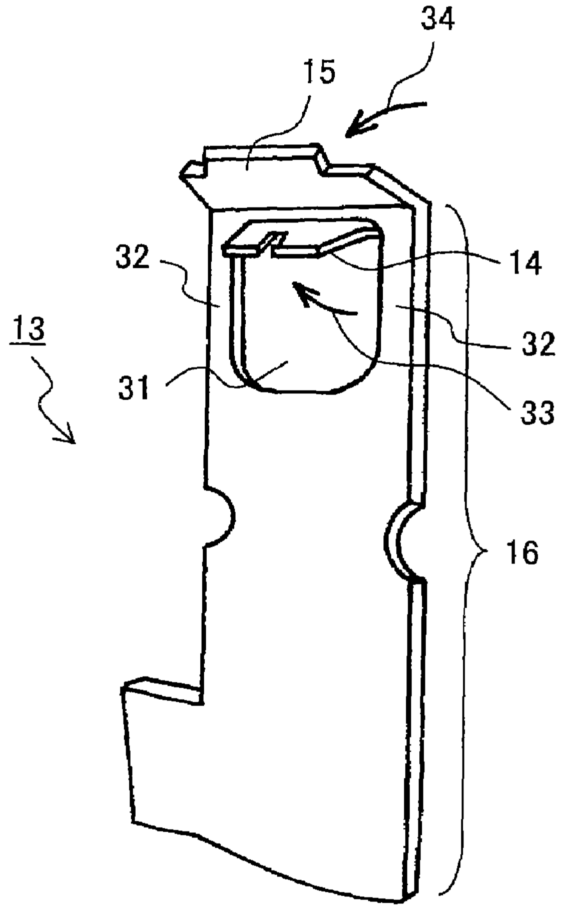
FIG. 6C is a diagram showing a state of a pressure application part and of an electrical connection part of the connection member, shown in FIG. 6B, having been bent mutually in the opposite directions.
Figure 6D:
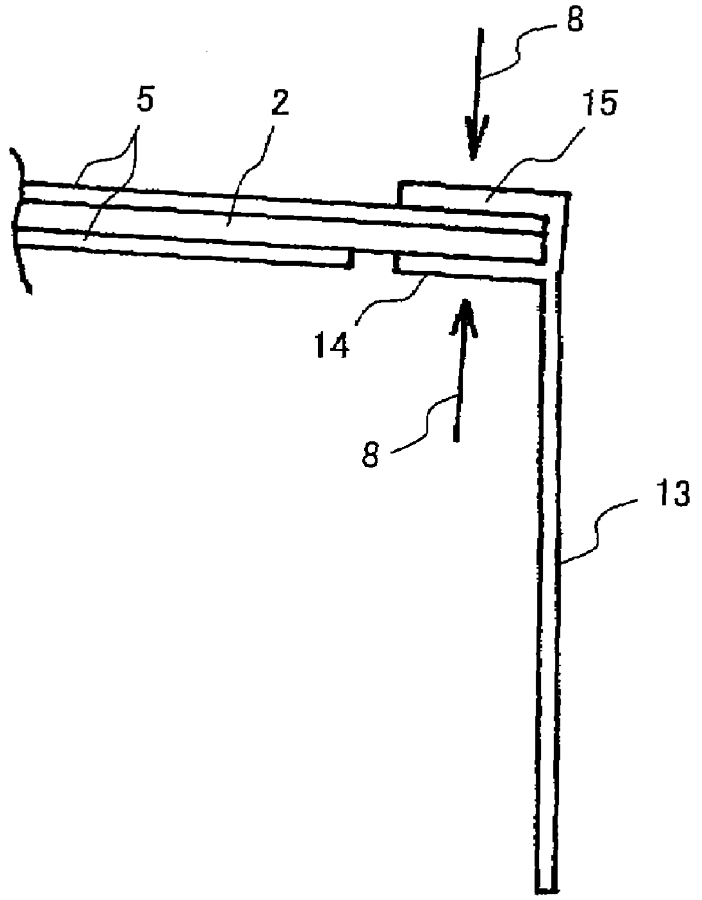
FIG. 6D is a diagram showing a state of the connection member shown in FIG. 6C having been connected to the right side of the electromechanical transducer element shown in FIG. 6A.
Figure 6E:
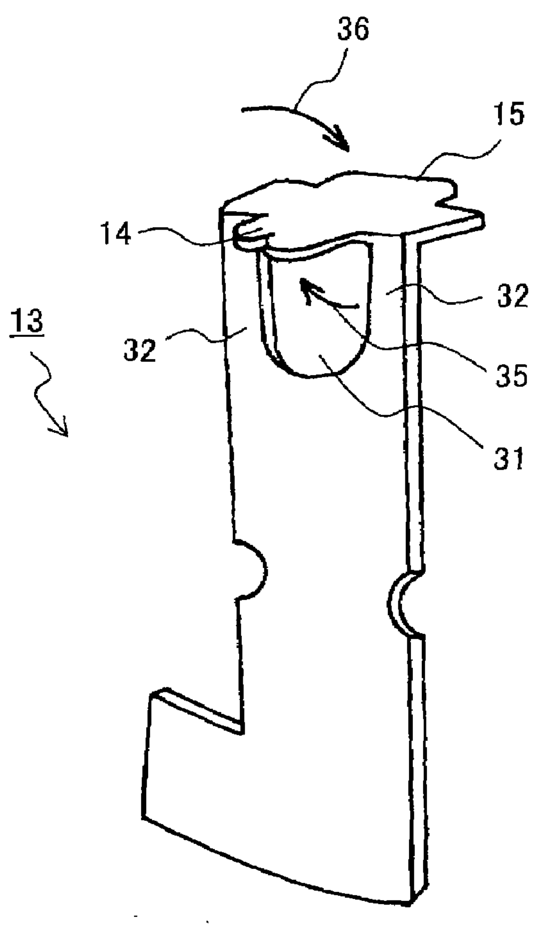
FIG. 6E is a diagram showing a state of a pressure application part and of an electrical connection part of the connection member, shown in FIG. 6B, having been bent mutually in the same direction.
Figure 6F:
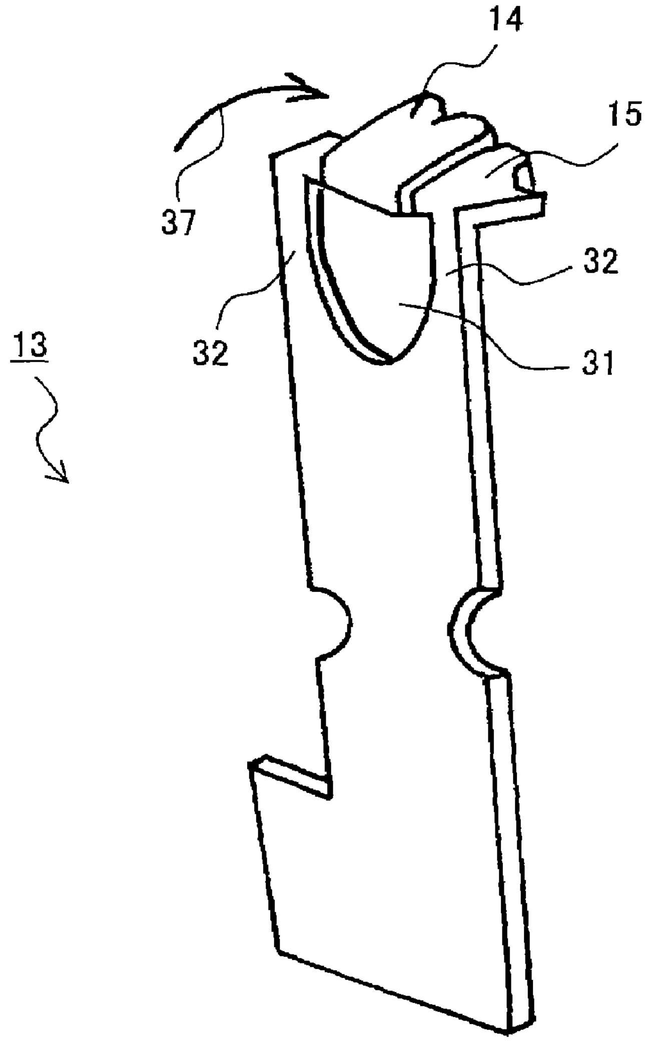
FIG. 6F is a diagram showing a state of a pressure application part of the connection member, shown in FIG. 6E having been further bent to the side of an electrical connection part.
Figure 6G:
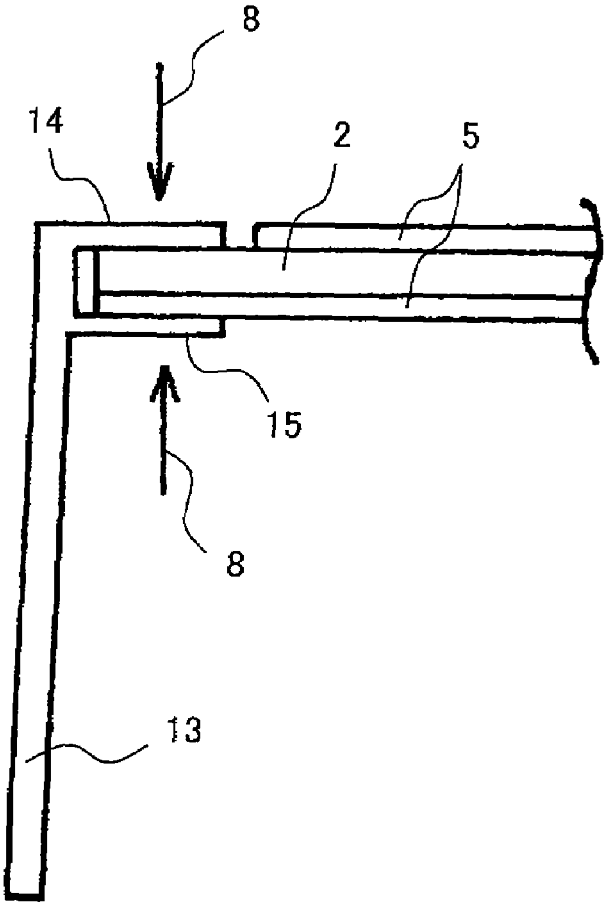
FIG. 6G is a diagram showing a state of the connection member shown in FIG. 6F having been connected to the left side of the electromechanical transducer element shown in FIG. 6A.

FIGS. 6A through 6G are diagrams for describing an ultrasonic wave oscillator according to the sixth embodiment of the present invention. Note that the same component sign is attached to the same comprisal as one shown in FIG. 1 or FIGS. 2A through 2D. FIG. 6A is a diagram showing an entirety of an ultrasonic wave oscillator according to another embodiment; FIG. 6B is a diagram showing a body of a connection member; FIG. 6C is a diagram showing a state of a pressure application part and of an electrical connection part of the connection member, shown in FIG. 6B, having been bent mutually in the opposite directions; FIG. 6D is a diagram showing a state of the connection member shown in FIG. 6C having been connected to the right side of the electromechanical transducer element shown in FIG. 6A; FIG. 6E is a diagram showing a state of a pressure application part and of an electrical connection part of the connection member, shown in FIG. 6B, having been bent mutually in the same direction; FIG. 6F is a diagram showing a state of a pressure application part of the connection member, shown in FIG. 6E having been further bent to the side of an electrical connection part; and FIG. 6G is a diagram showing a state of the connection member shown in FIG. 6F having been connected to the left side of the electromechanical transducer element shown in FIG. 6A.

An ultrasonic wave oscillator 30 shown in FIG. 6A is configured in a manner that a pressure application part 14 of a connection member 13 connected to the right side of the electromechanical transducer element 2 pressure-contacts with a cutout part 6 existing on a backing material 4 side and an electrical connection part 15 pressure-contacts with an electrode layer 5 existing on an acoustic matching member 3 side. And that a pressure application part 14 of a connection member 13 connected to the left side of the electromechanical transducer element 2 pressure-contacts with a cutout part 6 existing on an acoustic matching member 3 side, and an electrical connection part 15 pressure-contacts with an electrode layer 5 existing on the side of a backing material 4.

The two connection members 13 connected to the left and right sides of the electromechanical transducer element 2, respectively, are made by changing respective bending directions of the pressure application part 14 of the connection member 13 shown in FIG. 6B.

Equipping the pressure application part 14 on the side of a hole 32 of the connection member 13 makes it possible to bend the pressure application part 14 independent of the lead part 16 and change bending directions of the pressure application part 14.

Pillars 32 are featured on the left and right sides of the hole 31, respectively, as shown in FIGS. 6B, 6C, 6E and 6F. Thusly featuring the pillars 32 on the left and right sides of the hole 31 prevents the connection member 13 from deforming in a manner to twist the electromechanical transducer element 2 at a part connecting with the electromechanical transducer element 2.

And as shown in FIG. 6C, the pressure application part 14 is bent in the direction of arrow 33 and also the electrical connection part 15 is bent in the direction of arrow 34, followed by the electromechanical transducer element 2 being inserted between the pressure application part 14 and electrical connection part 15, followed by the pressure application part 14 and electrical connection part 15 being pressed from the opposite directions 8, elastically deforming the pressure application part 14 and electrical connection part 15, respectively, thus resulting in connecting the connection member 13 to the right side of the electromechanical transducer element 2, as shown in FIG. 6D.

And as shown in FIG. 6E, the pressure application part 14 is bent in the direction of arrow 35, and also the electrical connection part 15 is bent in the direction of arrow 36 which is the same direction of rotation as the arrow 35, then the pressure application part 14 is bent in the direction of arrow 37 which is the same direction of rotation as the arrow 35 as shown in FIG. 6F, followed by the electromechanical transducer element 2 being inserted between the pressure application part 14 and electrical connection part 15, and followed by the pressure application part 14 and electrical connection part 15 being pressed from the opposite directions 8, elastically deforming the pressure application part 14 and electrical connection part 15, respectively, thus resulting in connecting the connection member 13 to the left side of the electromechanical transducer element 2, as shown in FIG. 6G.

As such, changing bending directions of the pressure application part 14 for the one blanking-processed connection member 13 makes it possible to form two kinds of connection members (i.e., a connection member 13 with the electrical connection part 15 being formed on the edge and the pressure application part 14 being formed in the hole 31, and a connection member with the pressure application part 14 being formed on the edge and the electrical connection part 15 being formed in the hole 31).

This configuration eliminates a necessity of making two kinds of connection members in advance, reducing a component inventory in the production process and eliminating a production tooling for the connection member, thereby enabling a reduction of a tooling fabrication cost.

Note that when forming the connection member 13 by blanking processing a metallic thin plate, the connection member 13 may be so formed as to not comprise a projection part 19, that is, by blanking processing in an approximate rectangle.

Seventh Embodiment

Figure 7A:
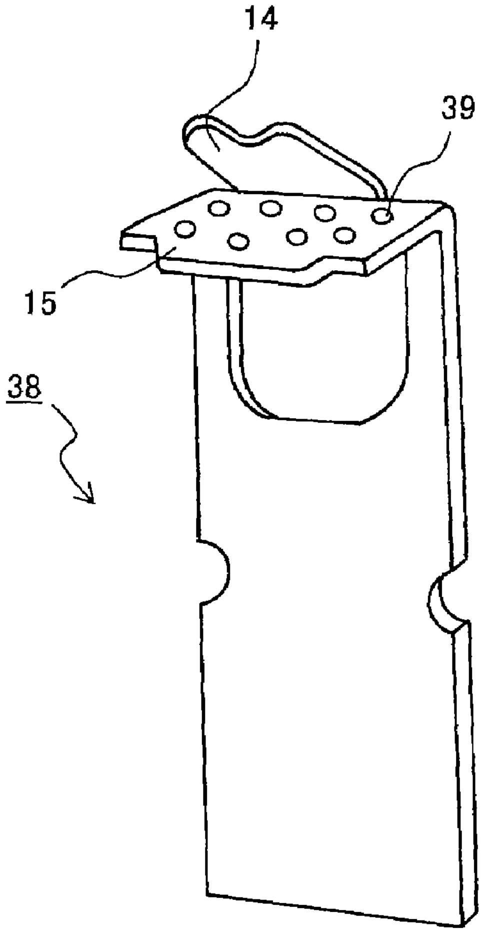
FIG. 7A is a diagram showing a connection member according to another embodiment.
Figure 7B:
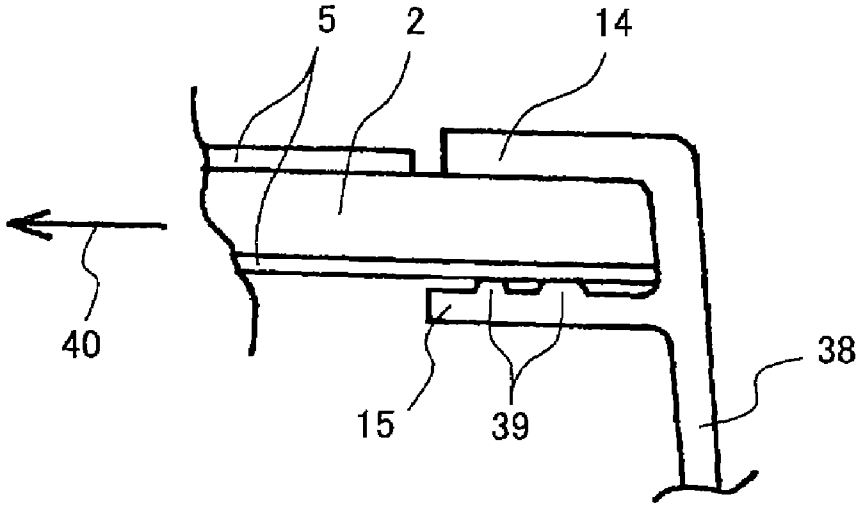
FIG. 7B is a diagram showing a state of the connection member shown in FIG. 7A having been connected to an electromechanical transducer element.
Figure 7C:
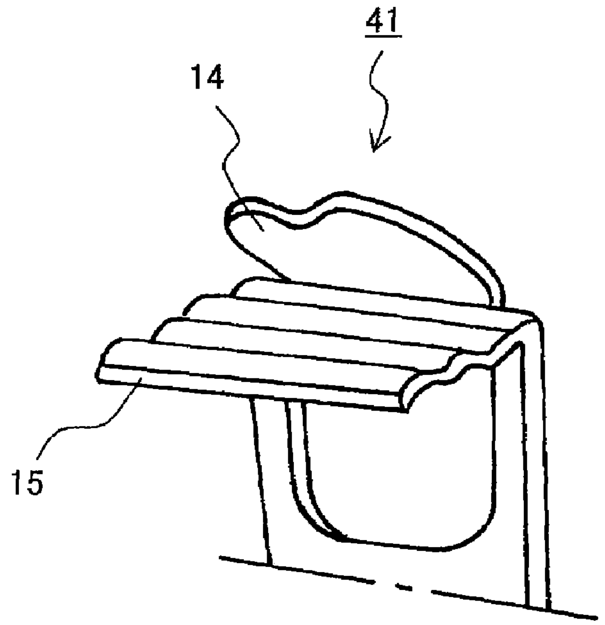
FIG. 7C is a diagram showing a connection member according to another embodiment.
Figure 7D:
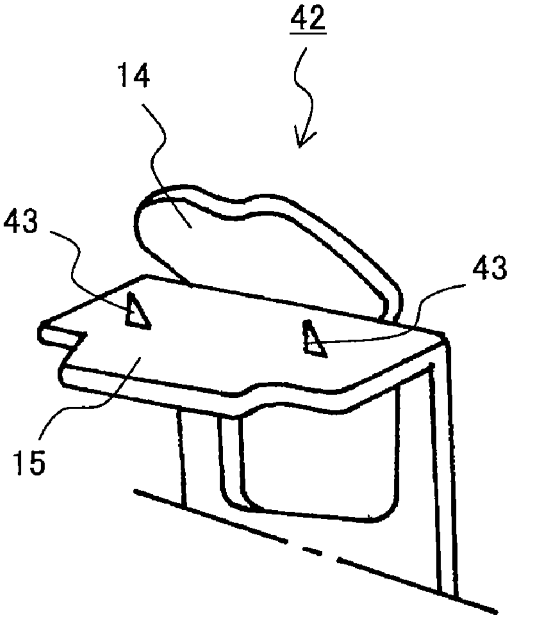
FIG. 7D is a diagram showing a connection member according to another embodiment.
Figure 7E:
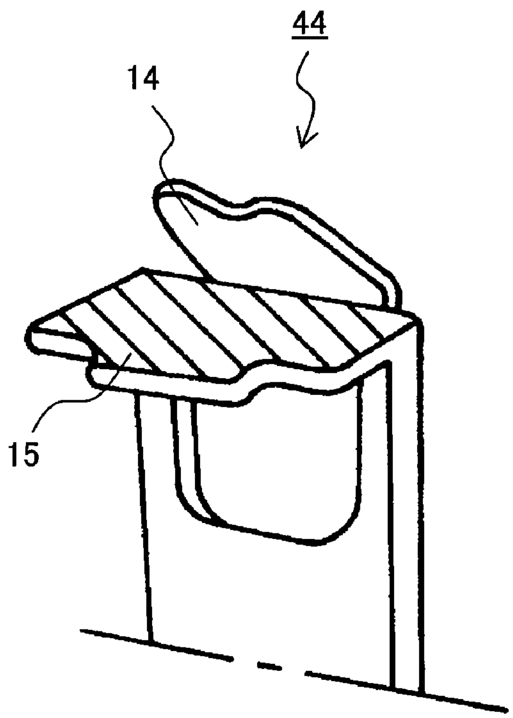
FIG. 7E is a diagram showing a connection member according to another embodiment.

FIGS. 7A through 7E are diagrams for describing an ultrasonic wave oscillator according to the seventh embodiment of the present invention. Note that the same component sign is attached to the same comprisal as one shown in FIG. 1 or FIGS. 2A through 2D. FIG. 7A is a diagram showing a connection member according to another embodiment; FIG. 7B is a diagram showing a state of the connection member shown in FIG. 7A having been connected to an electromechanical transducer element; and each of FIGS. 7C through 7E is a diagram showing a connection member according to yet another embodiment.

A connection member 38 shown in FIG. 7A is configured by bending a pressure application part 14 and an electrical connection part 15 mutually in the same direction as in the case of FIG. 6F, with a plurality of protuberances 39 being formed on a surface of the electrical connection part 15.

And the electrical connection part 15 pressure-contacts with an electrode layer 5 so that it contacts with the protuberances 39 as shown in FIG. 7B, thereby making the electrical connection part 15 contact with the electrode layer 5 in small areas and generating an extreme pressure stress in the contact part between the electrode layer 5 and protuberances 39.

This increases a normal force in the contact part of the protuberance 39 from the perspective of the electromechanical transducer element 2, thereby making it possible to prevent the electromechanical transducer element 2 from being displaced to a pull-out direction 40.

Meanwhile, a connection member 41 shown in FIG. 7C is configured in a manner that a pressure application part 14 and an electrical connection part 15 are bent mutually in the same direction as in the case of FIG. 6F, with a surface of the electrical connection part 15 being featured with an asperity part.

And the electrical connection part 15 pressure-contacts with an electrode layer 5 so that the projection parts of the asperity contacts with the electrode layer 5, thereby making the electrical connection part 15 contact with the electrode layer 5 in minute areas.

This configuration makes it hard to pull the electromechanical transducer element 2 out of the connection member 41 as in the case of the connection member 38 shown in FIG. 7A.

Meanwhile, a connection member 42 shown in FIG. 7D is configured in a manner that a pressure application part 14 and an electrical connection part 15 are bent mutually in the same direction as in the case of FIG. 6F, with a surface of the electrical connection part 15 being featured with sharp protuberance 43.

And the electrical connection part 15 pressure-contacts with an electrode layer 5 so that the tip parts of the sharp protuberances 43 bite into the electrode layer 5, thereby making the electrical connection part 15 contacts with the electrode layer 5 in minute areas.

This configuration makes it hard to pull the electromechanical transducer element 2 out of the connection member 42 as in the case of the connection member 38 shown in FIG. 7A.

Note that it is further possible to make the electromechanical transducer element 2 hard to be pulled out of the connection member 42 by making the tip parts of the sharp protuberance 43 plunge into the electromechanical transducer element 2 through the electrode layer 5.

Meanwhile, a connection member 44 shown in FIG. 7E is configured in a manner that a pressure application part 14 and an electrical connection part 15 are bent mutually in the same direction as in the case of FIG. 6F, with a surface of the electrical connection part 15 being roughly processed.

And the electrical connection part 15 pressure-contacts with an electrode layer 5 so that the roughly processed surface contacts with the electrode layer 5, thereby making the contact area size between the electrode layer 5 and electrical connection part 15 small.

This configuration makes it hard to pull the electromechanical transducer element 2 out of the connection member 44 as in the case of the connection member 38 shown in FIG. 7A.

Also, equipping a surface of the pressure application part 14 with the protuberance 39, sharp protuberance 43, et cetera, and making the pressure application part 14 pressure-contact with the electrode layer 5 or cutout part 6 so that the tip parts of the protuberance 39, sharp protuberance 43, et cetera, contact the electrode layer 5 or cutout part 6 make is possible to obtain a similar effect as in the case of the connection member 38 shown in FIG. 7A.

Also, equipping both of a surface of the pressure application part 14 and that of the electrical connection part 15 with the protuberance 39, sharp protuberance 43, et cetera, make it possible to obtain a similar effect as the connection member 38 shown in FIG. 7A.

It is possible to further improve a reliability relating to an electrical connection between the electrode layer 5 and electrical connection part 15 if a surface thereof is equipped with the protuberance 39, et cetera, as shown in FIG. 7, et cetera.

Eighth Embodiment

Figure 8A:
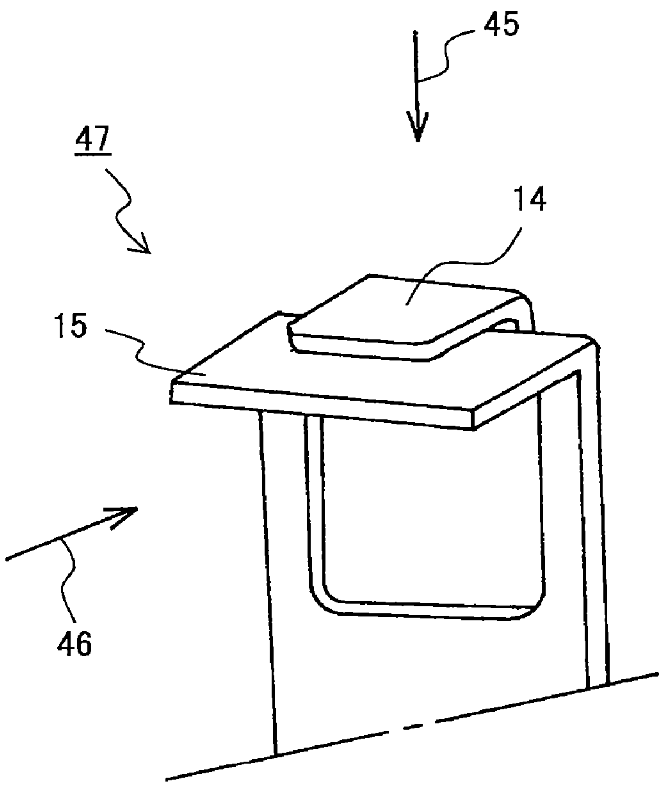
FIG. 8A is a diagram showing a connection member according to another embodiment.
Figure 8B:
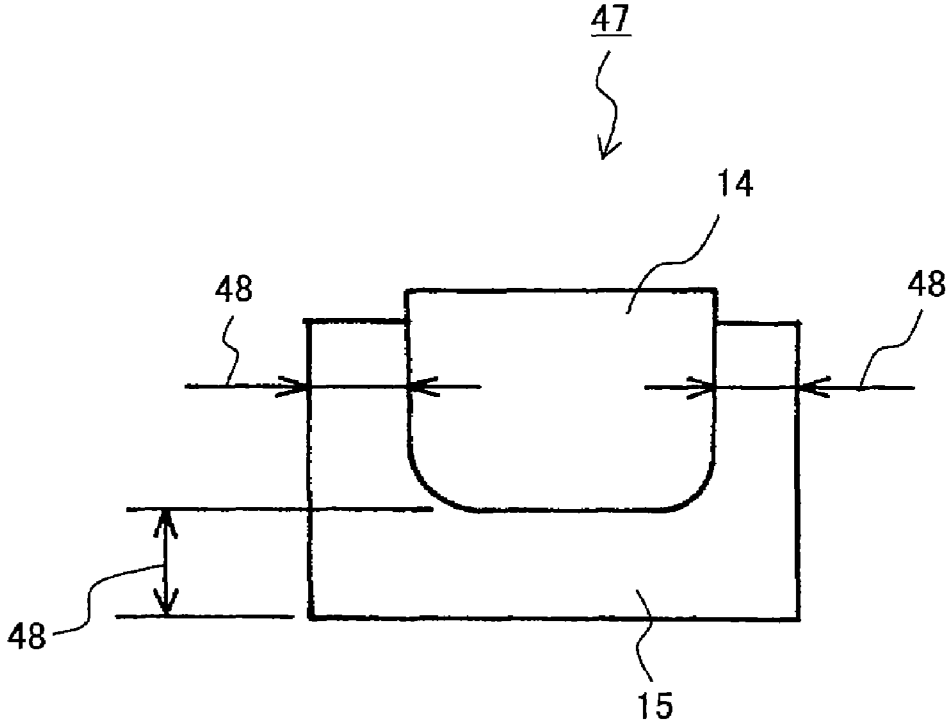
FIG. 8B is a diagram of a view from the direction of the arrow 45 shown in FIG. 8A.
Figure 8C:
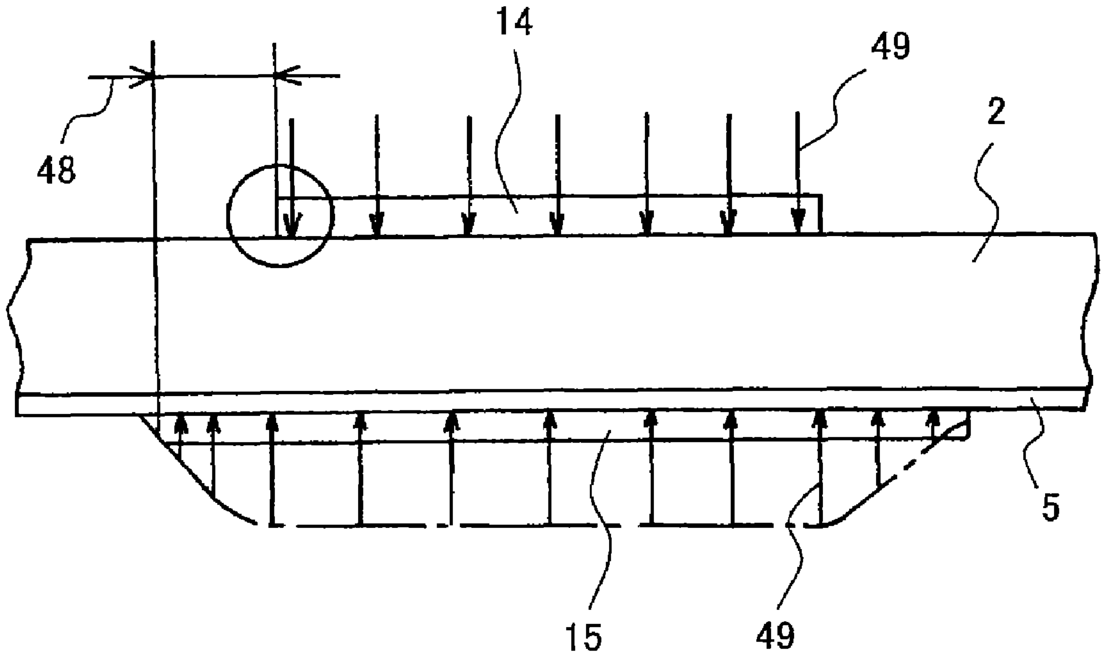
FIG. 8C is a diagram of a view of a state of, an electromechanical transducer element 2 being connected to the connection member shown in FIG. 8A, from the direction of the arrow 46 shown in FIG. 8A.
Figure 8D:
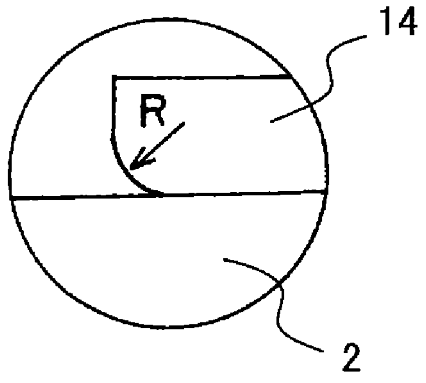
FIG. 8D is an enlarged drawing of the encircled area shown in FIG. 8C.

FIGS. 8A through 8D are diagrams for describing an ultrasonic wave oscillator according to the eighth embodiment of the present invention. Note that the same component sign is attached to the same comprisal as one shown in FIG. 1 or FIGS. 2A through 2D. FIG. 8A is a diagram showing a connection member according to another embodiment; FIG. 8B is a diagram of a view from the direction of the arrow 45 shown in FIG. 8A; FIG. 8C is a diagram of a view of a state, of an electromechanical transducer element 2 being connected to the connection member shown in FIG. 8A, from the direction of the arrow 46 shown in FIG. 8A. The arrows shown in FIG. 8C indicate pressure added to the electromechanical transducer element 2, with the lengths of the arrows indicate sizes of the applied pressure. FIG. 8D is an enlarged drawing of the encircled area shown in FIG. 8C.

A connection member 47 shown in FIG. 8A is configured in a manner that a pressure application part 14 and an electrical connection part 15 are bent mutually in the same direction as in the case of FIG. 6F, with the pressure application part 14 and electrical connection part 15 being respectively formed so that an area size for contacting with a cutout part 6 in the pressure application part 14 is smaller than that for contacting with an electrode layer 5 in the electrical connection part 15.

That is, the pressure application part 14 and electrical connection part 15 are respectively formed so that there is a gap 48 between an outer periphery of the pressure application part 14 and that of the electrical connection part 15 in a state of the connection member 47 at the time of connecting the connection member 47 to an electromechanical transducer element 2, as shown in FIG. 8B.

This configuration makes an applied pressure 49 at a position where the pressure application part 14 and electrical connection part 15 face with each other approximately in a uniform magnitude, while the applied pressure 49 in intervals 48 decreases gradually as a point moves toward the edges of the electrical connection part 15, because there is no pressure provided by the pressure application part 14, as shown in FIG. 8C.

Comparably, if an area size of the pressure application part 14 and that of the electrical connection part 15 are the same and if the respective edges of the pressure application part 14 and electrical connection part 15 meet when the two parts faces with each other, an applied pressure to the electromechanical transducer element 2 by the pressure application part 14 and electrical connection part 15 decreases drastically at a position where the pressure application part 14 and electrical connection part 15 no longer face with each other. Consequently, a stress given to the electrode layer 5 differs drastically between positions where the electrode layer 5 contacts with the electrical connection part 15 and where it does not, possibly resulting in shearing the electrode layer 5 at the border between the two positions.

Comparably, in the case of making the area size of the pressure application part 14 smaller than that of the electrical connection part 15, the applied pressure 49 gradually decreases as it goes from the edge of the pressure application part 14 to that of the electrical connection part 15, gradually decreasing a stress given to the electrode layer 5 accordingly, thereby obtaining a benefit of preventing a shearing of the electrode layer 5 caused by a drastic difference of stress.

Also, an application of a radius process at the edge of the pressure application part 14 provides a benefit of lessening a difference in stress close to the edge of the pressure application part 14 as shown in FIG. 8D. Incidentally, a radius process may be applied to an edge of the electrical connection part 15. This makes it possible to lessen a difference in stress in the neighborhood of the edge of the electrical connection part 15.

Ninth Embodiment

Figure 9A:
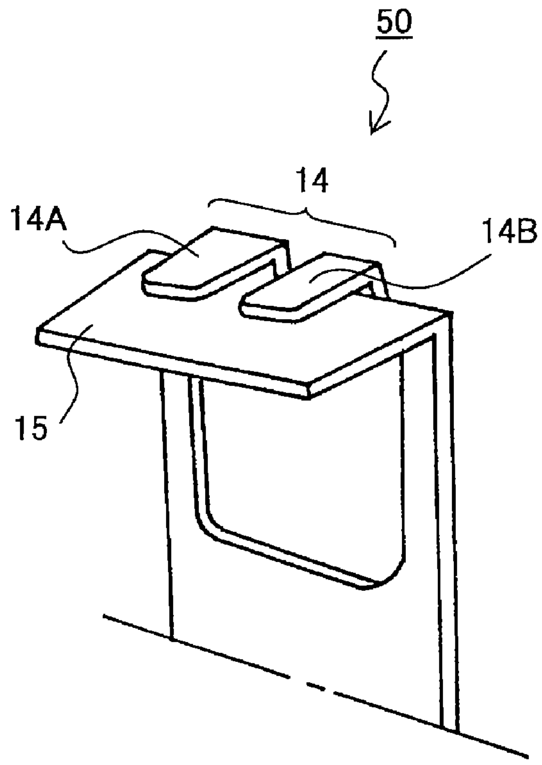
FIG. 9A is a diagram showing a connection member according to another embodiment.
Figure 9B:
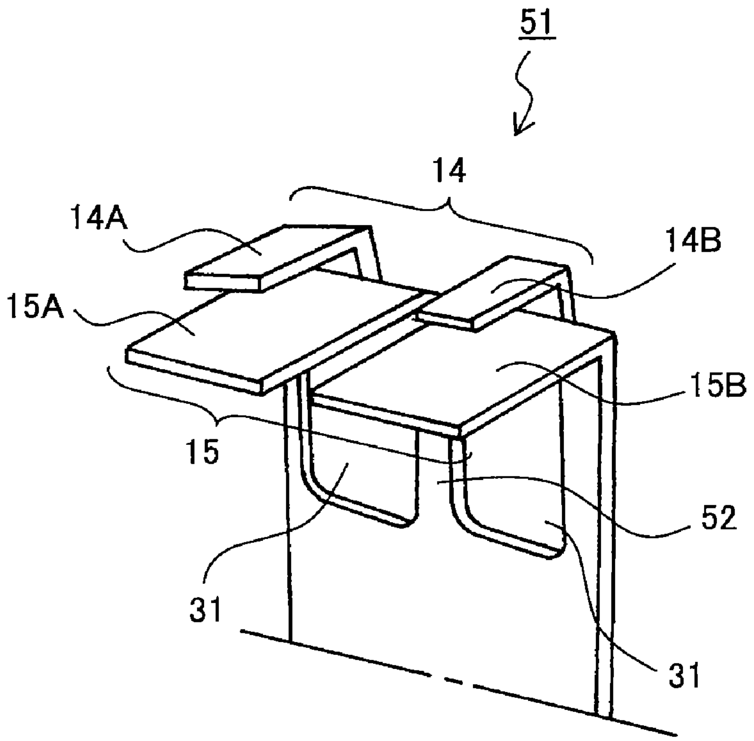
FIG. 9B is a diagram showing a connection member according to yet another embodiment.
Figure 9C:
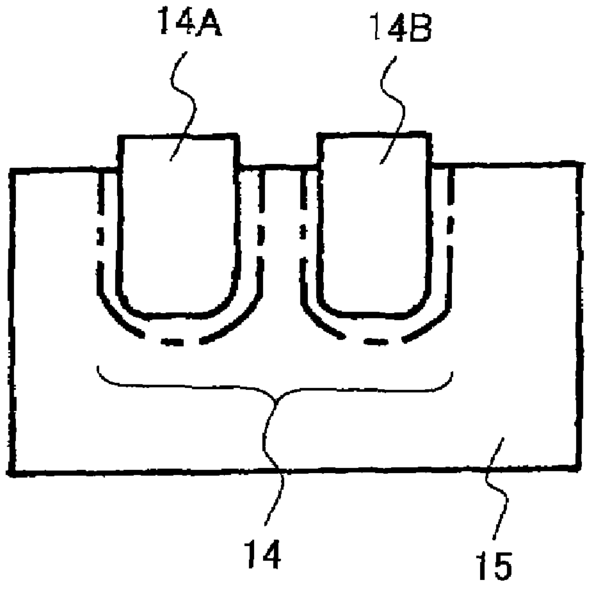
FIG. 9C is a diagram showing an upper view of the connection member shown in FIG. 9A.
Figure 9D:
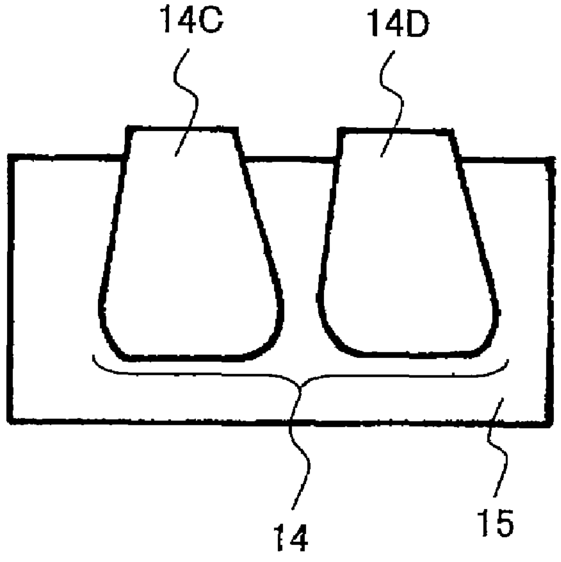
FIG. 9D is a diagram showing a connection member according to yet another embodiment, which is viewed from above.

FIGS. 9A through 9D are diagrams for describing an ultrasonic wave oscillator according to the ninth embodiment of the present invention. Note that the same component sign is attached to the same comprisal as one shown in FIG. 1 or FIGS. 2A through 2D. FIG. 9A is a diagram showing a connection member according to another embodiment; FIG. 9B is a diagram showing a connection member according to yet another embodiment; FIG. 9C is a diagram showing an upper view of the connection member shown in FIG. 9A; and FIG. 9D is a diagram showing a connection member according to yet another embodiment, which is viewed from above.

A connection member 50 shown in FIG. 9A is configured in a manner that a pressure application part 14 and an electrical connection part 15 are bent mutually in the same direction as in the case of FIG. 6F, with a through groove being featured from the end to root in the neighborhood of the center of the pressure application part 14, resulting in dividing it into pressure application parts 14A and 14B.

This configuration makes it possible to apply stresses independently by the pressure application parts 14A and 14B to a cutout part 6 of an electromechanical transducer element 2.

Also, a connection member 51 shown in FIG. 9B is configured in a manner that a pressure application part 14 and an electrical connection part 15 are bent mutually in the same direction, with the pressure application part 14 being featured to be divided into pressure application parts 14A and 14B, and also a through groove being featured from the end to root in the neighborhood of the center of the electrical connection part 15, resulting in dividing it into electrical connection parts 15A and 15B.

This configuration makes it possible to apply a stress to the cutout part 6 for example independently by the pressure application parts 14A and 14B and also a stress to the electrode layer 5 independently the electrical connection parts 15A and 15B.

A periphery of the pressure application part 14 (i.e., the chain line shown in FIG. 9C) and that of the electrical connection part 15 featured with the grooves as described above can be made longer than a periphery of the pressure application part 14 and that of the electrical connection part 15 shown in FIG. 8A.

This configuration makes it possible to increase a deformation amount of the cutout part 6 in the neighborhood of the periphery of the pressure application part 14 and that of the electrode layer 5 in the neighborhood of the periphery of the electrical connection part 15, and suppress a displacement of the electromechanical transducer element 2 when the connection member 50 or 51 is connected thereto.

Also, if the pressure application part 14 and electrical connection part 15 are featured with the respective grooves as shown in FIG. 9B, a similar effect as the case of using a plurality of connection members 47 as shown in FIG. 8A can be obtained, thus enabling an improvement of a reliability relating to an electrical connection of the electromechanical transducer element 2 to the connection member 51.

Meanwhile, the connection member 50 or 51 is especially effective for a mechanically soft electromechanical transducer element such as a composite piezoelectric body, et cetera, which tends to deform under a pressure.

Note that the pressure application parts 14A and 14B shown in FIG. 9A may be formed to be a fan shape as pressure application parts 14C and 14D shown in FIG. 9D as a method for further elongating a periphery of the pressure application part 14 or that of the electrical connection part 15.

This configuration makes it possible to elongate a periphery of a pressure application part 14 as compared to the pressure application part 14 shown in FIG. 9A.

Also, a column 52 may be equipped at the center of the hole 31 as shown in FIG. 9B.

Tenth Embodiment

Figure 10A:
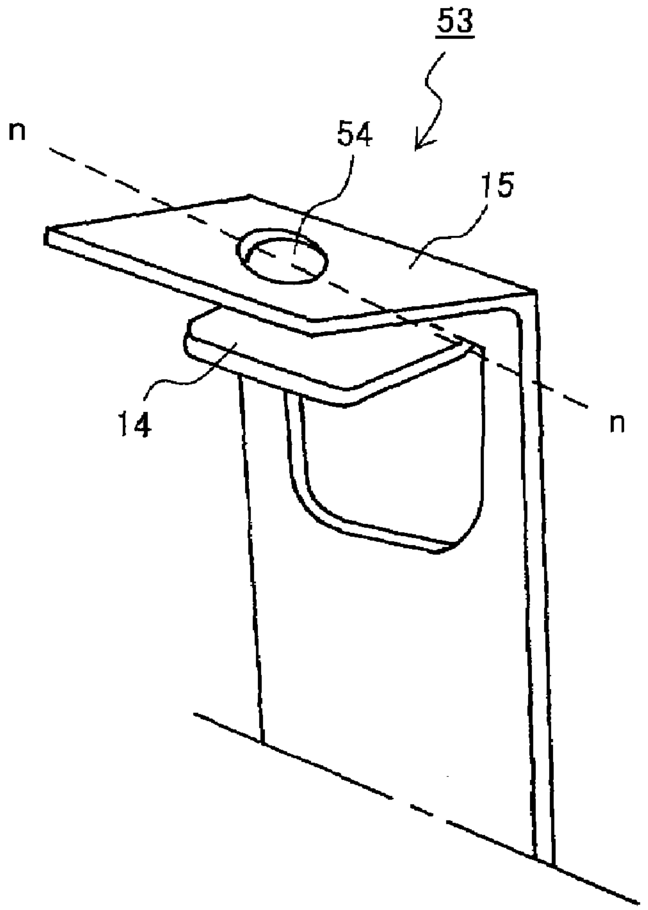
FIG. 10A is a diagram showing a connection member according to another embodiment.
Figure 10B:
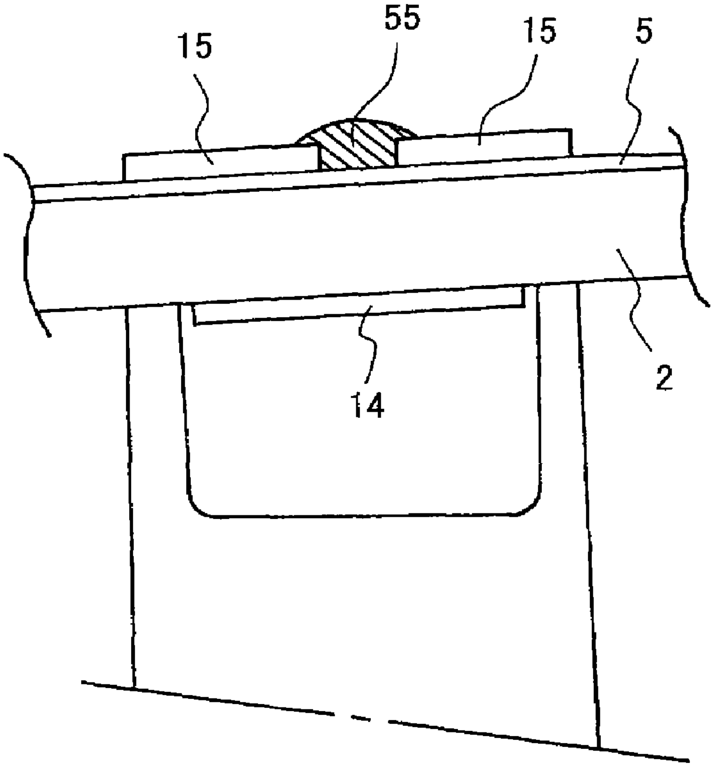
FIG. 10B shows a diagram of the n-n cross-sectional diagram shown in FIG. 10A.

FIGS. 10A and 10B are diagrams for describing an ultrasonic wave oscillator according to the tenth embodiment of the present invention. Note that the same component sign is attached to the same comprisal as one shown in FIG. 1 or FIGS. 2A through 2D. FIG. 10A is a diagram showing a connection member according to another embodiment; and FIG. 10B shows a diagram of the n-n cross-sectional diagram shown in FIG. 10A after the connection member shown in FIG. 10 is connected to an electromechanical transducer element.

A connection member 53 shown in FIG. 10A is configured in a manner that pressure application part 14 and an electrical connection part 15 are bent mutually in the opposite directions as in the case of FIG. 6C, with the electrical connection part 15 being featured with an auxiliary hole 54 in the neighborhood of the center of the electrical connection part 15. Incidentally, the assumption here is the entire surface of the connection member 53 is applied by a plating of Ni—Cr—Au, et cetera.

And the connection member 53 is connected to the electromechanical transducer element 2, followed by electrically connecting the connection member 53 to the electromechanical transducer element 2 by pouring a molten soldering 55 into the auxiliary hole 54 as shown in FIG. 10B.

The configuration of pouring a molten soldering 55 into the auxiliary hole 54 equipped in the electrical connection part 15 makes it possible to prevent the soldering 55 from flowing to the outside as a result of it staying within the auxiliary hole 54.

By this, an outer shape of the connection part between the electrode layer 5 and electrical connection part 15 is no longer changed by the soldering 55 and there is no longer a need to consider for a protrusion of the soldering 55. It is therefore possible to miniaturize the connecting part between the electromechanical transducer element 2 and connection member 53 as compared to a case of connecting it to the electromechanical transducer element 2 by considering a protruding part of a soldering 55.

And a benefit of the soldering 55 holding the electrode layer 5 and electrical connection part 15 mechanically, that is, an anchor effect, can be expected.

As for an electrical connection between the electrode layer 5 and electrical connection part 15, a connection by a pressure contact and that by the soldering 55 are simultaneously performed, and therefore a reliability relating to the electrical connection can be improved.

Note that the auxiliary hole 54 can be filled with a conductive adhesive, et cetera, in lieu of being limited to the soldering 55.

The pressure application part 14 may be connected to the cutout part 6 by featuring an auxiliary hole 54 in the pressure application part 14 and filling the auxiliary hole 54 with a soldering 55 or conduction adhesive, et cetera.

This configuration enables an improvement of a reliability relating to the mechanical connection between the pressure application part 14 and cutout part 6 as compared to a case of connecting only by a pressure contact.

Eleventh Embodiment

Figure 11A:
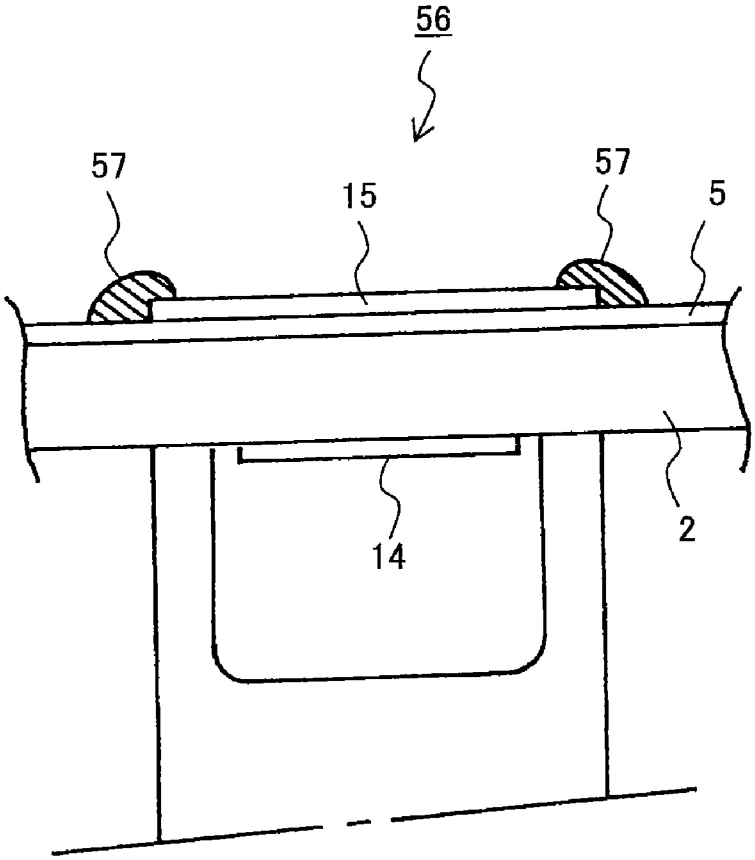
FIG. 11A is a diagram showing an enlargement of a part of an ultrasonic wave oscillator.
Figure 11B:
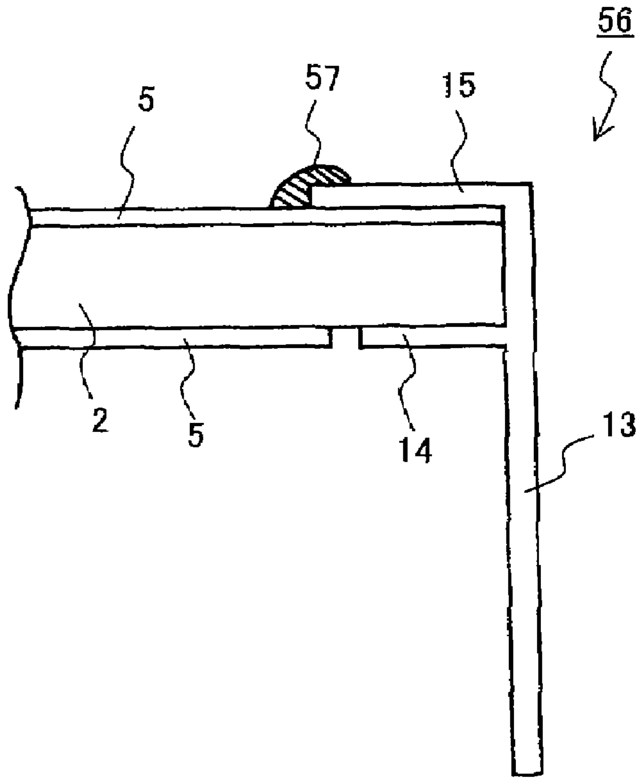
FIG. 11B shows a diagram of a cross-section in the center part of the ultrasonic wave oscillator shown in FIG. 11A.

FIGS. 11A and 11B are diagrams for describing an ultrasonic wave oscillator according to the eleventh embodiment of the present invention. Note that the same component sign is attached to the same comprisal as one shown in FIG. 1 or FIGS. 2A through 2D. FIG. 11A is a diagram showing an enlargement of a part of an ultrasonic wave oscillator; and FIG. 11B shows a diagram of a cross-section in the center part of the ultrasonic wave oscillator shown in FIG. 11A.

The ultrasonic wave oscillator 56 shown by FIGS. 11A and 11B is configured in a manner that a gap between an electrode layer 5 and an electrical connection part 15 is covered with a protection member 57 constituted by an organic resin such as an adhesive.

Since the gap between the electrode layer 5 and electrical connection part 15 are covered with the protection member 57, protecting the border part between the electrode layer 5 and electrical connection part 15, thereby making it possible to prevent a foreign material such as dust from invading between the electrode layer 5 and electrical connection part 15.

This can stabilize a contact state between the electrode layer 5 and electrical connection part 15, and therefore improve a reliability relating to the electrical connection between the electromechanical transducer element 2 and connection member 13.

Also, strength of the connection between the electrode layer 5 and electrical connection part 15 can be improved by the protection member 57.

Note that the gap between the pressure application part 14 and cutout part 6 may be covered with the protection member 57.

This configuration is capable of stabilizing the connection state between the pressure application part 14 and cutout part 6.

Twelfth Embodiment

Figure 12:
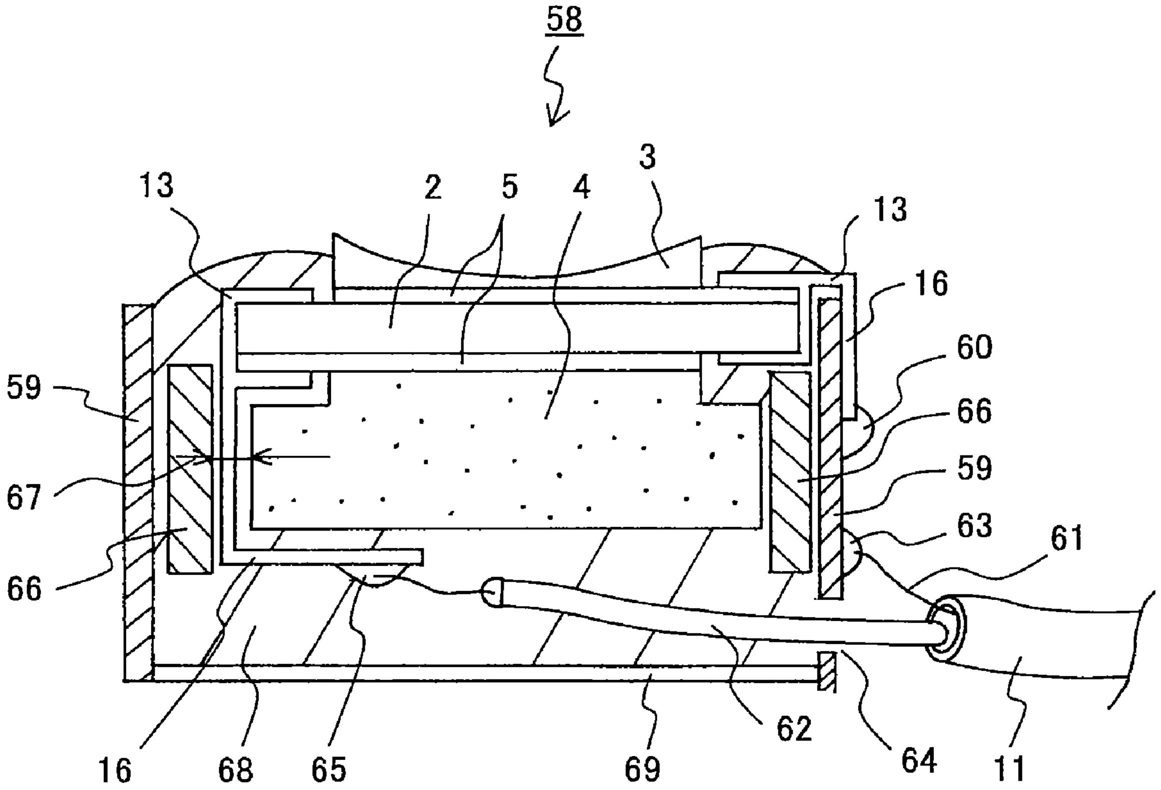
FIG. 12 is a diagram for describing an ultrasonic wave oscillator according to another embodiment.

FIG. 12 is a diagram for describing an ultrasonic wave oscillator according to the twelfth embodiment of the present invention. Note that the same component sign is attached to the same comprisal as one shown in FIG. 1 or FIGS. 2A through 2D.

As shown in FIG. 12, an ultrasonic wave oscillator 58 is configured in a manner that connection members 13 are respectively connected to electrode layers 5 which are equipped on the top and bottom surfaces of the electromechanical transducer element 2, that an acoustic matching layer 3 is fixed onto a sound wave emission face of the electromechanical transducer element 2 and also that a backing material 4 is fixed onto the opposite surface thereof.

And, the electromechanical transducer element 2, acoustic matching member 3, backing material 4, electrode layer 5 and connection members 13 are all fixed in the inside of a metallic housing 59; a lead part 16 of a connection member 13, which is connected to the electrode layer 5 on the side of the acoustic matching member 3, is drawn to the outside of the housing 59; and the lead part 16 is electrically connected to a side surface on the outside of the housing 59 by a soldering 60.

A lead wire 11 comprises a GND wire 61 and a signal wire 62 for transmitting an ultrasonic wave to the electromechanical transducer element 2, with the GND wire 61 being electrically connected to the side surface on the outside of the housing 59 directly by a soldering 63. And the signal wire 62 is led through a side hole 64 which is featured in the side face of the housing 59 and is electrically connected to the lead part 16 of the connection member 13 which is connected to the electrode layer 5 on the side of the backing material 4 in the inside of the housing 59 by a soldering 65.

A ring shaped collar member 66 is equipped along the inner circumference of the housing 59 in order to insulate the connection member 13 connected to the electrode layer 5 on the side of the backing material 4 from the housing 59.

The lead part 16 of the connection member 13 connected to the signal wire 62 is led through a space 67 between the backing material 4 and collar member 66, and placed under the backing material 4.

And the housing 59 is connected to the collar member 66 by an adhesive, et cetera.

Upon completing the connection between the connection member 13 and lead wire 11, the necessary areas, such as electromechanical transducer element 2, acoustic matching member 3, backing material 4, electrode layer 5, connection members 13, signal wire 62, collar member 66, et cetera, are covered with a resin 68, followed by placing a cover 69 on the bottom of the housing 59 and fixing the internal circumferential edge at the bottom of the housing 59 and the peripheral edge of the cover 69 with an adhesive, et cetera.

As described above, since a connection member 13 is electrically connected to the GND wire 61 by way of the housing 59, a freedom of the connection member 13 and GND wire 61 for a connecting position is improved, hence making it possible to connect the connection member 13 to the housing 59 in a place where a wiring work is easy to be carried out and also likewise the housing 59 and GND wire 61. This makes it possible to simplify a wiring work.

Also, a reliability relating to an electrical connection between the connection member 13 and GND wire 61 is improved since the connection member 13 is electrically connected to the GND wire 61 by way of the housing 59.

Also, a process time for a wiring work can be reduced since the connection member 13 is electrically connected to the GND wire 61 by way of the housing 59, thereby eliminating a work for making the housing 59 at the same potential as the GND wire 61.

Thirteenth Embodiment

Figure 13A:
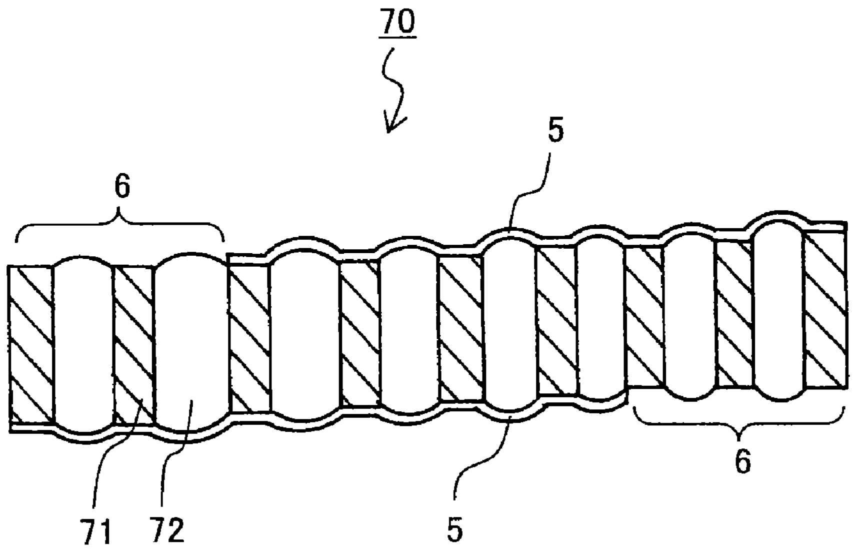
FIG. 13A is a diagram showing a cross-section of a composite piezoelectric element.
Figure 13B:
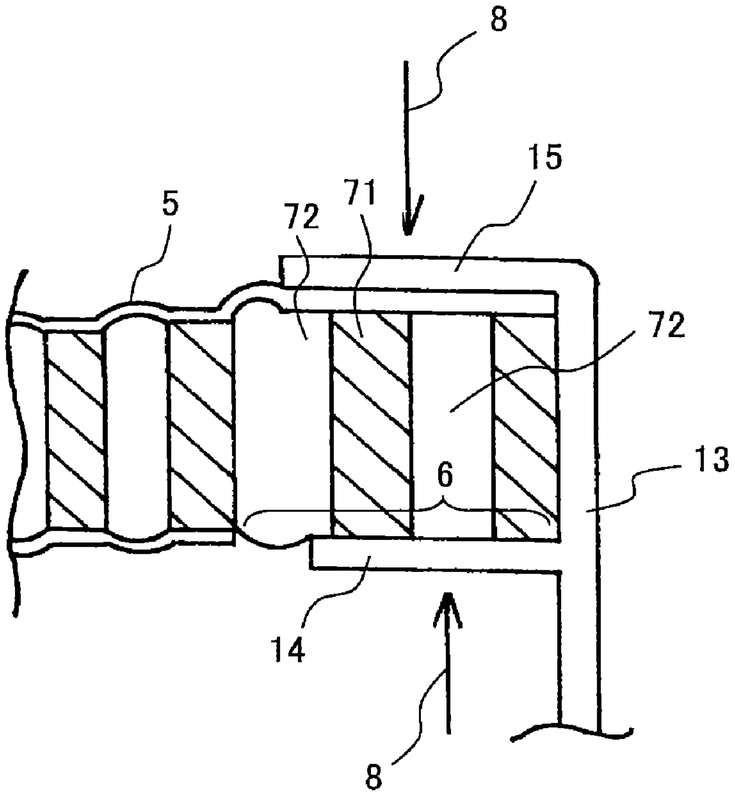
FIG. 13B is a diagram showing a state of a connection member having been connected to the composite piezoelectric element shown in FIG. 13A.
Figure 13C:
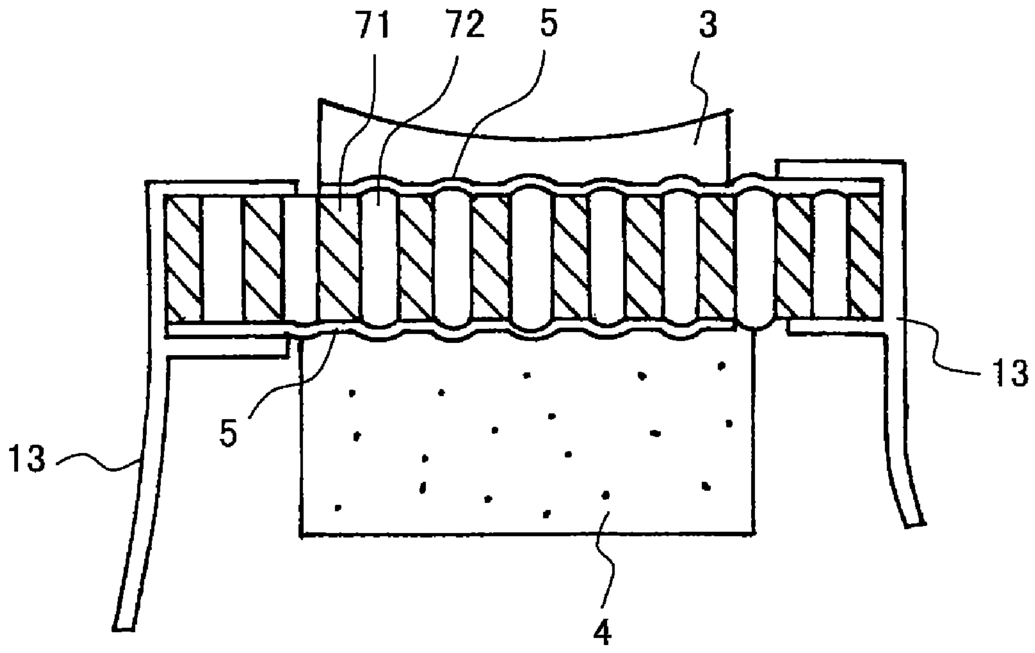
FIG. 13C is a diagram showing an ultrasonic wave oscillator using the composite piezoelectric element shown in FIG. 13A.

FIGS. 13A through 13C are diagrams for describing an ultrasonic wave oscillator according to the thirteenth embodiment of the present invention. Note that the same component sign is attached to the same comprisal as one shown in FIG. 1 or FIGS. 2A through 2D. FIG. 13A is a diagram showing a cross-section of a composite piezoelectric element; FIG. 13B is a diagram showing a state of a connection member having been connected to the composite piezoelectric element shown in FIG. 13A; and FIG. 13C is a diagram showing an ultrasonic wave oscillator using the composite piezoelectric element shown in FIG. 13A.

A composite piezoelectric element 70 shown in FIG. 13A is configured by placing electrode layers 5 respectively on both surfaces of a plate member formed by a plurality of columnar ceramic piezoelectric bodies 71 being individually enclosed by resin 72.

And the composite piezoelectric element 70 shown in FIG. 13A is formed in a manner that the total thickness of the resin 72 and electrode layer 5 is larger than that of the columnar ceramic piezoelectric bodies 71 and electrode layer 5.

And the top and bottom surfaces of the composite piezoelectric element 70 shown in FIG. 13A are respectively featured with cutout parts 6.

As shown in FIG. 13B, the pressure application part 14 and electrical connection part 15 of a connection member 13 are elastically deformed respectively, the pressure application part 14 pressure-contacts with the cutout part 6 and the electrical connection part 15 pressure-contacts with the electrode layer 5, thereby deforming the resin 72 in the opposite directions 8 under pressure and connecting the connection member 13 to the composite piezoelectric element 70 electrically.

Then, the composite piezoelectric element 70 is connected to the connection members 13, followed by fixing an acoustic matching member 3 and a backing material 4 to the composite piezoelectric element 70 by the an adhesive, et cetera for making an ultrasonic wave oscillator as shown in FIG. 13C.

An elastic deformation of the connection members 13 is continued until a pressure is applied to the columnar ceramic piezoelectric bodies 71 directly in the opposite directions 8. In an initial state (i.e., a state of the composite piezoelectric element 70 having not been connected to the connection member 13), the electrode layer 5 on either side of the resin 72 is protruded than one on either side of the columnar ceramic piezoelectric bodies 71. Then, as the protruded part is sandwiched by the connection members 13, the resin 72 is deformed under pressure, resulting in a residual stress remaining within the resin 72.

As described above, the connection of the connection member 13 to the composite piezoelectric element 70 leaves a residual stress of compression within the resin 72, increasing a strength of the connection between the electrode layer 5 of the composite piezoelectric element 70 and the electrical connection part 15 of the connection member 13 due to the residual stress, thereby enabling the electrode layer 5 to be constantly contacted with the electrical connection part 15.

This configuration enables an improvement of a reliability relating to the electrical connection between the electrode layer 5 and electrical connection part 15.

Fourteenth Embodiment

The next is a description on an ultrasonic wave oscillator according to a fourteenth embodiment of the present invention.

A characteristic of the fourteenth embodiment lies where a connection member is made of a shape memory alloy.

For example, let it be considered a case of raising a temperature of a connection member per se, which is made of a shape memory alloy, by heating it and having it memorize a shape in a state (noted as "open state" hereinafter) of a pressure application part being apart from an electrical connection part, followed by lowering the temperature of the connection member per se to an ambient temperature for making it memorize a shape in a state (noted as "closed state" hereinafter) of the pressure application part being close to the electrical connection part.

Then, in the case of connecting an electromechanical transducer element to the connection member thusly memorizing the shape, the first is to heat the connection member to become an open state, followed by placing the electromechanical transducer element between the pressure application part and electrical connection part of the connection member in the open state. Next is to lower the temperature of the connection member itself to the ambient temperature in the close state so as to connect it to the electromechanical transducer element electrically and mechanically. Note that a heating method for the connection member is discretionary, such as an electric furnace, an infrared, or et cetera.

As described above, a use of a connection member made of a shape memory alloy enables a connection of the connection member to an electromechanical transducer element without using a jig, et cetera.

This configuration makes it possible to apply an external force by a non-contact method for connecting the connection member to electromechanical transducer element, thereby enabling a prevention of a contamination due to a contact between a jig and the electromechanical transducer element or connection member.

Also enabled is a connection of the connection member to the electromechanical transducer element only by a temperature control of the connection member, thus making it possible to connect the connection member to the electromechanical transducer element simply without requiring a specific pressure application apparatus.

Fifteenth Embodiment

Figure 14A:
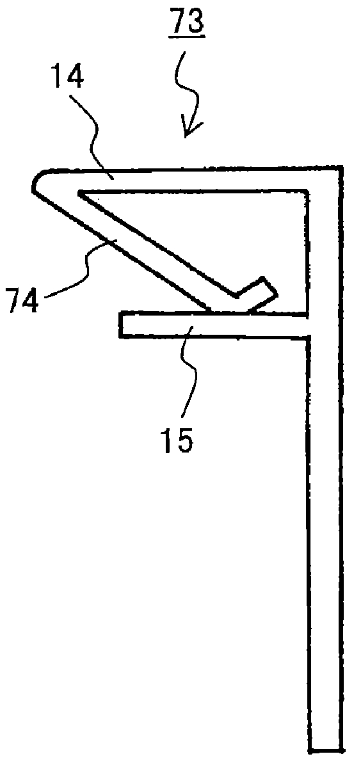
FIG. 14A is a diagram showing a connection member according to another embodiment.
Figure 14B:
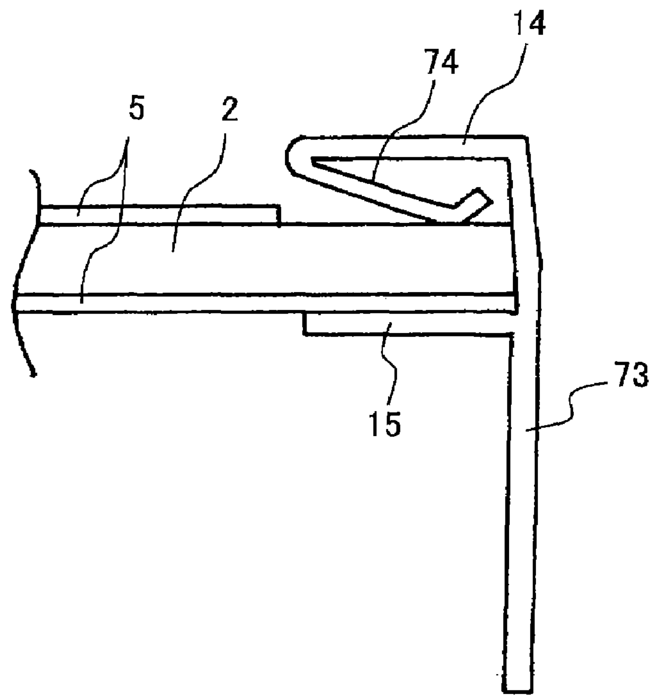
FIG. 14B is a diagram showing a state of the connection member shown in FIG. 14A having been connected to an electromechanical transducer element.
Figure 14C:
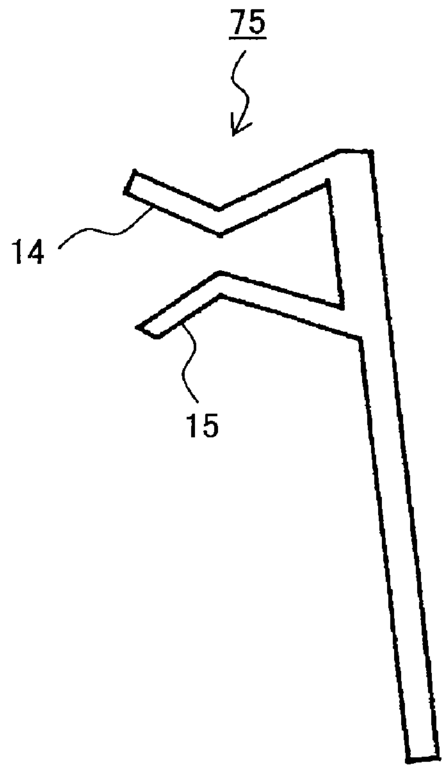
FIG. 14C is a diagram showing a connection member according to yet another embodiment.
Figure 14D:
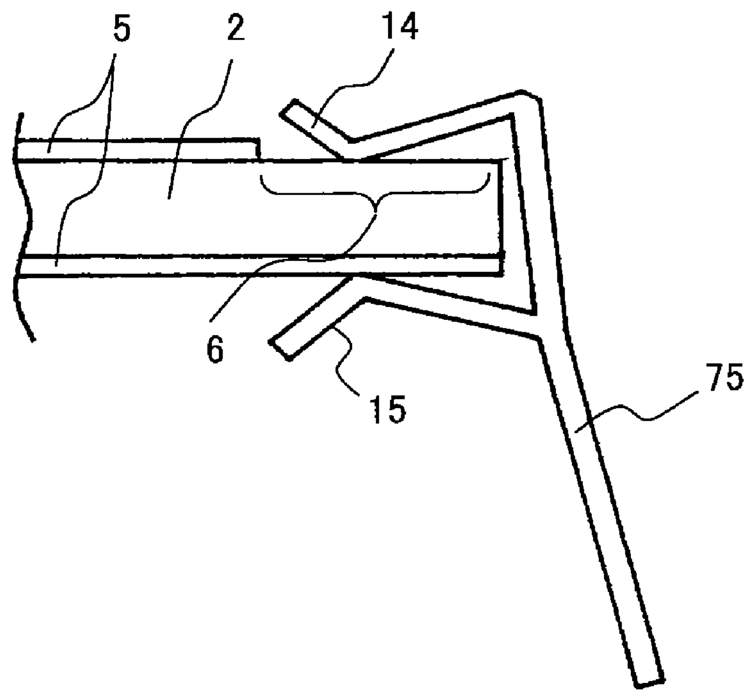
FIG. 14D is a diagram showing a state of the connection member shown in FIG. 14C having been connected to an electromechanical transducer element.

FIGS. 14A through 14D are diagrams for describing an ultrasonic wave oscillator according to the fifteenth embodiment of the present invention. Note that the same component sign is attached to the same comprisal as one shown in FIG. 1 or FIGS. 2A through 2D. FIG. 14A is a diagram showing a connection member according to another embodiment; FIG. 14B is a diagram showing a state of the connection member shown in FIG. 14A having been connected to an electromechanical transducer element; FIG. 14C is a diagram showing a connection member according to yet another embodiment; and FIG. 14D is a diagram showing a state of the connection member shown in FIG. 14C having been connected to an electromechanical transducer element.

A connection member 73 shown in FIG. 14A is configured to equip a fold back part 74 in a form of a "reverse check mark" at the end a pressure application part 14. The fold back part 74 possesses an outward elastic force in a normal state (i.e., when the connection member 73 is not in contact with an electromechanical transducer element 2). Therefore, the fold back part 74 normally applies a pressure to the electrical connection part 15.

Then, when pushing the electromechanical transducer element 2 in between the fold back part 74 and electrical connection part 15, the pressure application part 14 and fold back part 74 elastically deform so as to make the electromechanical transducer element 2 press the electrical connection part 15 as shown in FIG. 14B.

This pressing force as a result of the electromechanical transducer element 2 pressing the electrical connection part 15 enables an electrical connection of the electrode layer 5 to the electrical connection part 15.

Meanwhile, a connection member 75 shown in FIG. 14C is configured to form a pressure application part 14 and an electrical connection part 15 in a "check mark" and an "inverted check mark", respectively. The connection member 75 is also configured in a manner that the pressure application part 14 and electrical connection part 15 are respectively formed mutually equally in axisymmetry in a normal state (i.e., when the connection member 75 is not in contact with an electromechanical transducer element 2).

Then, when pushing the electromechanical transducer element 2 in between the pressure application part 14 and electrical connection part 15, the both parts elastically deform respectively as shown in FIG. 14D.

By this, the pressure application part 14 presses the cutout part 6 and also the electrical connection part 15 presses the electrode layer 5 and therefore the pressing force enables an electrical connection between the electrode layer 5 and electrical connection part 15.

As described above, since the electrical connection part 15 is electrically connected to the electrode layer 5 by the connection member 73 itself or connection member 75 itself deforming elastically, an apparatus for applying pressure as in the conventional technique is no longer required.

It is possible to simplify a connecting work and improve a reliability relating to the electrical connection because an applied pressure is constantly given from the connection member 73 or 75 to the electromechanical transducer element 2 by an elastic deformation of the connection member 73 or 75 in the state of connecting the connection member 73 or 75 to the electromechanical transducer element 2, thus maintaining a stable electrical connection.

Sixteenth Embodiment

FIGS. 15A through 15D are diagrams for describing a production method for an ultrasonic wave oscillator according to the above described embodiments. Note that the same component sign is attached to the same comprisal as one shown in FIG. 1 or FIGS. 2A through 2D. FIGS. 15A through 15D are diagrams describing an assembly process of the ultrasonic wave oscillator 2 and connection member 13 (which is in a state of no protuberance 19) according to the second embodiment.

Figure 15A:
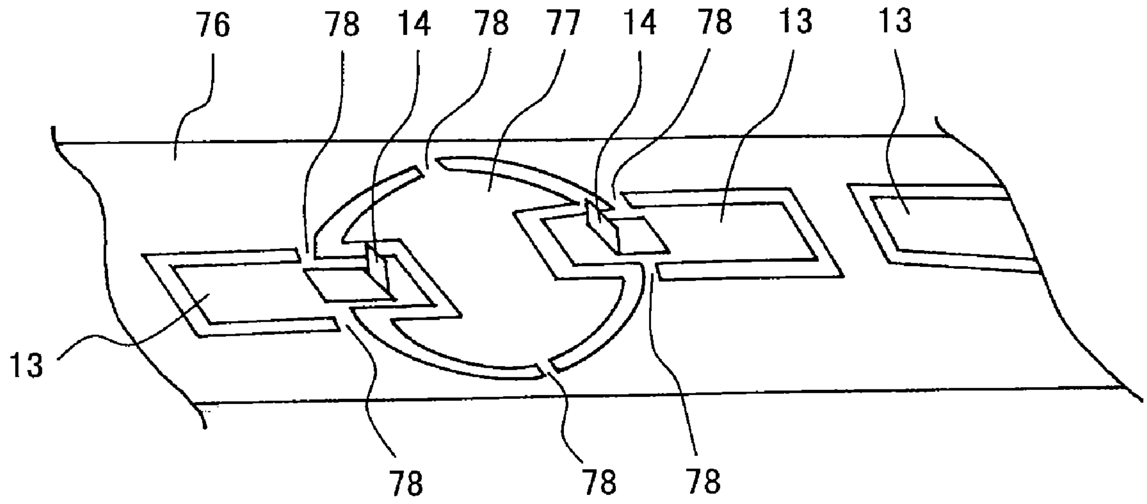
FIG. 15A is a diagram for describing a production method for an ultrasonic wave oscillator.

As shown in FIG. 15A, the first is to make an element placement unit 77 for placing the connection member 13 and electromechanical transducer element 2 by applying a blanking process (i.e., a press) to a band of metallic thin plate 76 (e.g., thickness of 0.1 mm). Incidentally, the assumption here is that the process arranges three components, i.e., the connection member 13, element placement unit 77 and connection member 13, in this order as a set, which are formed in the aforementioned sequence. Also assumed here is that the connection member 13 and element placement unit 77 are connected with the metallic thin plate 76 at the connection part 78.

Figure 15B:
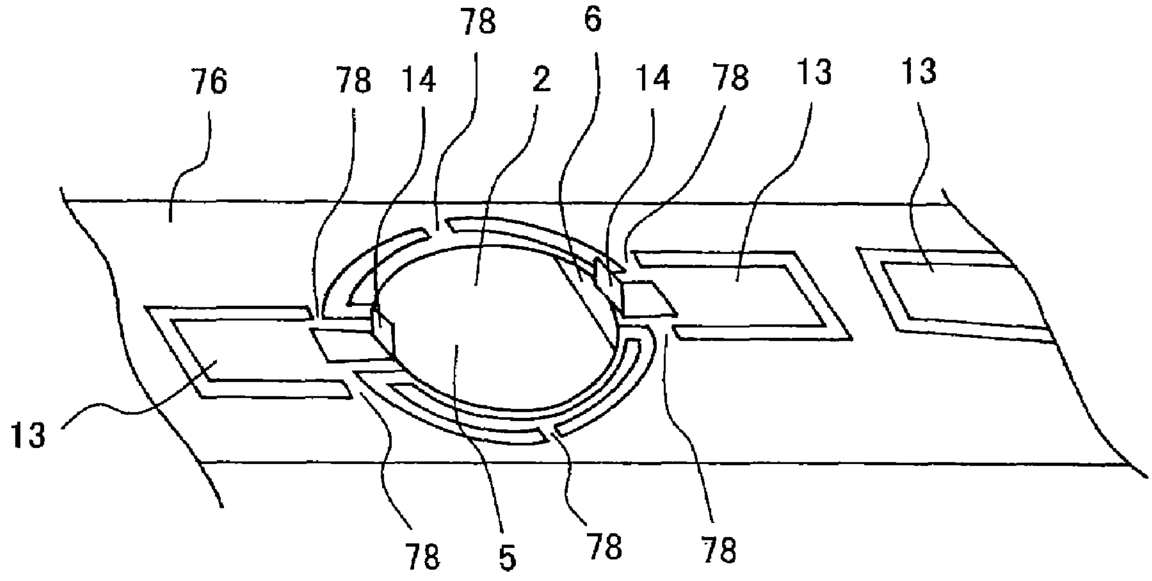
FIG. 15B is a diagram for describing a production method for an ultrasonic wave oscillator.

As shown in FIG. 15B, the next is to individually bend each pressure application part 14 vertically so that a position of the cutout part 6 of the electromechanical transducer element 2 matches with a position of the pressure application part 14 of the connection member 13 on one side and also a position of the cutout part 6 on the opposite side matches with a position of the electrical connection part 15 of the connection member 13 on the other side, and accordingly place the electromechanical transducer element 2 on the element placement unit 77 automatically.

Figure 15C:
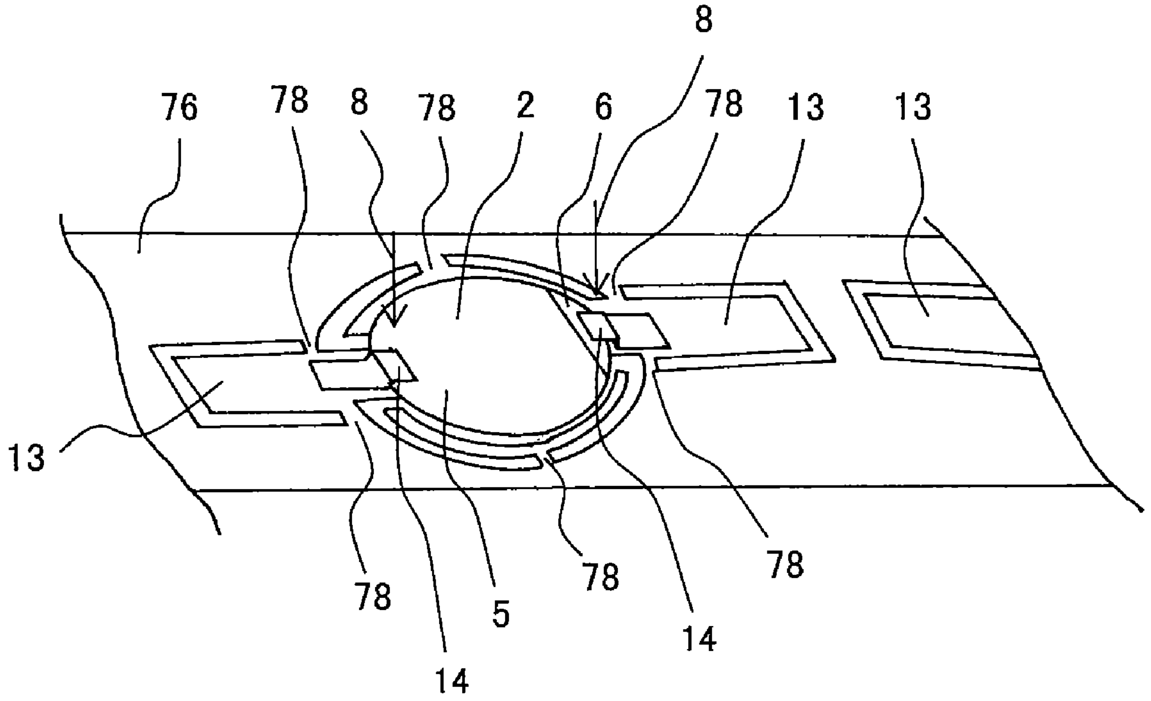
FIG. 15C is a diagram for describing a production method for an ultrasonic wave oscillator.

The next is to bend each pressure application part 14 in the opposite directions 8 by bending means (not shown herein), make the electrode layer 5 of the electromechanical transducer element 2 pressure-contact with the electrical connection part 15 of the connection member 13 on the one side and make the electrode layer 5 of the electromechanical transducer element 2 pressure-contact with the pressure application part 14 of the connection member 13 on the other side, thereby connecting the connection member 13 to the electromechanical transducer element 2 as shown in FIG. 15C.

Figure 15D:
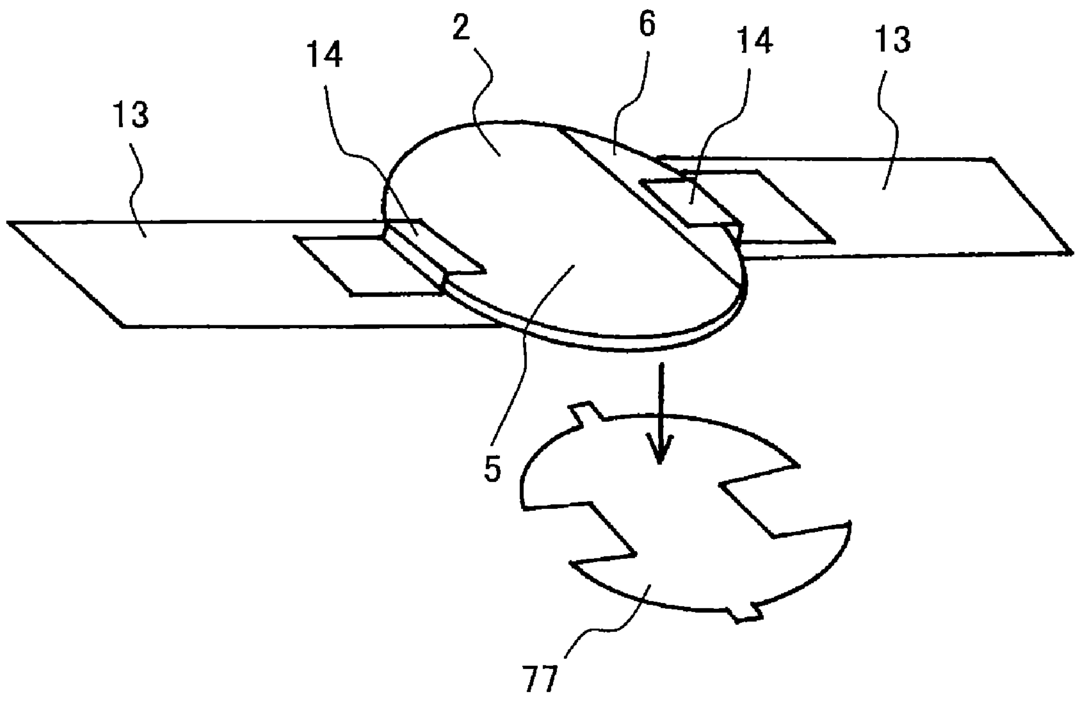
FIG. 15D is a diagram for describing a production method for an ultrasonic wave oscillator.

The next is to cut off the connection part 78 by punching means (not shown herein), resulting in assembling the electromechanical transducer element 2 with the connection member 13 as shown in FIG. 15D.

Note that while FIGS. 15A through 15D are diagrams describing an assembly process of the ultrasonic wave oscillator 2 and connection member 13 according to the second embodiment, the respective assembly processes shown in FIGS. 15A through 15D can also be applied to assembly processes for the electromechanical transducer element and connection member of the other embodiments described above. FIGS. 15B and 15C, for example, can be applied to the assembly process of the electromechanical transducer element 2 and connection member 13 of the sixth embodiment by changing the bending direction of the pressure application part 14 of the connection member 13 on one side.

As such, an electromechanical transducer element and connection members can be assembled by a blanking process, enabling a mass production of ultrasonic wave oscillators and a production of thereof in low cost and stable quality.

While the above described embodiment has shown an assembly process using a blanking process, a use of other process such as etching, laser process, et cetera, providing a similar effect likewise enables a mass production of ultrasonic wave oscillators and a production of thereof in low cost and stable quality.

The next is a description on an ultrasonic wave oscillator in order to prevent an excessive load forced to the electromechanical transducer element as a result of the connection member shorting to a conductive body such as a signal wire when producing the ultrasonic wave oscillator, and on a production method for such an ultrasonic wave oscillator.

That is, according to the present invention, an ultrasonic wave oscillator comprising an electromechanical transducer element, an acoustic matching member, a backing material and connection members for electrically connecting to the electromechanical transducer element by pressing it from the opposite two directions, deforming itself elastically and contacting with the electromechanical transducer element, in which an insulation member is preinstalled in the connection members except for a part which is electrically connecting to the electromechanical transducer element.

This configuration pre-installs an insulation member in the electrical connection part except for a part electrically connecting, it is therefore possible to prevent a risk of a shorting due to a connection between an unnecessary part (e.g., the above described signal wire, et cetera) and a connection member.

Now, the following is a detailed description of a preferred embodiment of the present invention.

Seventeenth Embodiment

The present embodiment describes an ultrasonic wave oscillator of which a part having a possibility of an extraneous electrical contact occurring is covered with an insulation member among components constituting the ultrasonic wave oscillator.

Figure 16:
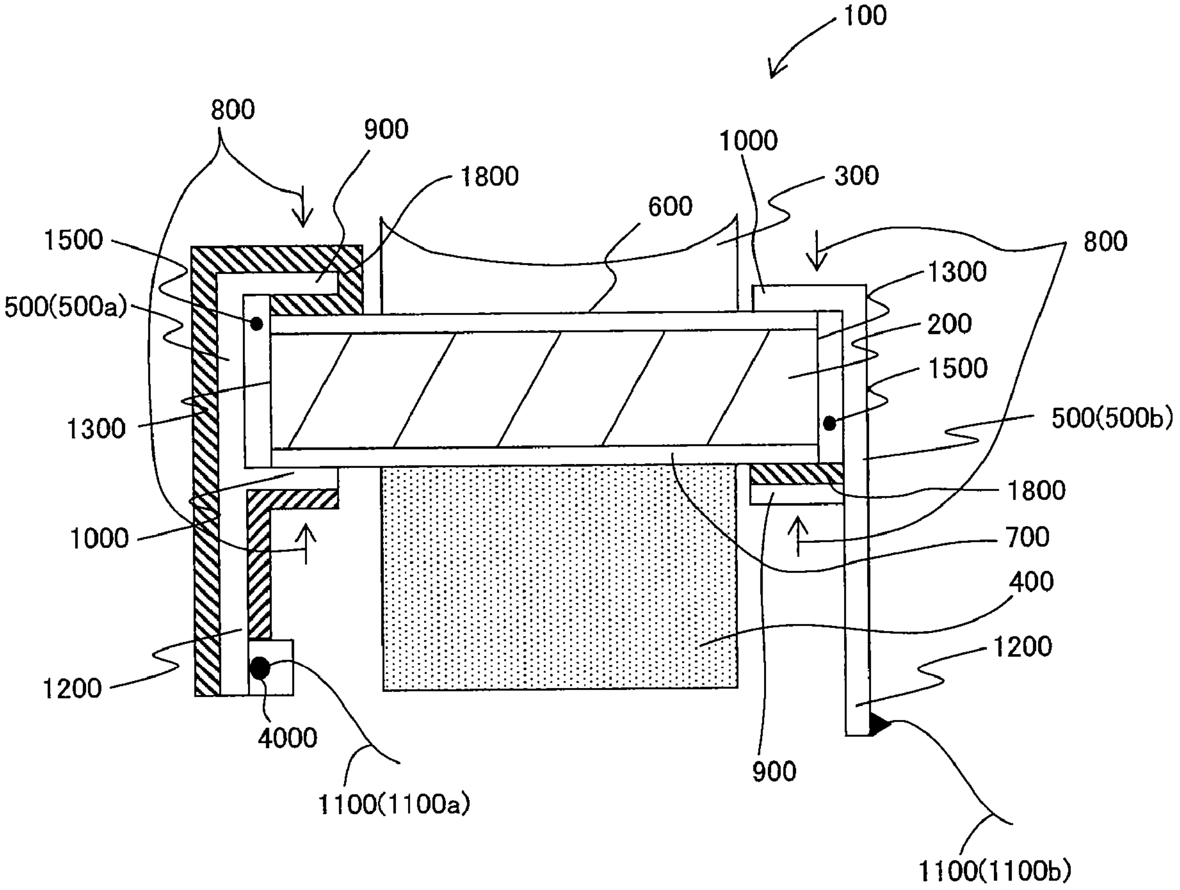
FIG. 16 shows a cross-section of an ultrasonic wave oscillator according to a seventeenth embodiment.

FIG. 16 shows a cross-section of an ultrasonic wave oscillator according to the present embodiment. Referring to FIG. 16, the sound wave emission side (i.e., the top surface) of an electromechanical transducer element 200 is featured with an acoustic matching member 300. A backing material 400 is fixed with an adhesive on the bottom surface of the electromechanical transducer element 200. The surface of the electromechanical transducer element 200 on the acoustic matching member 300 side is featured with a ground electrode 600. And the surface of the electromechanical transducer element 200 on the backing material 400 side is featured with a positive pole electrode 700.

Each of connection members 500 (i.e., 500*a* and 500*b*) respectively comprise a pressure application part 900 and an electrical connection part 1000. An electrical connection part 1000 and a pressure application part 900 are configured to be shaped as a squared "C" (that is, a square with one side being open). The electrical connection part 1000 is disposed as a part for forming an electrical connection with the electromechanical transducer element 200. The pressure application part 900 is also configured to fix, with pressure (noted as "pressure-fix" hereinafter), the electromechanical transducer element 200 so as to press it from the opposite directions 800.

In the connection member 500*b*, the electrical connection part 1000 facing the pressure application part 900 is pressure-fixed at a position contacting with the ground electrode 600. Lead parts 1200 of the respective connection members 500 are connected to lead wires 1100 (i.e., 1100*a* and 1100*b*) by electrical and mechanical means such as soldering, conductive adhesive, screws, et cetera, thus configuring the ultrasonic wave oscillator 100.

The lead wires 1100 are connected to drivers (not shown herein). Note that the lead wire 1100*a* is disposed for applying a voltage to the positive pole electrode 700. The lead wire 1100*b* is disposed as a GND wire.

Parts other than a part (that is, the electrical connection part 1000), for electrically connecting, of the connection member 500*a* electrically connecting to the positive pole electrode 700 of the electromechanical transducer element 200 is covered with an insulation member 1800.

Now, a description is on an operation of the present embodiment. An ultrasonic signal is excited by a driver (not shown herein) and a voltage is applied across the ground electrode 600 and positive pole electrode 700 of the electromechanical transducer element 200 from the connection members 500 by way of the lead wires 1100. As a result, the electromechanical transducer element 200 is enabled to oscillate and emit an ultrasonic wave. It is also enabled to transduce a received ultrasonic wave into an electric signal. As such an ultrasonic wave is exchanged.

In this case, parts of the connection member 500*a* other than an electrical connection part is covered with an insulation member 1800. Because of this, an electric shorting does not occur even if the connection members 500 mechanically contact a backing material or other members.

As described above, the electrical reliability of the ultrasonic wave oscillator is improved because the surface of the electrode contacts only that of the electrical connection part of the connection members while other parts thereof is covered with an insulation member, thus preventing a shorting. The use of an insulation member makes it possible to decrease the number of insulation gaps (meaning a relative distance for preventing conduction between members) with other component members, easing a miniaturization of the ultrasonic wave oscillator.

Eighteenth Embodiment

The present embodiment describes an ultrasonic wave oscillator covered with an insulation member more than the seventeenth embodiment. The present embodiment is described by referring to FIG. 17. Note that the same component sign is attached to the same configuration as in the seventeenth embodiment, with a description thereof being omitted.

Figure 17:
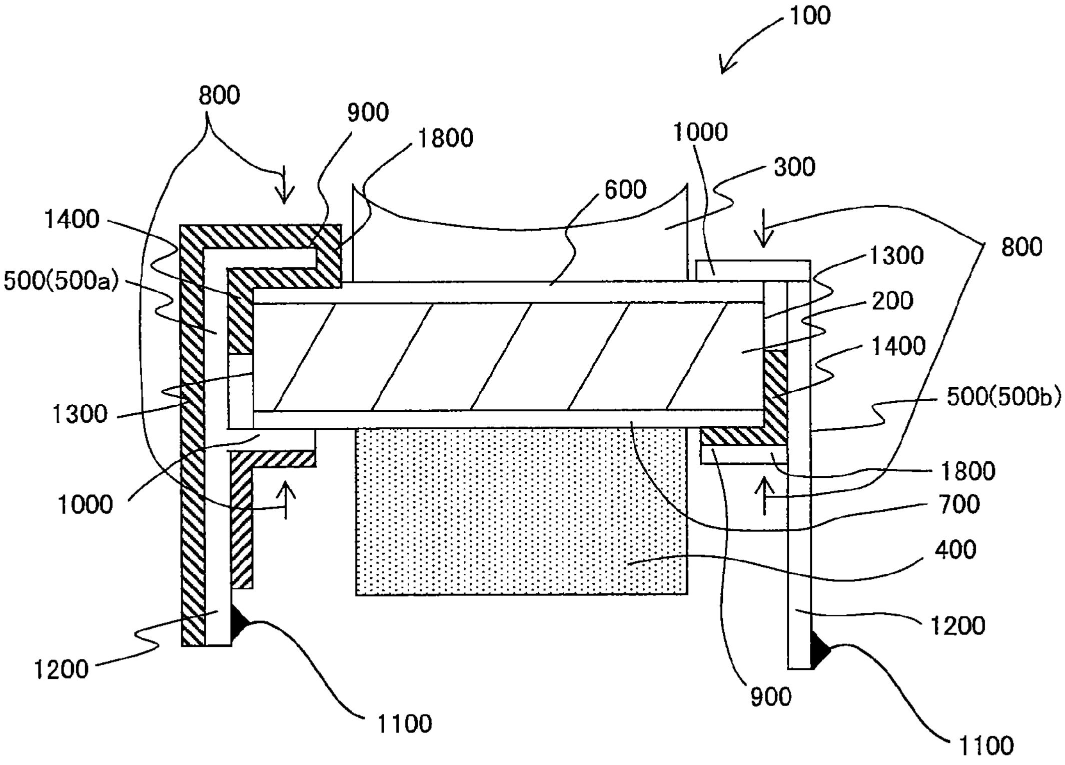
FIG. 17 shows a cross-section of an ultrasonic wave oscillator according to an eighteenth embodiment.

FIG. 17 shows a cross-section of an ultrasonic wave oscillator according to the present embodiment. Of the connection member 500*a*, the insulation member 1800 is extended to the surface of a part facing the side surface 1300 of the electromechanical transducer element 200 and the extended part is equipped as an insulation member 1400. Also, of the connection member 500*b*, an insulation member 1400 is equipped likewise on the surface of a part facing the side surface 1300 of the electromechanical transducer element 200.

Now, an operation of the present embodiment is described. An ultrasonic signal is excited by a driver (not shown herein) and a voltage is applied across the ground electrode 600 and positive pole electrode 700 of the electromechanical transducer element 200 from the connection members 500 by way of the lead wires 1100. As a result, the electromechanical transducer element 200 is enabled to oscillate and emit an ultrasonic wave. It is also enabled to transduce a received ultrasonic wave into an electric signal. As such, an ultrasonic wave is exchanged.

In this case, the insulation member 1400 is equipped between the connection members 500, which are to be insulated, and electromechanical transducer element 200. Because of this, it is possible to prevent an electrical contact between the edge parts of the electrodes 600 and 700 which are exposed to the side surface 1300 of the electromechanical transducer element 200 and the connection members 500 to be insulated.

As such, adopting the above described structure improves a reliability of the electrical connection between the electromechanical transducer element and connection members. Even if the electromechanical transducer element contacts with the connection members mechanically, a reliability of the electrical connection is maintained so as to ease the assembly and enable the production of the ultrasonic wave oscillators at low cost.

Nineteenth Embodiment

The eighteenth embodiment is configured to equip the insulation member in order to prevent the connection members from contacting with the edge parts of the electrodes 600 and 700 exposed to the side surface 1300 of the electromechanical transducer element 200, whereas the present embodiment describes a case of equipping a predetermined space in the aforementioned part. The present embodiment is described by referring to FIG. 16. Note that the same component sign is attached to the same configuration as in the above described embodiment, with a description thereof being omitted.

Referring to FIG. 16, a space 1500 is provided between the side surface 1300 of the electromechanical transducer element 200 and the connection members 500 (i.e., 500*a* and 500*b*). The other comprisal is the same as the seventeenth embodiment.

Now, a description is on an operation of the present embodiment. A provision of the space 1500 makes it possible to shut off an unnecessary electrical connection between the connection members 500 and the edge parts of the electrodes 600 and 700 which are exposed to the surface of the side surface 1300 of the electromechanical transducer element 200.

As described above, a simple method of providing a space between the connection members 500 and the side surface 1300 of the electromechanical transducer element 200 is capable of performing a secure electrical insulation. Meanwhile, deforming the connection members elastically against a form of the electromechanical transducer element and connecting thereto, followed by filling the space part with an organic resin, et cetera, apparently strengthen the fixation between the electromechanical transducer element and connection members and also improve the electrical insulation effect.

Twentieth Embodiment

The present embodiment describes mainly on a production method for structural components. The present embodiment is described by referring to FIGS. 18 through 27. Note that the same component sign is attached to the same comprisal as in the above described embodiments, with the description thereof being omitted.

Figure 18:
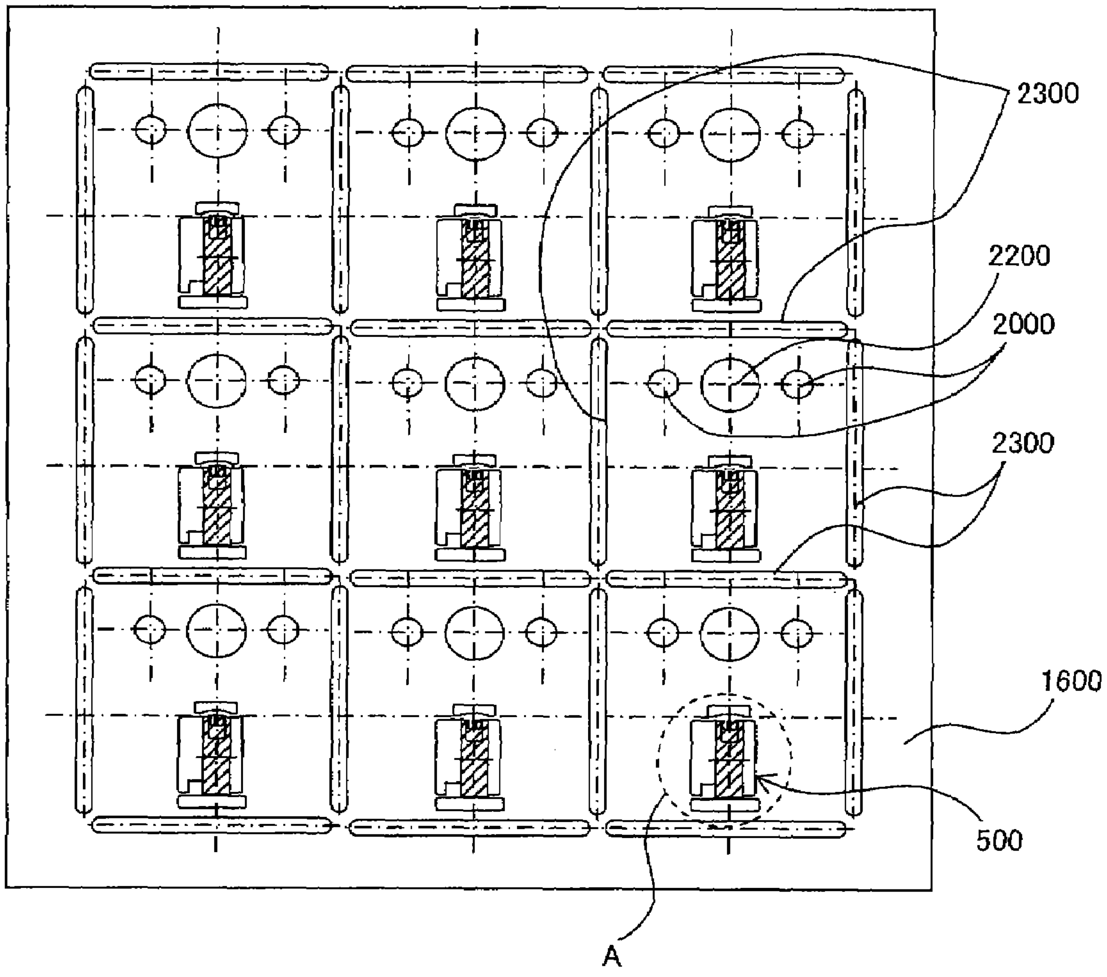
FIG. 18 shows a production process chart (part 1) of an ultrasonic wave oscillator according to a twentieth embodiment.

FIG. 18 shows a production process chart (part 1) of an ultrasonic wave oscillator according to the present embodiment. Referring to FIG. 18, manufactured on a surface of a copper plate 1600 of the thickness of 0.1 mm by etching are a hole 2200, holes 2000 located on both sides of the hole 2200, and elongated holes 2300 which are placed in a manner to surround a part that becomes the connection part 500 later.

The two holes 2000 are ones (noted as "positioning-use holes 2000" hereinafter) corresponding to two positioning pins 1900 of a bending jig 1700 with will be described in association with FIG. 21. The hole 2200 is one (noted as "fixing screw-use hole 2200" hereinafter) for letting a fixing screw 2100 go through for fixing which will be described associated with FIG. 21. The elongated holes 2300 are ones for cutting off the approximate square section surrounded thereby.

Figure 19:
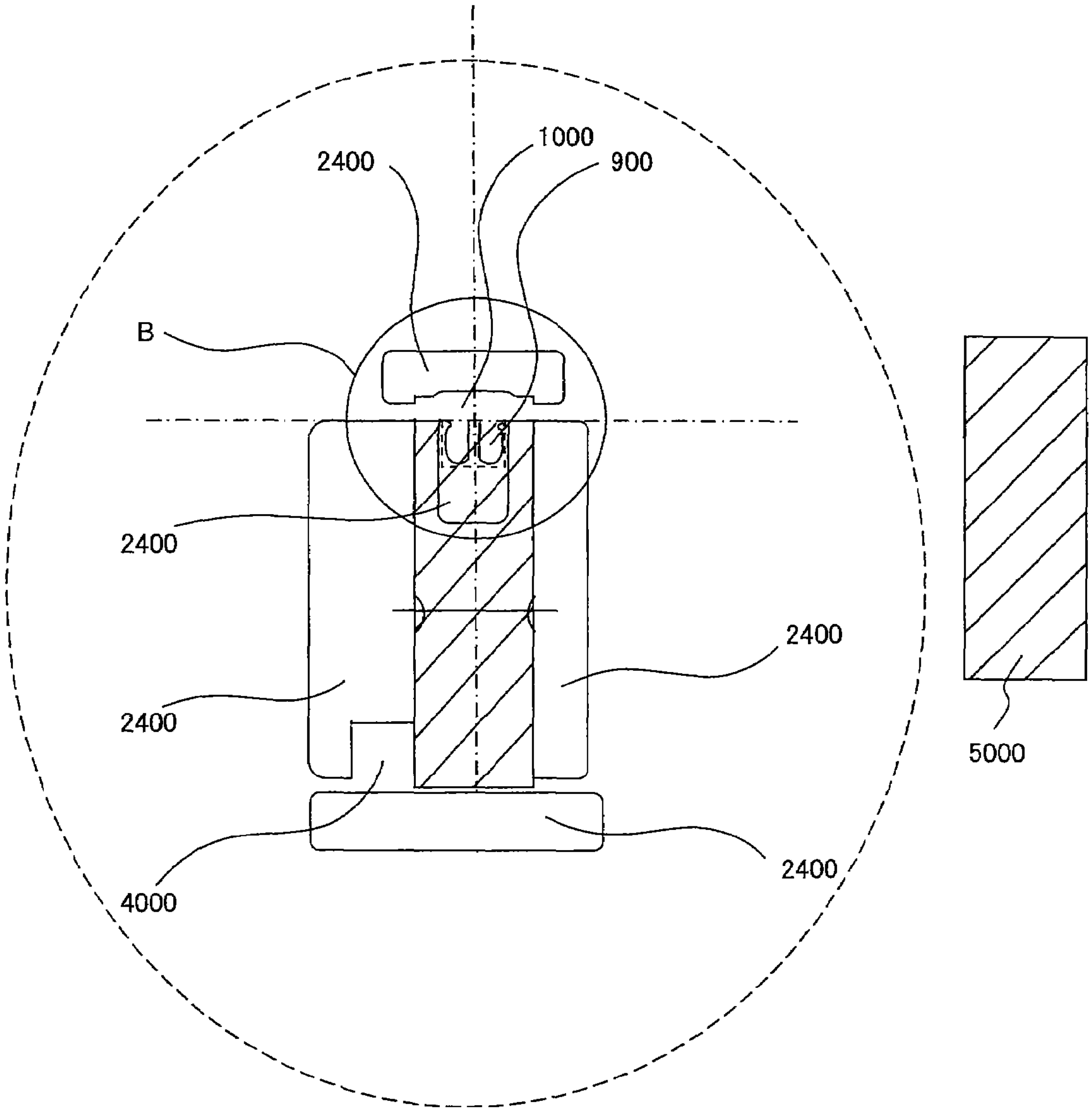
FIG. 19 shows a production process chart (part 2) of the ultrasonic wave oscillator according to the twentieth embodiment.

FIG. 19 shows a production process chart (part 2) of the ultrasonic wave oscillator according to the present embodiment. FIG. 19 is an enlargement diagram of the part A enclosed by the dotted line in FIG. 18. Holes 2400 are made along the external and internal peripheries of a connection member 500. These holes 2400 are ones (noted as "feature holes 2400" hereinafter) for featuring the external and internal peripheries of the connection member 500. Also made on the copper plate 1600 are the connection member 500, respective holes 2000, 2200, 2300 and 2400, forming as one set, all of which are simultaneously made by etching as shown in FIG. 18.

Here, the positioning-use holes 2000 and the feature holes 2400 for the connection member 500 are manufactured in a high precision so as to determine a positional relationship with a later described bending jig 1700 accurately. In this state, a polyimide 5000 of the thickness of 50 micrometers is cut out into a narrow rectangle so as to match with the feature of the connection member 500.

Then, the cutout polyimide 5000 is fixed by an adhesive onto a predetermined position of the feature part of the connection member 500 on the copper plate 1600, in a manner to avoid the part of the connection member 500 constituting the electrical connection part 1000. Note that an application of a physicochemical treatment such as plasma treatment, etching, et cetera, on the polyimide surface prior to fixing the polyimide 5000 onto the copper plate 1600 further improves an adhesiveness of the polyimide.

Figure 20:
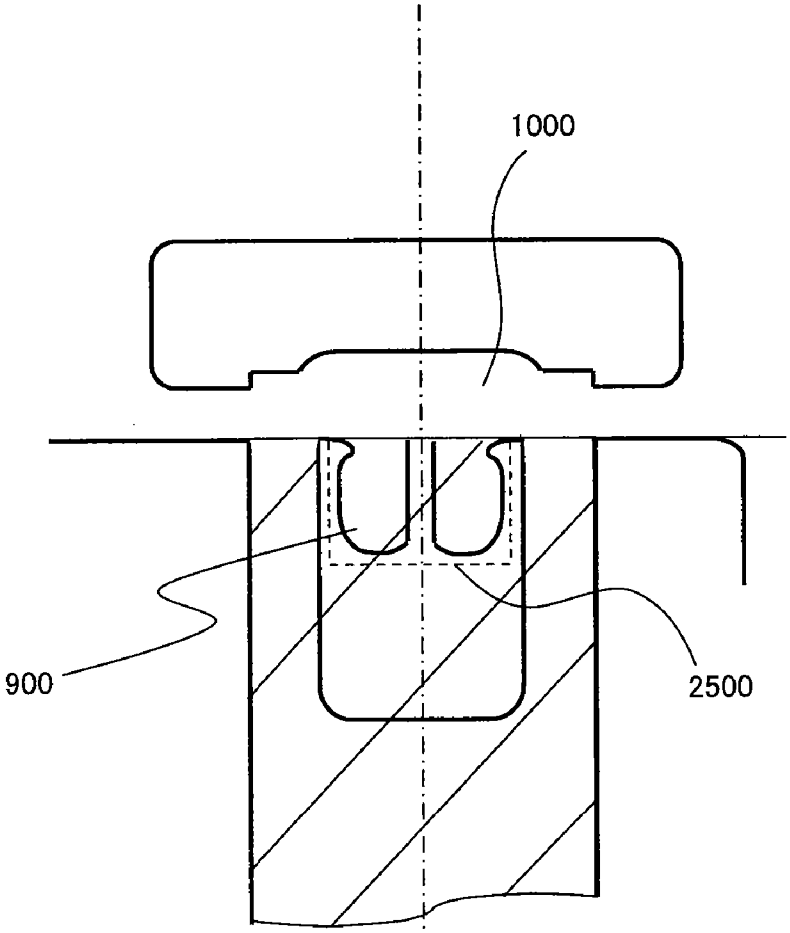
FIG. 20 shows a production process chart (part 3) of the ultrasonic wave oscillator according to the twentieth embodiment.

FIG. 20 shows a production process chart (part 3) of the ultrasonic wave oscillator according to the present embodiment. FIG. 20 is an enlargement diagram of the area B indicated in FIG. 19. After the polyimide 5000 is fixed by adhesive onto the predetermined position of the feature part of the connection member 500 on the copper plate 1600 as described above, only the polyimide is cut out along a cutout part 2500 of the inner periphery hole.

The above described work is performed on each connection member 500 made on the copper plate 1600, followed by cutting along the parts of the elongated holes 2300 into an approximate square small plate 2600.

Figure 21:
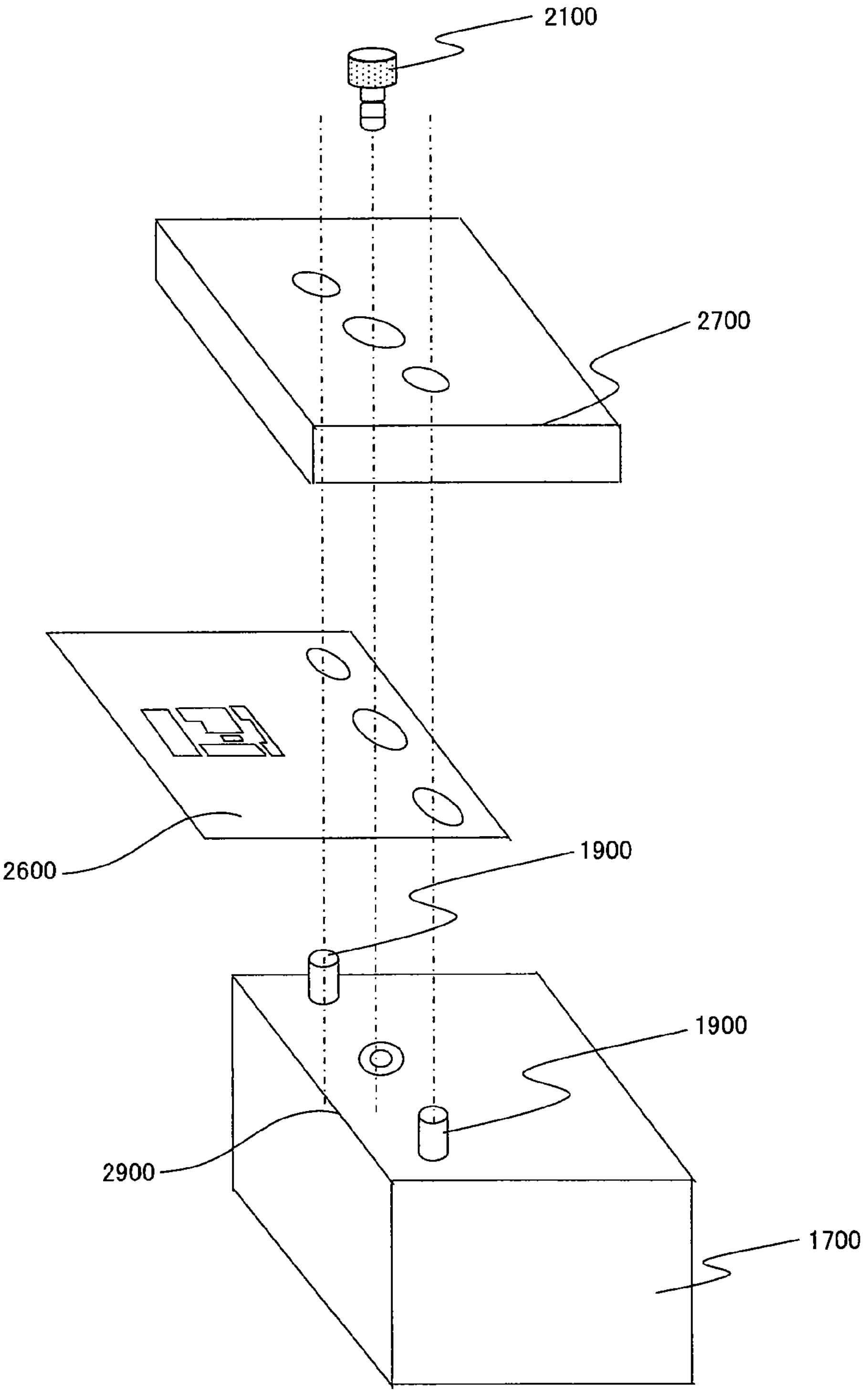
FIG. 21 shows a production process chart (part 4) of the ultrasonic wave oscillator according to the twentieth embodiment.

FIG. 21 shows a production process chart (part 4) of the ultrasonic wave oscillator according to the present embodiment. After the copper plate 1600 is cut into an approximate square small plate 2600 by cutting along the parts of the elongated holes 2300 as described above, the small plate 2600 is positioned by having the holes 2000 of the small plate 2600 accept the two pins (i.e., positioning pins) 1900, respectively, of the bending jig 1700 shown in FIG. 21.

Then, the positioning pins 1900 are inserted into holes equipped in an upper plate jig 2700 for positioning and fixing it, further followed by inserting a screw 2100 into the screw-use holes respectively featured in the upper plate jig 2700, small plate 2600 and bending jig 1700, thereby having the screw 2100 integrally fix the upper plate jig 2700, small plate 2600 and bending jig 1700.

Figure 22:
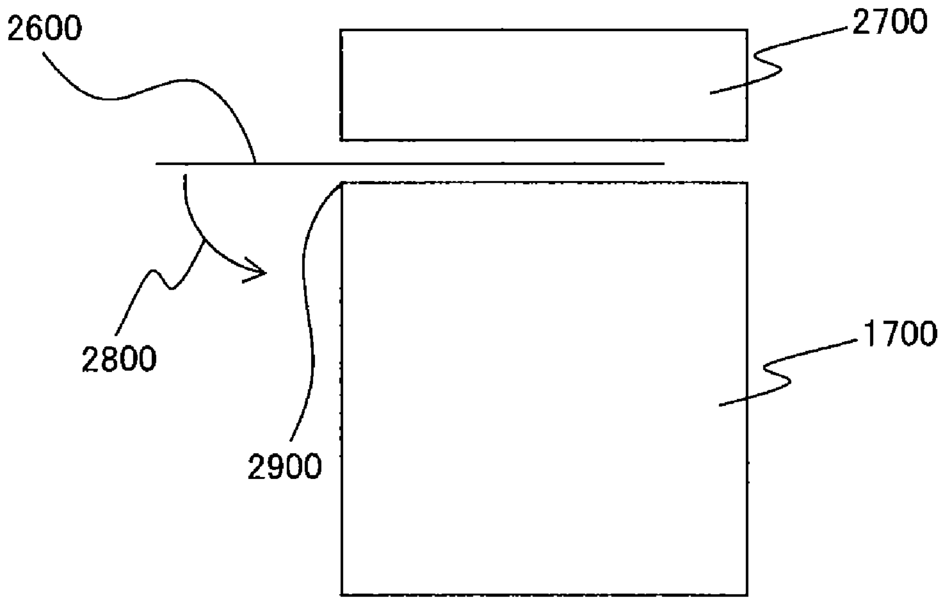
FIG. 22 shows a production process chart (part 5) of the ultrasonic wave oscillator according to the twentieth embodiment.

FIG. 22 shows a production process chart (part 5) of the ultrasonic wave oscillator according to the present embodiment. FIG. 22 is an illustration diagram of an observation from the direction of the side face of the upper plate jig 2700, small plate 2600 and bending jig 1700 which have been integrated by the screw. The periphery of the small plate 2600 is bent in the direction of arrow 2800 along an edge 2900 of the bending jig 1700. As a result, the small plate 2600 is formed as shown in FIG. 23.

Figure 23:
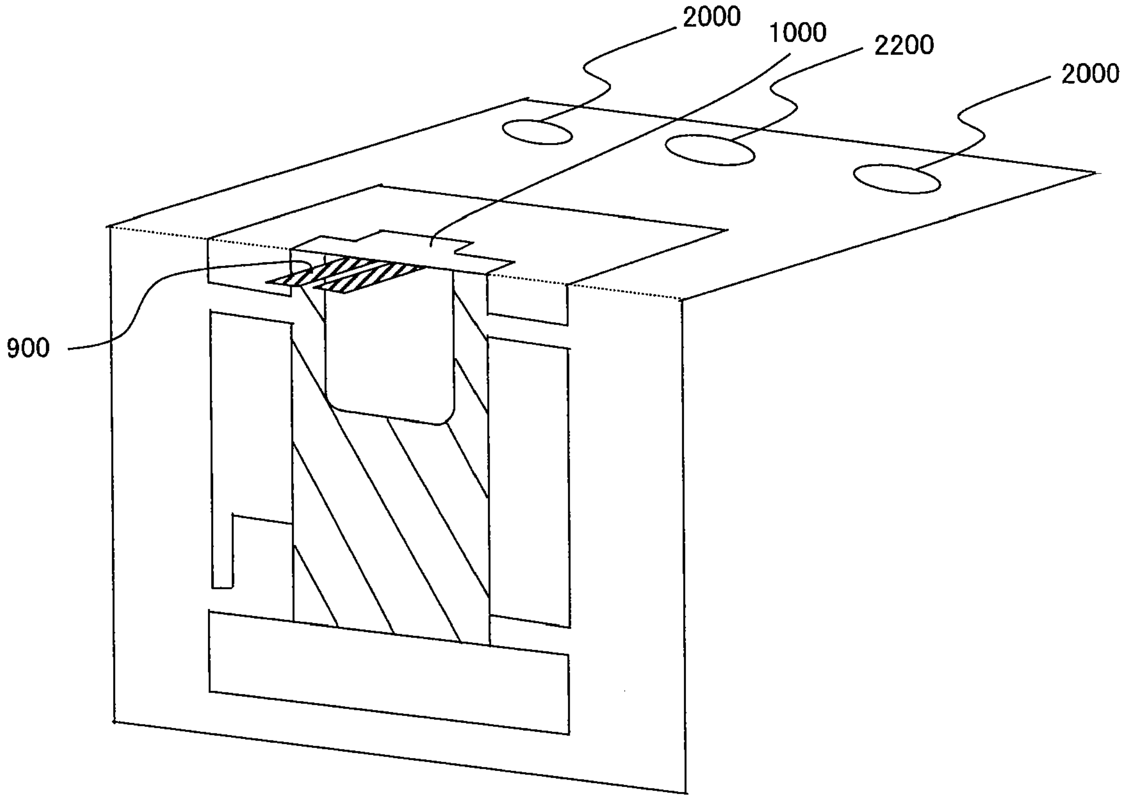
FIG. 23 shows a production process chart (part 6) of the ultrasonic wave oscillator according to the twentieth embodiment.

FIG. 23 shows a production process chart (part 6) of the ultrasonic wave oscillator according to the present embodiment. FIG. 23 is an enlargement diagram of the bended small plate 2600 in FIG. 22. As described for FIG. 22, the periphery of the small plate 2600 is bent in the direction of arrow 2800. As a result, parts constituting the pressure application parts 900 of the connection member 500 in a later event maintain the original flat plane in lieu of being bent in the direction of arrow 2800 due to being separated in the above described cutout part 2500, and accordingly two platelets (i.e., pressure application parts 900) expose in a shape as shown in FIG. 23. Note that the respective members of the edge part 2900 of the bending jig 1700 are accurately processed in a positional relationship matching the roots of the pressure application part 900.

Figure 24:
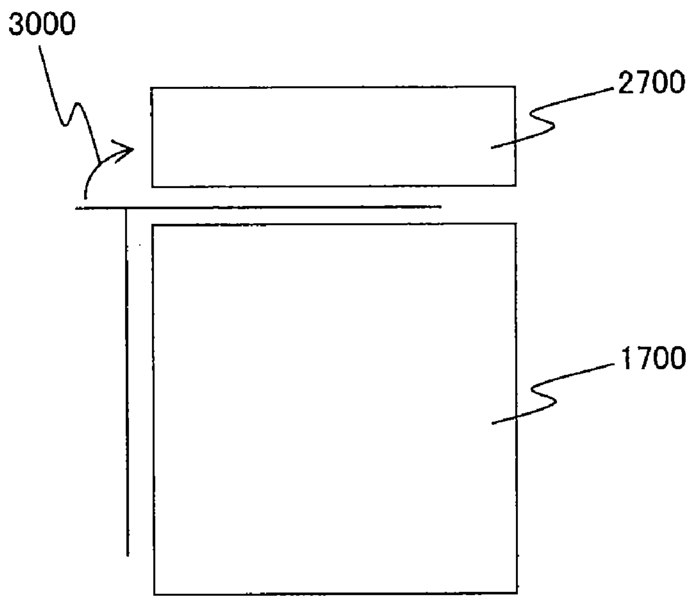
FIG. 24 shows a production process chart (part 7) of the ultrasonic wave oscillator according to the twentieth embodiment.

FIG. 24 shows a production process chart (part 7) of the ultrasonic wave oscillator according to the present embodiment. The work of FIG. 23 is followed by bending the pressure application part 900 in a bending direction 3000 opposite to the bending direction 2800 (refer to FIG. 22) along the edge of the upper plate jig 2700.

Figure 25:
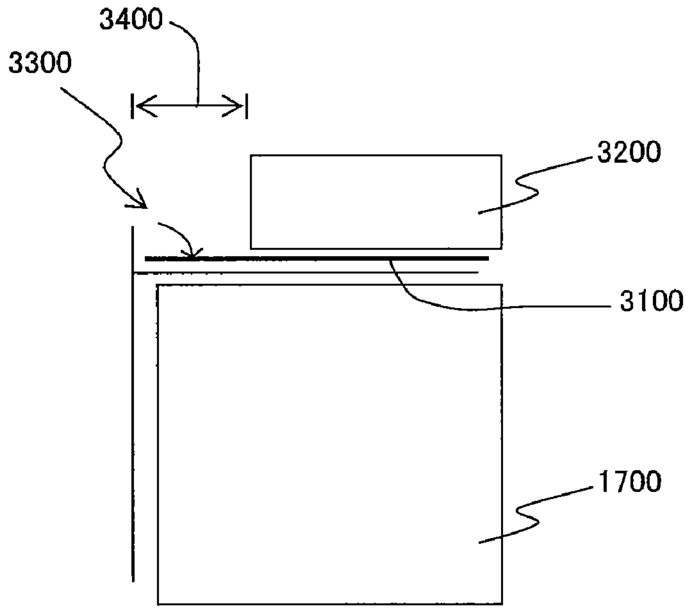
FIG. 25 shows a production process chart (part 8) of the ultrasonic wave oscillator according to the twentieth embodiment.

FIG. 25 shows a production process chart (part 8) of the ultrasonic wave oscillator according to the present embodiment. The process of FIG. 24 is followed by removing the upper plate jig 2700, and then fixing a spacer 3100 having a little larger thickness than that of the electromechanical transducer element 200 together with an upper plate 3200 for suppressing the spacer 3100. The upper plate 3200 placed with an offset 3400 relative to the bending jig 1700 so as to avoid an interference with a bent pressure application part 900 when bending it toward the bending direction 3300 in a manner to embrace the spacer 3100.

Figure 26:
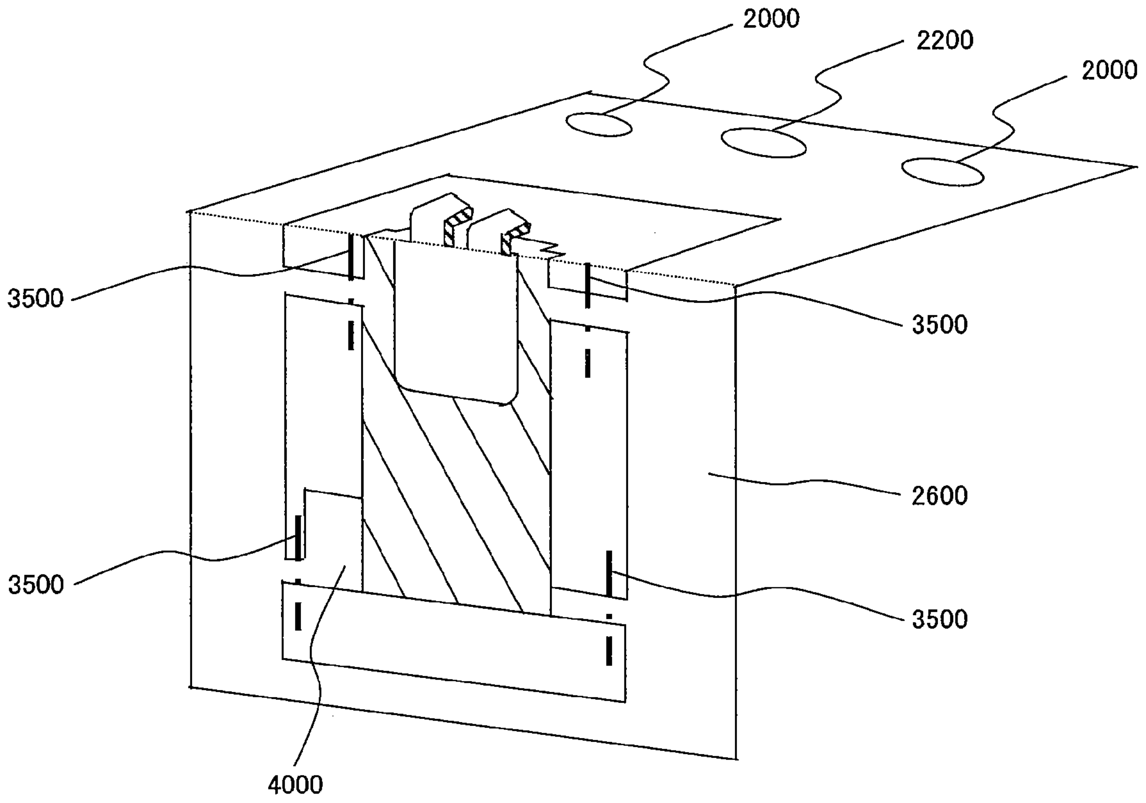
FIG. 26 shows a production process chart (part 9) of the ultrasonic wave oscillator according to the twentieth embodiment.

FIG. 26 shows a production process chart (part 9) of the ultrasonic wave oscillator according to the present embodiment. The bending process of FIG. 25 is followed by removing each of the jigs (1700 and 3200) to obtain the small plate 2600 formed as shown in FIG. 26, further followed by cutting the connection member 500 off a small branch (i.e., a runner) at the cutoff part 3500.

Figure 27:
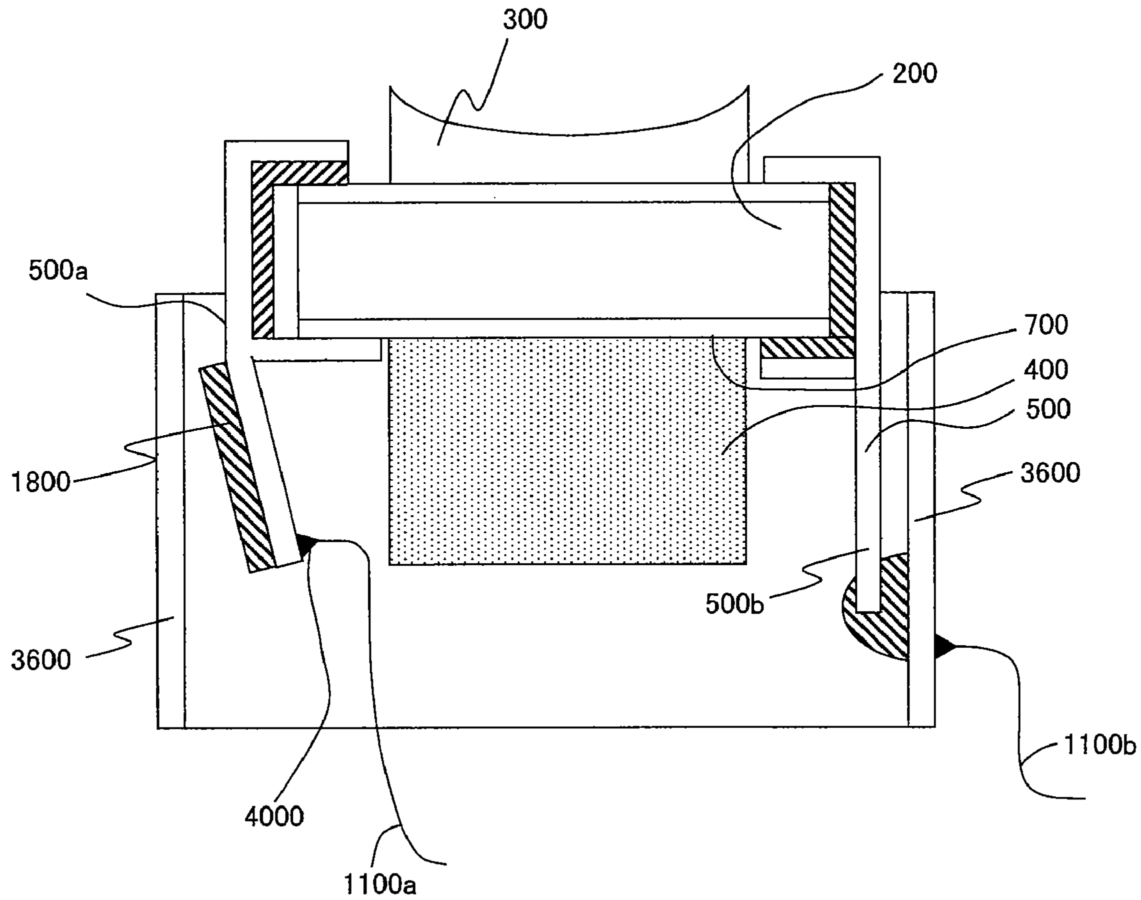
FIG. 27 shows a state of a connection member produced according to the twentieth embodiment having been incorporated in an ultrasonic wave oscillator.

FIG. 27 shows a state of a connection member produced according to the present embodiment having been incorporated in an ultrasonic wave oscillator. FIG. 27 shows a state of using the connection member 500 produced according to the present embodiment as a connection member 500*a* for connecting to the positive pole electrode 700 of the ultrasonic wave oscillator 100.

A metallic housing 3600 is fixed by adhesive in a manner to wrap the electromechanical transducer element 200, and the GND-side connection member 500*b* is electrically connected to the housing by a soldering, et cetera. The insulation member 1800 of the connection member 500*a* is equipped in a manner to prevent an electrical contact with the housing 3600.

An electrical connection part terminal part 4000 of the connection member 500*a* is bent in the direction of not contacting with the housing 3600, and connected to a surface facing the inside direction of the housing of the connection member 500*a* by a lead wire 1100*a* and a soldering, et cetera.

Such a configuration makes it possible to have an insulation member which is pre-fixed to the connection members 500 with an adhesive insulate the housing from the electrode of the electromechanical transducer element 200 in need of an electrical insulation.

As described above, the assembly work is easy since the insulation member is stuck by adhesion to the connection member in a state of a flat plate in advance of being bent. Also a low cost and high reliability ultrasonic wave oscillator can be manufactured since it is possible to securely insulate a part in need of an electrical insulation after the bending and easily manufacture the connection member.

Note that the present embodiment is configured to use a copper plate, the present invention, however, is contrived to provide apparently a similar effect if it is embodied by using another metallic thin plate such as stainless steel, nickel, aluminum, brass and steel, in lieu of being limited to copper.

Also note that the present embodiment has described an etching as a process method, whereas similar processing can apparently be accomplished by another process method, such as machining process, punching process by a punch, laser process, wire cut and electrical discharge machining, thereby obviously bringing forth the effect of the present embodiment, in lieu of being limited to the etching.

Also note that reliability of the present embodiment is improved by applying a coating, such as plating, vapor deposition, or sputtering, to the copper plate, which prevents oxidization and improves an electrical continuity. Any electrically conductive coating material may apparently be effective, such as nickel/gold, platinum, silver, copper, et cetera.

While the insulation member used for the present embodiment is made of polyimide, any organic material with an insulating characteristic, however, may obviously be used for the insulation member.

21st Embodiment

The present embodiment describes a case of manufacturing the connection member according to the seventeenth embodiment by using a flexible substrate. The present embodiment is described by referring to FIGS. 28 and 29. Note that the same component sign is attached to the same part as in the above described embodiment, with the description thereof being omitted.

Figure 28:
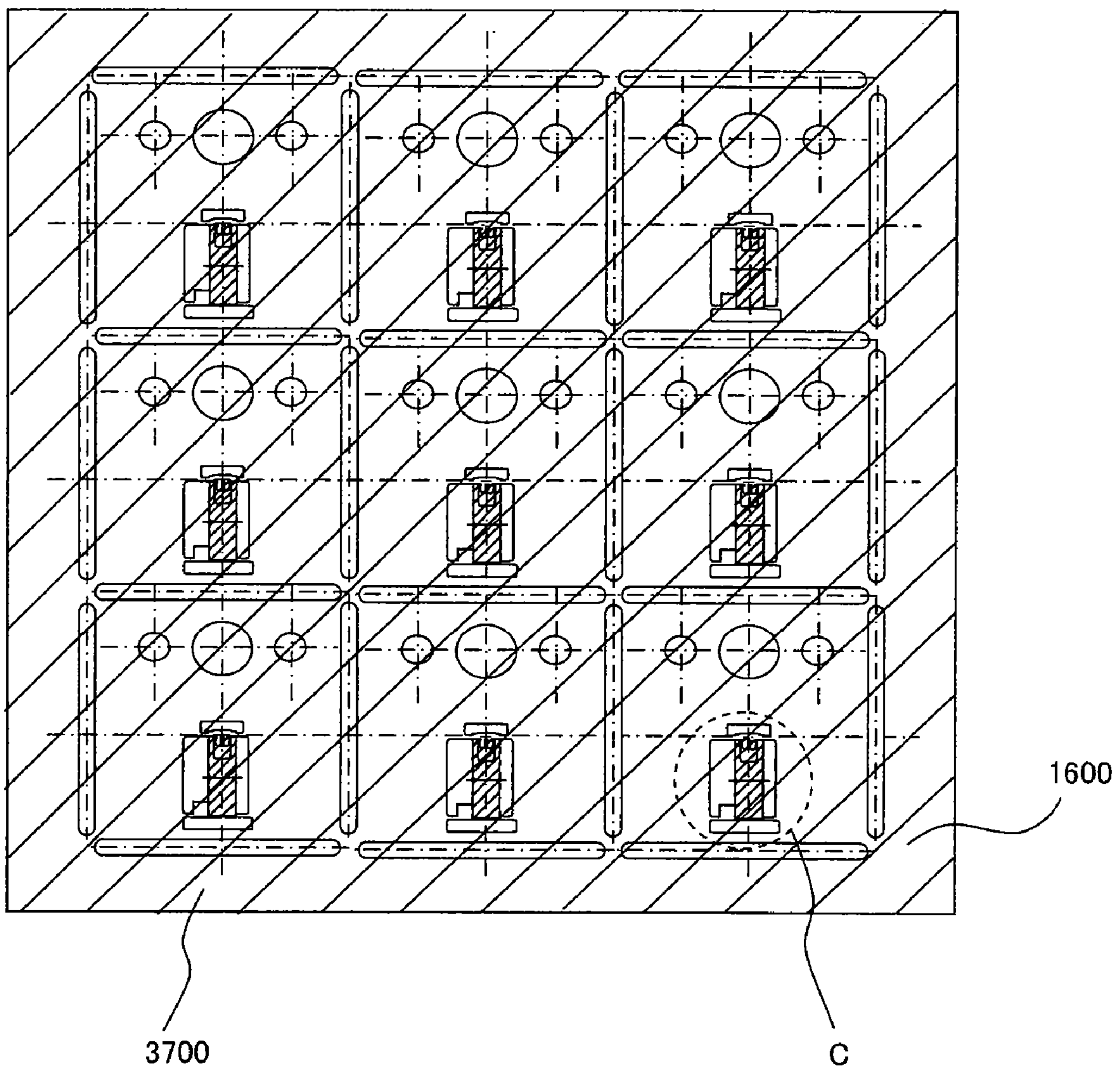
FIG. 28 shows a production process chart (part 1) of an ultrasonic wave oscillator according to a twenty-first embodiment.
Figure 29:
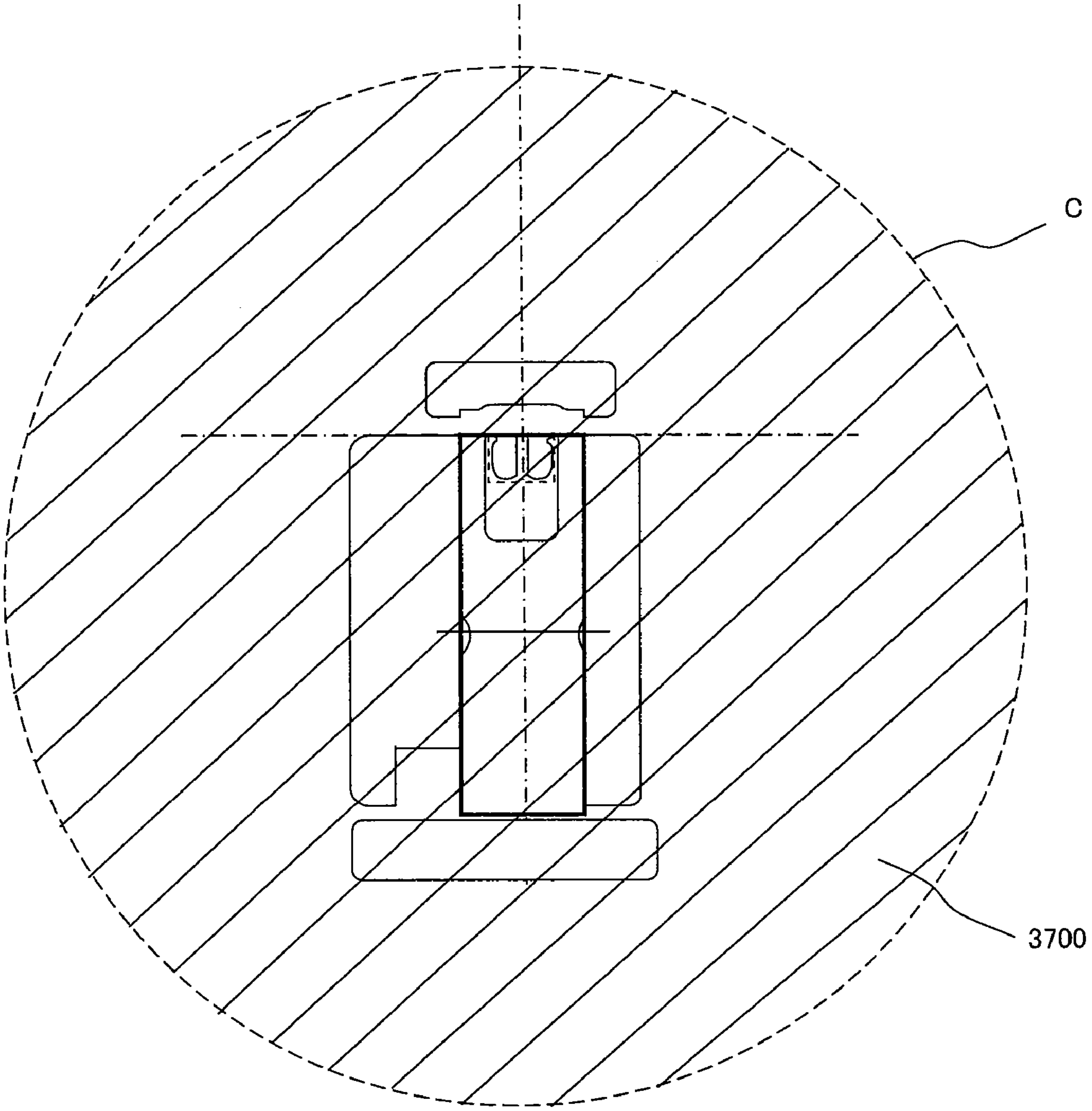
FIG. 29 shows a production process chart (part 2) of an ultrasonic wave oscillator according to the twenty-first embodiment.

FIG. 28 shows a production process chart (part 1) of an ultrasonic wave oscillator according to the present embodiment; and FIG. 29 shows a production process chart (part 2) of the ultrasonic wave oscillator according to the present embodiment. FIG. 28 corresponds to FIG. 18. FIG. 29 corresponds to FIG. 19.

The present embodiment is configured to utilize a flexible substrate made of a polyimide sheet. The first process cuts a hole at a predetermined position of the polyimide sheet. The next unites a copper plate with the polyimide sheet by a thermal adhesion. The next prints a mask on the copper plate for making a copper plate pattern shown in FIG. 28. Note that a part to print the mask is a part remaining as the copper plate 1600 (i.e., a part not becoming a hole). The next makes a flexible substrate in a state (refer to FIG. 29) of a narrow rectangular-shaped polyimide 5000 having been adhered to the copper plate pattern as in the case of the seventeenth embodiment. Note that the process is basically the same as a process of manufacturing a flexible substrate made of a polyimide sheet. Processes hereafter are the same as the twentieth embodiment.

Adopting such a configuration makes it possible to have the insulation member which is pre-manufactured in the connection member 500 insulate the housing from the electrode of the electromechanical transducer element 200 in need of an electrical insulation.

As described above, since the manufacturing of the electrical connection part can be accomplished by using common industrial fabrication means, a high precision, better reliability and low cost ultrasonic wave oscillator can be produced.

22nd Embodiment

The twentieth embodiment has adhered a narrow rectangular-shaped polyimide 5000 onto the connection member, the present embodiment, however, describes a case of applying a vapor deposition of Parylene (a registered trade mark) (i.e., polyparaxylene) resin in place of the polyimide 5000. The present embodiment is described by referring to FIGS. 28 and 29. Note that the same component sign is attached to the same part as in the above described embodiment, with the description thereof being omitted.

The first process makes the forms of the connection members 500 on the copper plate 1600 by etching in the same manner as the twentieth embodiment (refer to FIG. 28). The next applies a mask by a resist to an area 3700 other than an area for coating an insulation member (i.e., an organic member such as Parylene resin shown in the following). The next applies a vapor deposition of an organic member such as Parylene resin, followed by removing the resist by a washing process, thereby manufacturing a pre-bending copper plate 1600.

Such a configuration makes it possible to accurately control a part for applying a vapor deposition of the insulation member by way of a mask. Also, the use of a vapor deposition such as Parylene enables a manufacturing of an insulation film by a dry process, thereby stabilizing a composition of the insulation film and a film thickness thereof.

As described above, since the insulation film can be manufactured by a common dry process, stabilizing the process, the reliability of the ultrasonic wave oscillator is improved. Also, a use of a vapor deposition of Parylene, et cetera, for making the insulation film enables a forming of the insulation film in the solid form following the bending and cutoff processes in the state of the resist being attached, eliminating a risk of the insulation film being removed from the insulation member at the time of bending it due to a stress caused by the bending process, and therefore the process is stabilized.

Note that the present embodiment apparently provides a similar effect not only by the dry process such as a vapor deposition but also by applying a method such as a direct coating of an organic material.

23rd Embodiment

The present embodiment describes the case of featuring a cutout in a predetermined part of a housing having a possibility of contacting with a part of a connection member not covered with an insulation member. The present embodiment is described by referring to FIG. 30. The same component sign is attached to the same part as in the above described embodiments with the description thereof being omitted.

Figure 30:
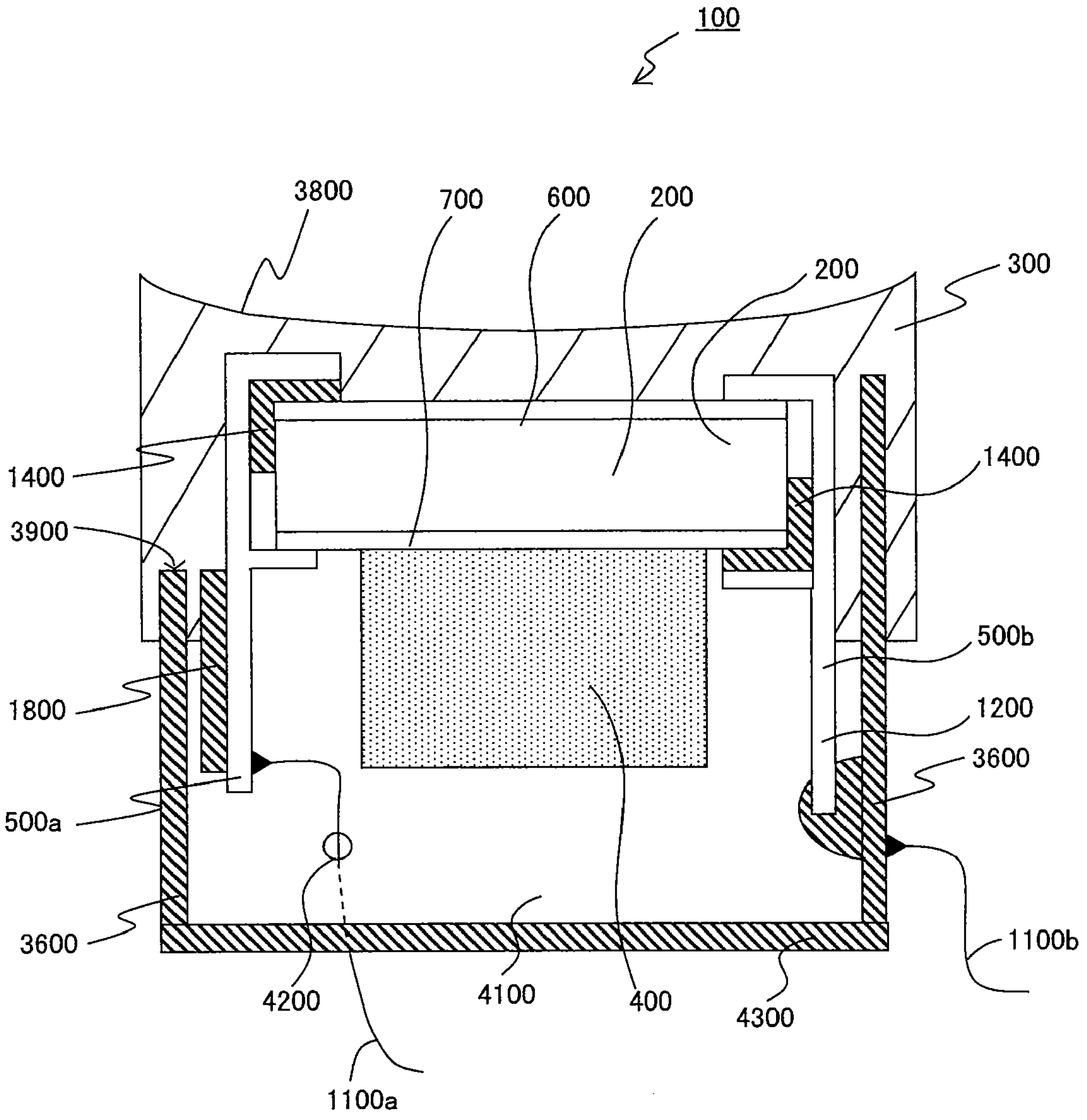
FIG. 30 shows a cross-section of an ultrasonic wave oscillator according to a twenty-third embodiment.

FIG. 30 shows a cross-section of an ultrasonic wave oscillator according to the present embodiment. An acoustic matching member 300 of an ultrasonic wave oscillator 100 is configured to be featured with a curved surface 3800 on the surface so as to converge an ultrasonic wave. And the periphery of the acoustic matching member 300 covers the periphery of a housing 3600 in a manner to enclose connection members 500*a* and 500*b*.

The connection members 500*a* and 500*b* are in the state of being insulated completely from the outside. A part of the housing 3600 corresponding to a part, in which an insulation member 1800 is not placed, of the positive pole electrode connection-use connection member 500*a* is featured with a cutout 3900. That is, the housing on the connection member 500*a* side is shorter than that on the connection member 500*b* side as shown in the cross-sectional diagram of FIG. 30, and is featured with a cutout 3900 for forming a part not contacting with a part covered with an insulation member.

The acoustic matching member 300 is made in a manner to completely cover the cutout 3900 of the housing 3600. The GND side connection member 500*b* is connected to the inside wall of the housing by a soldering, et cetera, on the inside of the housing 3600, and is connected to a lead wire 1100*b* on the periphery of the housing 3600.

The positive side connection member 500*a* is electrically connected to the lead wire 1100*a* on the inside 4100 of the housing 3600 and the lead wire 1100*a* is led to the outside by way of a hole 4200 cut open in the housing 3600. Then, followed by filling an insulation resin in the inside 4100 of the housing 3600, and fixing a cover 4300 by adhesive, thus forming the ultrasonic wave oscillator 100.

This configuration comprises the connection members 500 and also the periphery of the housing which are covered completely with the acoustic matching member 300 made of a resin that is an insulation material in terms of an electrical characteristic, thereby electrically being insulated from the outside. Also, equipping the cutout 3900 close to the positive side connection member 500*a* of the housing 3600 makes it possible to eliminate extraneous possible contact points and accordingly decrease a risk of the connection member contacting with the housing.

As described above, covering a connection member with an acoustic matching member makes it possible to manufacture as far as the insulation layer by a simple method. Therefore, the method eliminates a uniting failure due to contamination, et cetera, on the resin interface possibly occurring in the case of over-coating with a resin for providing insulation or water resistance, thereby securing higher insulation property and reliability and enabling a manufacture of an ultrasonic wave oscillator for use in water, body abdomen, et cetera, where a water resistance is important.

Meanwhile, simplifying the process and having the acoustic matching member also function as an electrical insulation for the ultrasonic wave oscillator enable a simplification of the production process and the manufacture of an improved reliability, low cost ultrasonic wave oscillators.

24th Embodiment

The present embodiment describes an ultrasonic wave oscillator in which a lead part of a connection member is bent and extended to the outside of a housing 3600. The present embodiment is described by referring to FIGS. 31 and 32. The same component sign is attached to a similar part as that of the above described embodiments, with a description thereof being omitted.

Figure 31:
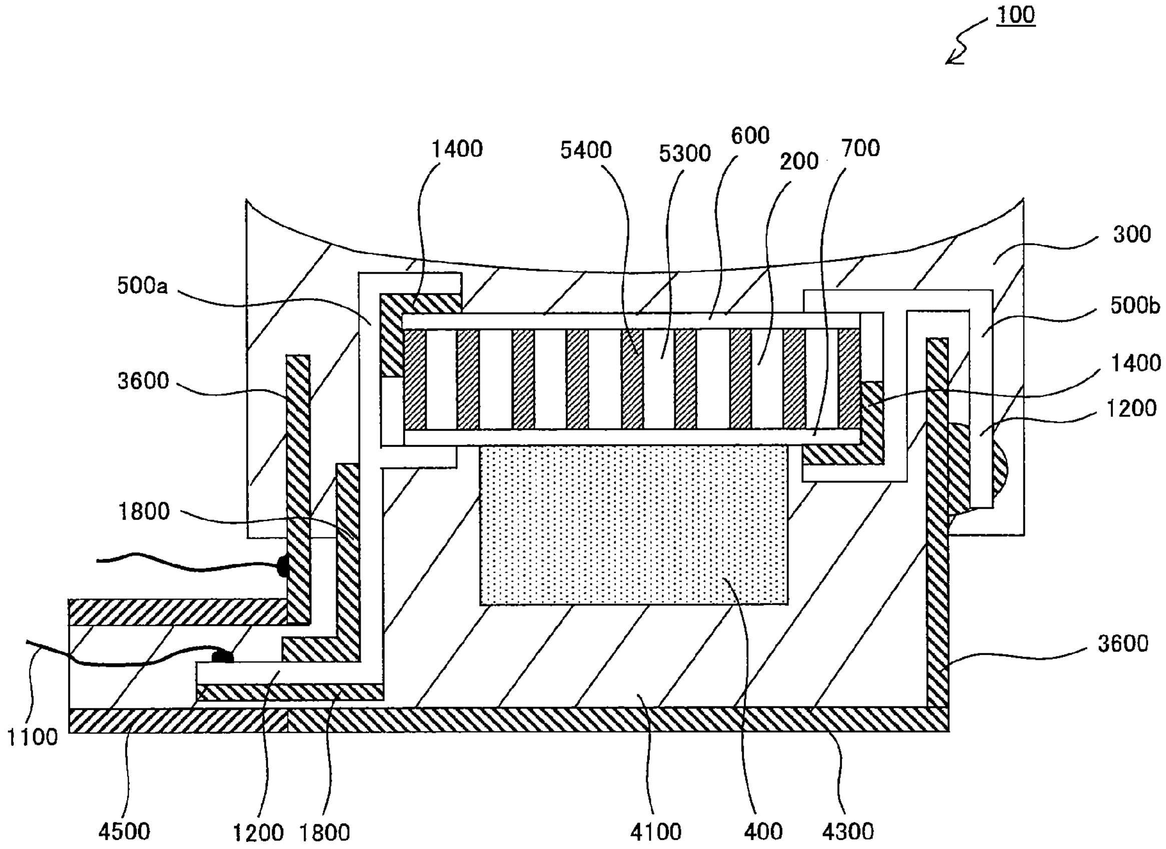
FIG. 31 shows a cross-section of an ultrasonic wave oscillator according to a twenty-fourth embodiment.
Figure 32:
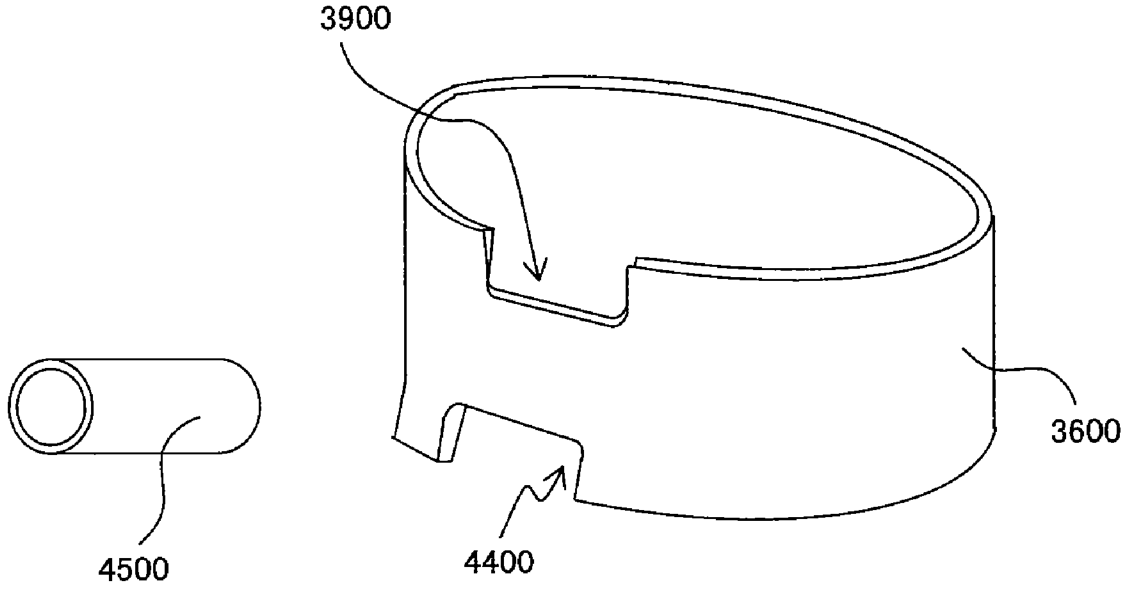
FIG. 32 shows a housing and an insulation tube according to the twenty-fourth embodiment.

FIG. 31 shows a cross-section of an ultrasonic wave oscillator according to the present embodiment. FIG. 32 is a diagram for describing forms of a housing and of an insulation tube of an ultrasonic wave oscillator according to the present embodiment. Referring to FIG. 32, the housing 3600 is formed as a cylinder of an approximate ellipse, with an upper cutout 3900 and a lower cutout 4400 being featured at the upper and lower ends, respectively, on one circumferential side of the cylinder.

Referring to FIG. 31, the structure is configured in a manner that a lead part 1200 of a positive-side connection member 500*a* is bent outward within a housing 4100 and the lead part 1200 is extended to the outside from the lower cutout 4400 of the housing 3600.

Insulation members 1800 are placed on the top and bottom surfaces of the lead part 1200 in the neighborhood of the lower cutout 4400 of the lead part 1200, and the housing 3600 and the lead part 1200 of the connection member 500*a* perform an electrical insulation.

A lead wire 1100 is connected by a soldering, et cetera, to the lead part 1200 of the connection member 500*a* extending to the outside of the housing 3600. The lead part 1200 is covered with an insulation tube 4500 made of a resin in a manner to enclose the periphery of the lead part 1200. The inside of the insulation tube 4500 is filled with a resin for insulation and water resistance.

The GND side connection member 500*b* has a lead part 1200 placed on the outside of the housing 3600 and electrically connected by a soldering, et cetera, on the peripheral surface of the housing 3600. A GND side lead wire 1100*b* is connected to the housing 3600 by a soldering, et cetera, in the neighborhood of the insulation tube of the housing 3600. By this, the positive side and GND side electrodes of the electromechanical transducer element 200 are electrically connected to the lead wires 1100*a* and 1100*b*, respectively.

Meanwhile, an insulation and water resistance of the electrical connection part against the outside is provided by the acoustic matching member 300 covering the electrical connection part. And a resin is filled within the inside 4100 of the housing 3600 for providing an insulation and water resistance, and a cover 4300 is fixed. Incidentally, the present embodiment is configured to use a composite piezoelectric element fixing a columnar ceramic piezoelectric element 5300 by a resin 5400 as an electromechanical transducer element 200.

Such a configuration eases a connection to the lead wire 1100 as a result of bending the lead part of the connection member and extending it to the outside of the housing 3600.

The configuration as described above eases the connection to the lead wire, thereby reducing a process time and enabling a manufacturing of low cost, high reliability ultrasonic wave oscillators.

Meanwhile, the present embodiment is configured to use a composite piezoelectric element as electromechanical transducer element. In the case of using the composite piezoelectric element, the strength of the electrode part is low and there is accordingly a possibility of the lead part coming off if the connection uses a soldering, et cetera. The adoption of a method for securing an electrical connection by an elastic deformation such as the present embodiment provides a simple method and improves reliability.

And in the case of having connection members sandwich an electromechanical transducer element, the composite piezoelectric element is hardly influenced by an oscillation of other columnar ceramic piezoelectric elements because the respective columns oscillate in the vertical direction. Because of this, even if configuration of an electrical connection by an elastic deformation of the connection member is adopted, a characteristic of an influence, to other parts, of hampering an oscillation hardly occurring is maintained.

$25^{th}$ Embodiment

The present embodiment describes an ultrasonic wave oscillator enabling a connector connection of a lead part of a structure member. The present embodiment is described by referring to FIG. 33. The same component sign is attached to a similar part as that of the above described embodiments, with a description thereof being omitted.

Figure 33:
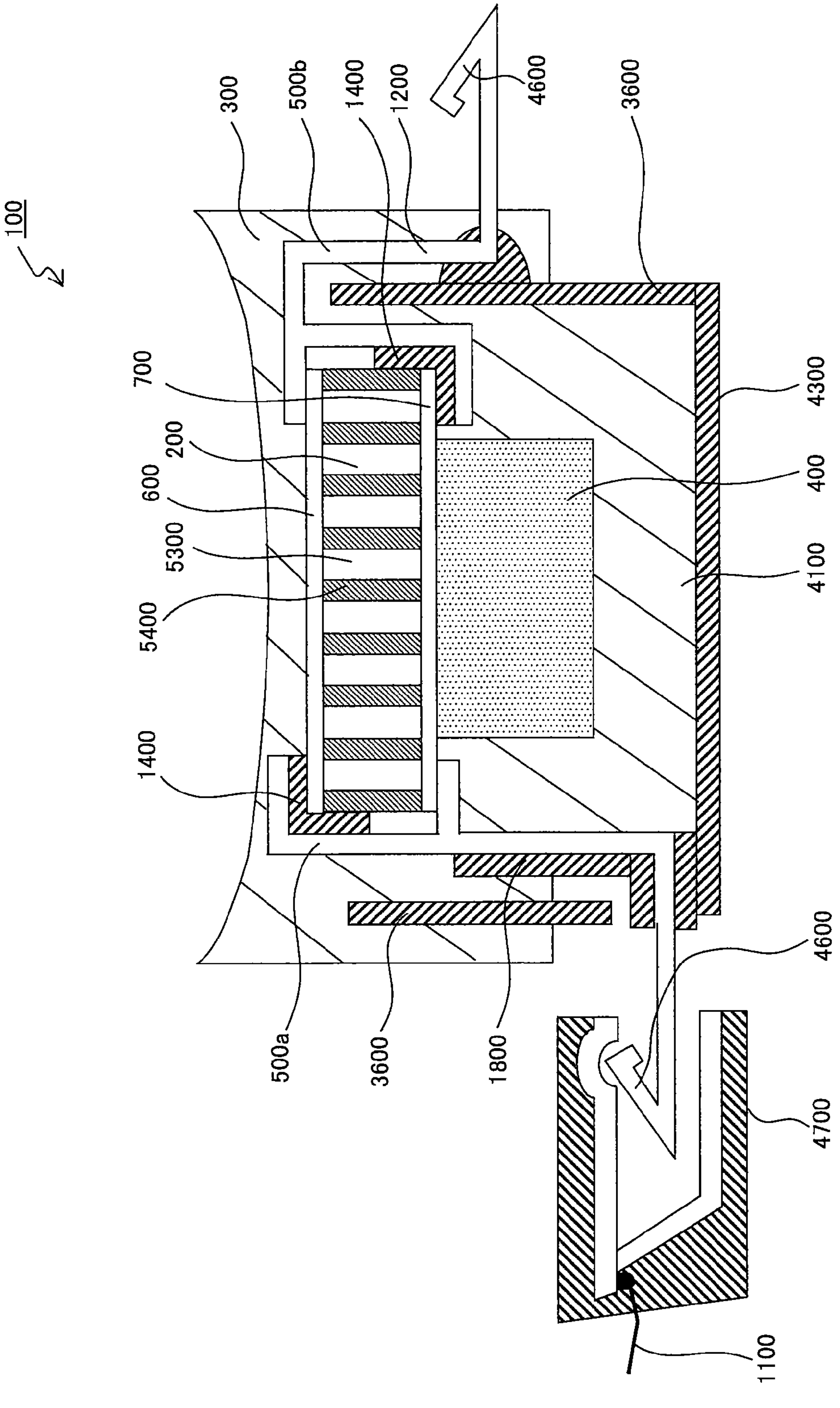
FIG. 33 is a diagram (part 1) showing an ultrasonic wave oscillator according to an embodiment 1 of a twenty-fifth embodiment.

FIG. 33 shows a cross-section of an ultrasonic wave oscillator according to the present embodiment. The same component sign is attached to a similar part as that of the above described embodiments, with a description thereof being omitted.

The present embodiment is configured to place lead parts 1200 of connection members 500 on the outside of a housing 3600, respectively, and an end of a lead part 1200 is formed as a gaff shape 4600 as a result of bending the end of the lead part. An electrical connection of the lead part 1200 of the ultrasonic wave oscillator 100 to the lead wire 1100 is secured by a connector 4700 mounted onto the end of the lead wire 1100 in a form corresponding to the gaff shape 4600.

Such a configuration makes it possible to extend the lead parts 1200 of the connection members 500 to the outside of the housing, and process it to form a gaff shape for enabling a connection by connectors (noted as "connector connection" hereinafter). By so doing, it is possible to perform an electrical connection without using a soldering, et cetera, by mounting a connector receptacle form corresponding to the gaff shape onto the end part (i.e., an end part on the side corresponding to the housing 3600) of the lead wire 1100.

The configuration as described above, that is, forming the lead part form of the connection member as a gaff shape enables a connector connection and accordingly a simple electrical connection. Also enabled is that the ultrasonic wave oscillator is detachably attachable to the lead wire, making a replacement, et cetera, of the ultrasonic wave oscillator easy and improving a workability and reliability.

Note that the present embodiment has described the example of forming the lead part of the connection part as a gaff shape for enabling a connector connection; any form, however, enabling a connector connection can apparently obtain the effect of the present embodiment, in lieu of being limited by a form.

$26^{th}$ Embodiment

The present embodiment describes an ultrasonic wave oscillator layered by a plurality of electromechanical transducer elements. The present embodiment is described by referring to FIGS. 34 through 37. Note that the same component sign is attached to a similar part as that of the above described embodiments, with a description thereof being omitted.

Figure 34:
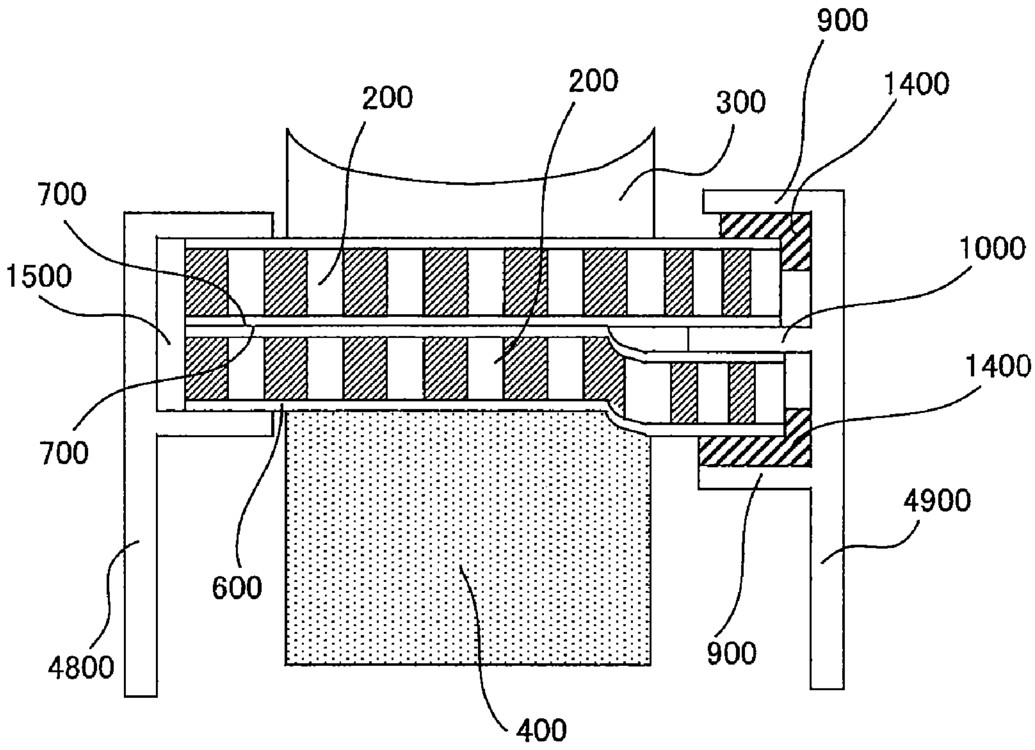
FIG. 34 is a diagram (part 1) showing an ultrasonic wave oscillator according to an embodiment 1 of a twenty-sixth embodiment.
Figure 35:
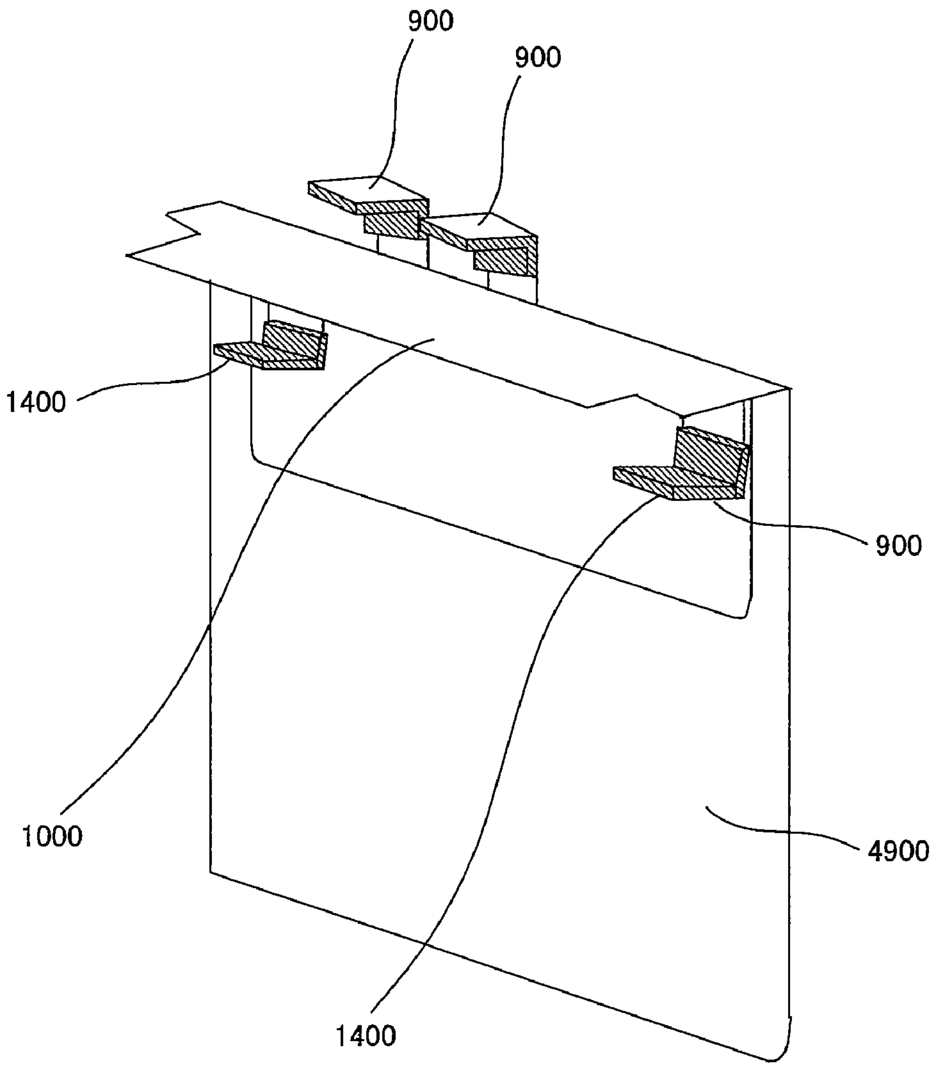
FIG. 35 is a diagram (part 2) showing an ultrasonic wave oscillator according to an embodiment 1 of the twenty-sixth embodiment.

FIGS. 34 and 35 show an ultrasonic wave oscillator according to an embodiment 1 of the present embodiment. Referring to FIG. 34, the comprisal is to layer two electromechanical transducer elements 200 which are constituted by composite piezoelectric elements. The electromechanical transducer elements 200 are sandwiched from both surfaces (i.e., the top and bottom surfaces) the layered electromechanical transducer elements 200 by the featured part (i.e., a squared "C" (or a square with the one side being opened)) of a connection member 4800 on one side.

A connection member 4900 on the other side is featured with an electrical connection part 1000 between the layered electromechanical transducer elements 200 which are sandwiched by pressure application parts 900 from both sides of the two electromechanical transducer elements 200 by way of insulation members 1400, respectively.

An acoustic matching member 300 is placed on the side of ultrasonic wave emission of the electromechanical transducer element 200, and on the opposite side thereof is placed a backing material 400.

Referring to FIG. 35, the electrical connection part 1000 is extended for enabling an electrical connection of one surface of the respective electromechanical transducer elements 200 by the connection member 4900. That is, the lower surface of the upper positioned electromechanical transducer element 200 contacts with one electrical connection part 1000 and the upper surface of the lower positioned electromechanical transducer element 200 contacts with the other electrical connection part 1000.

Figure 36:
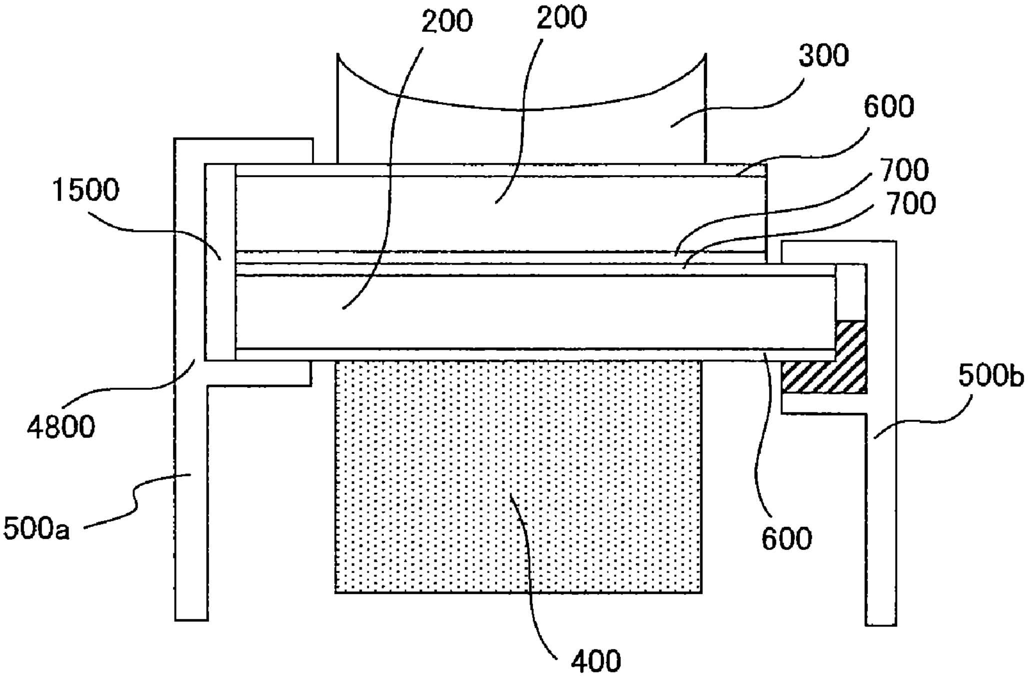
FIG. 36 is a diagram showing an ultrasonic wave oscillator according to an embodiment 2 of the twenty-sixth embodiment.

FIG. 36 shows an ultrasonic wave oscillator according to an embodiment 2 of the present embodiment. It layers two electromechanical transducer elements 200 in the same manner as the embodiment 1. In this case, an electrode where the two surfaces meet is configured as a positive pole electrode 700, while both surfaces (i.e., the top and bottom surfaces) of the layered electromechanical transducer elements 200 are configured as GND electrodes 600.

Referring to FIG. 36, the sizes (i.e., the horizontal widths as shown in FIG. 36) of the layered electromechanical transducer elements 200 are different, and the positive pole electrode 700 at the end of the larger electromechanical transducer element 200, of the two, is fixed in a manner to have the connection member 500*b* sandwich the electromechanical transducer element 200. Also, a connection member 500*a* is fixed in a manner to sandwich the two electromechanical transducer elements. This configuration makes the positive pole electrode 700 of the two electromechanical transducer elements securely contact. Therefore, the positive pole electrodes 700 of the two electromechanical transducer elements 200 are enabled to electrically contact with each other without fail.

Figure 37:
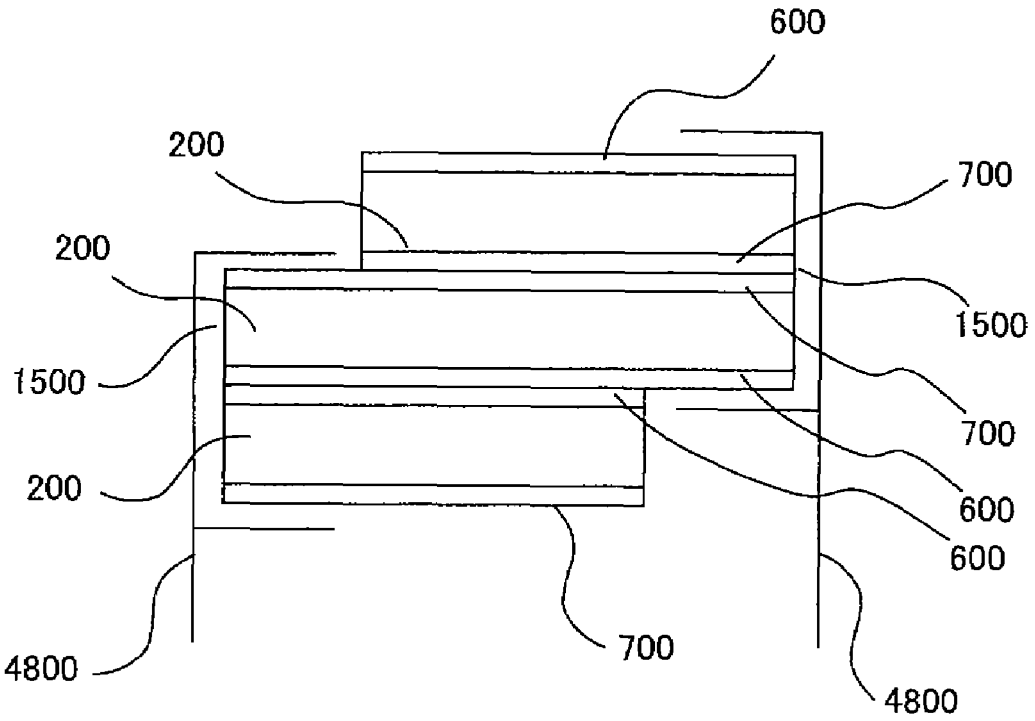
FIG. 37 is a diagram showing an ultrasonic wave oscillator according to an embodiment 3 of the twenty-sixth embodiment.
Figure 38:
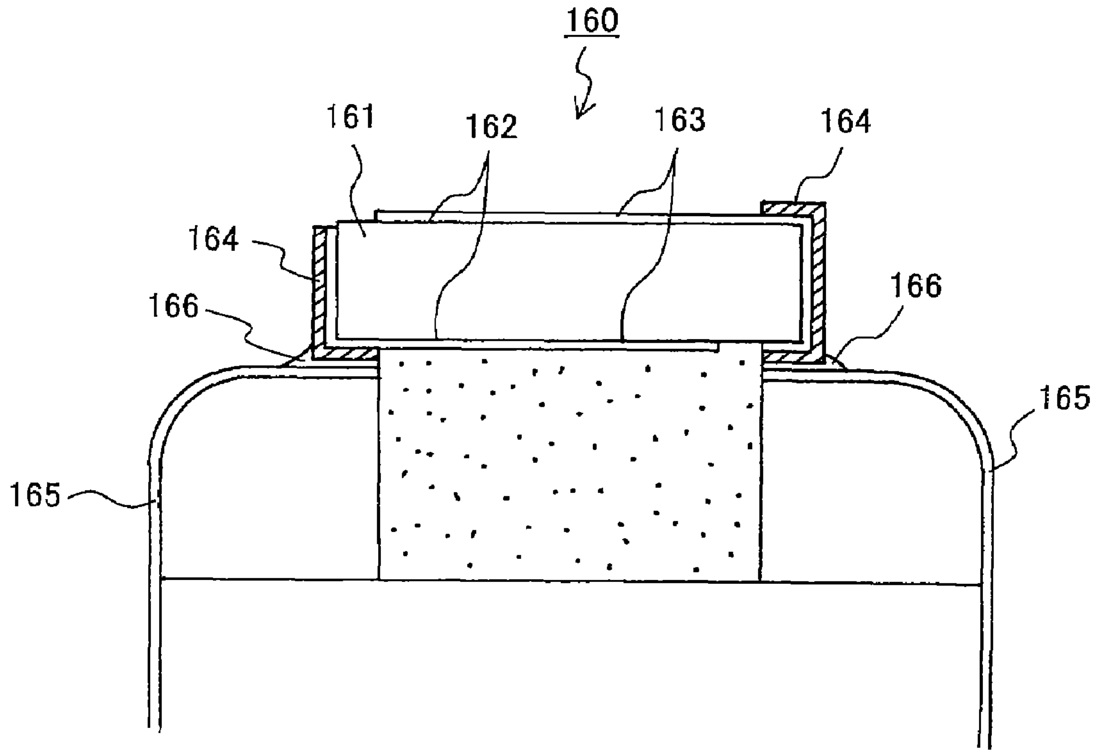
FIG. 38 is a diagram showing a conventional ultrasonic wave oscillator.
Figure 39:
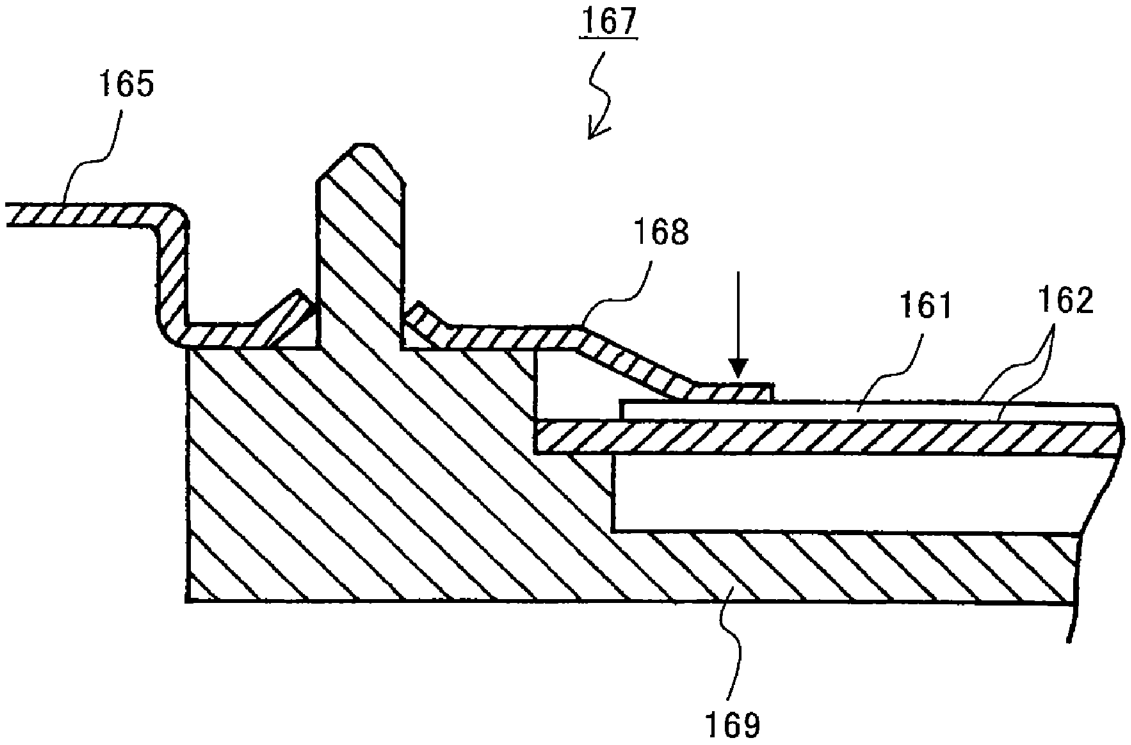
FIG. 39 is a diagram showing a conventional ultrasonic wave oscillator.

FIG. 37 is a diagram showing an ultrasonic wave oscillator according to an embodiment 3 of the present embodiment. FIG. 37 is a modified example of FIG. 36, exemplifying the case of layering three electromechanical transducer elements. One kind of connection member 4800 (i.e., a connection member not having an electrical connection part 1000 as does the connection member 4900) is enabled to secure an electrical connection by layering individual electromechanical transducer elements with parts corresponding to the connection member being displaced.

Such a configuration enables a manufacture of an ultrasonic wave oscillator in the process of fixing the electromechanical transducer elements electrically and mechanically by the connection members, dipping it into a resin for defoaming to remove an air layer existing in between the electromechanical transducer elements, and uniting a backing material and acoustic matching member with the layered electromechanical transducer elements under a pressure.

By so doing, an acoustic output power can be increased by layering the electromechanical transducer elements in a plurality of layers.

The configuration as described above enables a layered connection of a plurality of electromechanical transducer elements and the manufacture of a compact and large output power ultrasonic wave oscillator more simply. The use of the connection members enables a simple manufacturing of a layered oscillator.

The present invention is contrived to electrically connect a connection member to an electromechanical transducer element by the connection member pressure-contacts therewith from the opposite two directions, thereby enabling a simplification of a structure of an ultrasonic wave oscillator and an improvement of reliability relating to an electrical connection of the connection member to the electromechanical transducer element.

Also contrived is to eliminate a necessity of connecting a lead part to the electromechanical transducer element by a soldering, et cetera, in the case of constituting the connection member by integrally forming the lead part with a pressure application part and an electrical connection part, thus making it possible to suppress a thermal damage given to the electromechanical transducer element.

Also contrived is to eliminate a use of a soldering, et cetera, for electrically connecting the connection member to the electromechanical transducer element, and therefore the ultrasonic wave oscillator can be made compact and the production cost can be reduced as that much.

Also contrived is to place an insulation member in advance in a part of the connection member other than one used for an electrical connection, thereby enabling a prevention of a shorting by an electrical contact with a member existing nearby which is unnecessary for an electrical continuity, and a manufacture of an ultrasonic wave oscillator at low cost and high reliability.

Meanwhile, an ultrasonic wave oscillator according to the above described embodiments and/or an ultrasonic wave oscillator produced by a production method therefor according to the above described embodiment may be equipped in an ultrasonic wave endoscope apparatus.

What is claimed is:

1. An ultrasonic wave oscillator comprising an electromechanical transducer element, an acoustic matching member, a backing material and connection members electrically connected to the electromechanical transducer element, wherein the electromechanical transducer element is electrically connected to the connection members by the connection members contacting with the electromechanical transducer element with a pressure respectively from two opposite directions.

2. The ultrasonic wave oscillator according to claim 1, wherein said connection member comprises a pressure application part for contacting, with a pressure, with one surface of said electromechanical transducer element, an electrical connection part for contacting, with a pressure, with an electrode layer formed on the other surface of the electromechanical transducer element, and a lead part which is connected to a ground wire or a signal wire, wherein the pressure application part, electrical connection part and lead part are integrally formed.

3. The ultrasonic wave oscillator according to claim 1, wherein said connection member comprises a pressure application part for contacting, with a pressure, with an electrode layer formed on one surface of said electromechanical transducer element by way of an insulation member, and an electrical connection part for contacting, with a pressure, with an electrode layer formed on the other surface of the electromechanical transducer element.

4. The ultrasonic wave oscillator according to claim 1, wherein said electromechanical transducer element comprises a cutout part formed by a part of an electrode layer, which is formed on one surface of the electromechanical transducer element, being cutout, and said connection member comprises a pressure application part for contacting, with a pressure, with the cutout part formed on one surface of the electromechanical transducer element, and an electrical connection part for contacting, with a pressure, with an electrode layer formed on the other surface of the electromechanical transducer element, wherein the pressure application part is formed based on a form of the cutout part.

5. The ultrasonic wave oscillator according to claim 1, wherein said connection member is made by a blanking process of a metallic thin plate in an approximate rectangle, with a width of the connection member in a direction perpendicular to the longitudinal direction thereof being equal to or greater than five times of a thickness of the metallic thin plate.

6. The ultrasonic wave oscillator according to claim 1, wherein a plurality of said connection members which is electrically connected to respective electrodes of said electromechanical transducer elements is produced by a blanking process of a metallic thin plate in the same form of an approximate rectangle; an electrical connection part, which contacts, with a pressure, with an electrode layer formed on one surface of the electromechanical transducer element, is formed at an end of the processed approximately rectangular metallic thin plate; a pressure application unit, which contacts, with a pressure, with the other surface of the electromechanical transducer element, is formed with a protrusion in a direction opposite to the electrical connection part on the inside of a hole featured close to the electrical connection part; and each of the electrodes is electrically connected to the electrical connection part by changing a bending direction of the pressure application part.

7. The ultrasonic wave oscillator according to claim 1, wherein a surface of said connection member contacting, with a pressure, with said electromechanical transducer element is featured with an asperity part or protrusion part.

8. The ultrasonic wave oscillator according to claim 1, wherein said connection member comprises a pressure application part for contacting, with a pressure, with one surface of said electromechanical transducer element, and an electrical connection part for contacting, with a pressure, with an electrode layer featured on the other surface of the electromechanical transducer element, wherein an area size of the electrical connection part is larger than that of the pressure application part.

9. The ultrasonic wave oscillator according to claim 1, wherein said connection member comprises a pressure application part for contacting, with a pressure, with one surface of said electromechanical transducer element, and an electrical connection part for contacting, with a pressure, with an electrode layer featured on the other surface of the electromechanical transducer element, wherein one or both of the pressure application part and electrical connection part are respectively equipped with one or more through grooves.

10. The ultrasonic wave oscillator according to claim 1, wherein said connection member comprises a pressure application part for contacting, with a pressure, with one surface of said electromechanical transducer element, and an electrical connection part for contacting, with a pressure, with an electrode layer featured on the other surface of the electromechanical transducer element, wherein the pressure application part or electrical connection part is equipped with a hole with the inside of the hole being applied with a soldering or conductive adhesive, and the electromechanical transducer element is connected to the connection member.

11. The ultrasonic wave oscillator according to claim 1, wherein a gap between said electromechanical transducer element and connection member is covered with a protection member.

12. The ultrasonic wave oscillator according to claim 1, comprising a metallic housing, being electrically connected to a ground wire, for fixing at least said electromechanical transducer element on the inside of the housing, wherein said connection member is electrically connected to the housing.

13. The ultrasonic wave oscillator according to claim 1, wherein said electromechanical transducer element is a composite piezoelectric element constituted by an electrode layer being placed on both surface of a plate member which is formed by each of a plurality of columnar ceramic piezoelectric bodies being enshrouded by a resin, wherein a total thickness of the resin and electrode layer is larger than a total thickness of the columnar ceramic piezoelectric body and electrode layer, and the electromechanical transducer element is connected to said connection member by the resin which is deformed with a pressure by the connection member.

14. The ultrasonic wave oscillator according to claim 1, wherein said connection member is formed by a shape memory alloy.

15. The ultrasonic wave oscillator according to claims 1, wherein said electromechanical transducer element is connected to said connection members by elastically deforming them.

16. An ultrasonic wave oscillator, comprising:

an electromechanical transducer element for emitting an ultrasonic wave by transducing an electric signal to a mechanical motion;

an acoustic matching member being equipped on an ultrasonic wave emission side of the electromechanical transducer element;

a backing material being equipped on a surface opposite to an ultrasonic wave emission side of the electromechanical transducer element;

connection members being electrically connected to the electromechanical transducer element by elastically deforming them; and an insulation member being equipped on a surface of the connection member other than a part thereof, to which the electromechanical transducer element is electrically connected, of the surface of the connection member.

17. The ultrasonic wave oscillator according to claim 16, wherein said insulation member is equipped between a side surface of said electromechanical transducer element and connection member.

18. The ultrasonic wave oscillator according to claim 16, wherein a predetermined space is provided between a side surface of said electromechanical transducer element and connection member.

19. The ultrasonic wave oscillator according to claim 16, wherein said connection member is a flexible substrate.

20. The ultrasonic wave oscillator according to claim 16, wherein said connection member is coated with, or applied by a vapor deposition of, an organic material.

21. An ultrasonic wave oscillator, comprising:

an electromechanical transducer element for emitting an ultrasonic wave by transducing an electric signal to a mechanical motion;

an acoustic matching member being equipped on an ultrasonic wave emission side of the electromechanical transducer element;

a backing material being equipped on a surface opposite to an ultrasonic wave emission side of the electromechanical transducer element;

connection members being electrically connected to the electromechanical transducer element by elastically deforming them; and an insulation member for covering the connection member after being electrically connected to the electromechanical transducer element.

22. An ultrasonic wave oscillator, comprising:

an electromechanical transducer element for emitting an ultrasonic wave by transducing an electric signal to a mechanical motion;

an acoustic matching member being equipped on an ultrasonic wave emission side of the electromechanical transducer element;

a backing material being equipped on a surface opposite to an ultrasonic wave emission side of the electromechanical transducer element;

two connection members being electrically connected to the electromechanical transducer element by elastically deforming them;

a housing member being formed so as to expose at least the ultrasonic wave emission side of the acoustic matching member; and a conductive member being electrically connected to an edge part of the connection member on one side which extends to the outside of the housing member.

23. An ultrasonic wave oscillator, comprising:

an electromechanical transducer element for emitting an ultrasonic wave by transducing an electric signal to a mechanical motion;

an acoustic matching member being equipped on an ultrasonic wave emission side of the electromechanical transducer element;

a backing material being equipped on a surface opposite to an ultrasonic wave emission side of the electromechanical transducer element;

two connection members being electrically connected to the electromechanical transducer element by elastically deforming them;

a housing member being formed so as to expose at least the ultrasonic wave emission side of the acoustic matching member; and a conductive connector equipped on an edge part of the connection member on one side, which extends to the outside of the housing member.

24. An ultrasonic wave oscillator, comprising:

an electromechanical transducer element for emitting an ultrasonic wave by transducing an electric signal to a mechanical motion;

an acoustic matching member being equipped on an ultrasonic wave emission side of the electromechanical transducer element;

a backing material being equipped on a surface opposite to an ultrasonic wave emission side of the electromechanical transducer element;

connection members being electrically connected to the electromechanical transducer element by elastically deforming them, wherein a plurality of the electromechanical transducer elements is layered, with the layered electromechanical transducer elements being electrically connected to the connection member.

25. An ultrasonic wave endoscope apparatus equipped with an ultrasonic wave oscillator according to claims 1.

26. An ultrasonic wave endoscope apparatus equipped with an ultrasonic wave oscillator according to claims 16.

27. An ultrasonic wave endoscope apparatus equipped with an ultrasonic wave oscillator according to claims 21.

28. An ultrasonic wave endoscope apparatus equipped with an ultrasonic wave oscillator according to claims 22.

29. An ultrasonic wave endoscope apparatus equipped with an ultrasonic wave oscillator according to claims 23.

30. An ultrasonic wave endoscope apparatus equipped with an ultrasonic wave oscillator according to claims 24.

31. An ultrasonic wave endoscope apparatus equipped with an ultrasonic wave oscillator which is produced by a production method therefor according to claim 1.

* * * * *